United States Patent
Nitta et al.

(10) Patent No.: US 12,428,602 B2
(45) Date of Patent: Sep. 30, 2025

(54) PHOSPHOR, LIGHT EMITTING DEVICE, LIGHT SOURCE FOR SENSING SYSTEM, AND ILLUMINATION SYSTEM FOR SENSING SYSTEM

(71) Applicant: Panasonic Intellectual Property Management Co., Ltd., Osaka (JP)

(72) Inventors: Mitsuru Nitta, Kyoto (JP); Ryosuke Shigitani, Osaka (JP); Shozo Oshio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 18/571,218

(22) PCT Filed: Jun. 1, 2022

(86) PCT No.: PCT/JP2022/022369
§ 371 (c)(1),
(2) Date: Dec. 16, 2023

(87) PCT Pub. No.: WO2023/276540
PCT Pub. Date: Jan. 5, 2023

(65) Prior Publication Data
US 2024/0279546 A1    Aug. 22, 2024

(30) Foreign Application Priority Data
Jun. 28, 2021   (JP) ................. 2021-106680

(51) Int. Cl.
*F21V 9/30*  (2018.01)
*C01B 33/24*  (2006.01)
(Continued)

(52) U.S. Cl.
CPC .......... *C09K 11/7708* (2013.01); *C01B 33/24* (2013.01); *C09K 11/7776* (2013.01);
(Continued)

(58) Field of Classification Search
CPC ..... H01L 33/502; H01L 33/50; H01L 33/504; F21V 9/32; F21V 9/30; F21V 9/38; F21Y 2115/10
See application file for complete search history.

(56) References Cited

U.S. PATENT DOCUMENTS

2021/0194206 A1*   6/2021   Raring ................. H04B 10/40

FOREIGN PATENT DOCUMENTS

| CN | 108467733 A | 8/2018 |
| CN | 109666481 A | 4/2019 |
| WO | 2018/143198 A1 | 8/2018 |

OTHER PUBLICATIONS

International Search Report for corresponding Application No. PCT/JP2022/022369, mailed Jul. 12, 2022.
(Continued)

*Primary Examiner* — William J Carter
(74) *Attorney, Agent, or Firm* — Renner, Otto, Boisselle & Sklar, LLP

(57) ABSTRACT

Provided is a phosphor represented by general formula (1) below, $$(Gd_{1-x-y}Ln_y M^{II}_x)_3 M^{III}_2 (Ga_{1-z} M^{IV}_z)_3 O_{12}:Cr^{3+} \qquad (1)$$

where, in the formula, Ln is one or more elements selected from La, Pr, Nd, Sm, Eu, Tb, Dy, Ho, Er, Yb, and Lu, $M^{II}$ is a divalent element, $M^{III}$ is a trivalent element, $M^{IV}$ is a tetravalent element, and x, y, and z satisfy $0<x<0.5$, $0\leq y<0.5$, and $0<z<0.5$.

10 Claims, 30 Drawing Sheets

(51) Int. Cl.
    *C09K 11/77*         (2006.01)
    *F21V 9/38*          (2018.01)
    *F21Y 113/00*       (2016.01)
    *F21Y 115/10*       (2016.01)

(52) U.S. Cl.
    CPC ............... *F21V 9/30* (2018.02); *F21V 9/38* (2018.02); *C01P 2002/52* (2013.01); *C01P 2002/72* (2013.01); *C01P 2006/60* (2013.01); *F21Y 2113/30* (2023.05); *F21Y 2115/10* (2016.08)

(56) References Cited

OTHER PUBLICATIONS

Written Opinion for corresponding Application No. PCT/JP2022/022369, mailed Jul. 12, 2022.
Zakharko. Ya. et al.; Optical Absorption and Luminescence of Gd3Ga5O12:Cr. Mg Epitaxial Films. Acta Physica Polonica A. 2010. vol. 117. no. 1. pp. 111-113.
Monteil. A. et al.; Optical Spectroscopy of a Cr3+-doped (Ga. Mg. Zr)2Ga3O12 Garnet; Journal of Luminescence. 1988. vol. 39. pp. 167-173.
Brenier. A. et al.; Excited-state Dynamics and Energy Transfers in (Ca. Zr)-substituted Gd3Ga5O12 Single Crystals Doped with Cr3+ and Tm3+ ions. J. Phys.: Condens. Matter, 1991. vol. 3.pp.203-214.
Extended European Search Report for corresponding European Application No. 22832698.9 dated Sep. 19, 2024.

\* cited by examiner

EXAMPLE 23

EXAMPLE 24

PHOSPHOR, LIGHT EMITTING DEVICE, LIGHT SOURCE FOR SENSING SYSTEM, AND ILLUMINATION SYSTEM FOR SENSING SYSTEM

TECHNICAL FIELD

The present invention relates to a phosphor, a light emitting device, a sensing system light source, and a sensing system illumination system.

BACKGROUND ART

In recent years, the demand for noncontact vital sensing is increasing. Noncontact vital sensing is a system that uses a light emitting device to irradiate a subject with visible radiation, near-infrared radiation, or the like, photographs a photographing area of the subject using a camera to obtain image data, and processes this image data using a computer to obtain vital information, for example. Vital information includes information on $SpO_2$ (oxygen saturation measured using a pulse oximeter), blood pressure, pulse waves, and blood vessels deep in a living body, for example.

The system including a light emitting devices, a camera, and a computer, used for noncontact vital sensing, is generally also referred to as a sensing system. As a conventional light emitting device, a device outputting visible radiation, a device outputting visible radiation and near-infrared radiation, and the like are known. Also, as a camera, an RGB camera, a near-infrared camera, or the like is used.

Vital information obtained using noncontact vital sensing differs depending on the emission spectrum of the output light of the light emitting device. For example, in order to obtain blood pressure information, output light having a high intensity of optical components of a wavelength of 850 nm is preferable. In order to obtain pulse wave information, output light having a high intensity of optical components of a wavelength of 940 nm is preferable. Thus, in noncontact vital sensing, it is preferable to obtain output light having a high intensity of optical components in the near-infrared range.

Specifically, a light component used for the measurement of $SpO_2$ will be described. The oxygen saturation (%) measured as $SpO_2$ is calculated using the following formula (S1).

[Mathematical formula 1]

$$\text{Oxygen saturation (\%)} = (C(HbO_2))/(C(HbO_2) + C(Hb)) \times 100 \quad (S1)$$

(C ($HbO_2$): concentration of oxyhemoglobin, $HbO_2$; C (Hb): concentration of deoxyhemoglobin Hb)

The extinction coefficients of $HbO_2$ and Hb change with wavelengths, respectively. FIG. 14 is a diagram illustrating the relationship between wavelengths and extinction coefficients of oxyhemoglobin $HbO_2$ and deoxyhemoglobin Hb.

As illustrated in FIG. 14, the absorption spectrum of $HbO_2$ has a small extinction coefficient for red light at a wavelength of around 660 nm, while the absorption spectrum of Hb has a small extinction coefficient in a wavelength range for near-infrared light at a wavelength of around 850 nm. Thus, the ratio of $HbO_2$ and Hb can be calculated by measuring the transmitted light in these red light and near-infrared light and calculating the transmission ratio between red light and near-infrared light. Note that as the red light, it is considered also possible to use red light at a wavelength of about 750 nm, for example, instead of red light at a wavelength of about 660 nm.

Incidentally, the accuracy of vital information obtained using noncontact vital sensing differs depending on the combination of the light emitting device and the camera. Specifically, the accuracy of vital information differs depending on characteristics of the emission spectrum of the output light of the light emitting device and characteristics of the light receiving sensitivity of the camera.

For example, the combination of a light emitting device that outputs only visible radiation and an RGB camera may not obtain vital information in a dark place, such as at night, and may be susceptible to external disturbances such as body movement and illumination changes.

In contrast, a sensing system that combines a light emitting device outputting visible radiation and near-infrared radiation with an RGB camera and a near-infrared camera is known. When a near-infrared camera is used, the receiving wavelength range is wider than that of an RGB camera alone, and it is possible to receive light of wavelengths from the visible range to the near-infrared range. Note that the reason for combining an RGB camera and a near-infrared camera is that a CMOS image sensor used in an inexpensive RGB camera generally has a low light receiving sensitivity for near-infrared radiation.

FIG. 12 is a graph illustrating an example of a light receiving sensitivity curve LR of a CMOS image sensor included in a general RGB camera. As illustrated in FIG. 12, a general CMOS image sensor has a low light receiving sensitivity in a red to near-infrared range NIR of wavelengths from 750 to 950 nm.

With the sensing system using an RGB camera and a near-infrared camera, it becomes possible in a dark place to estimate a heart rate and to obtain vital information such as information on blood vessels deep in a living body. However, since this sensing system uses two types of cameras having different configurations, the accuracy of the obtained vital information may easily degrade due to changes in the lighting environment. Specifically, the accuracy of the obtained vital information easily degrades due to a gap in synchronization between the near-infrared radiation output from the near-infrared LED in the light emitting device and the two types of cameras.

Thus, a sensing system combining a light emitting device and one type of CMOS image sensor in demand. In addition, when an image including more wavelengths than RGB is acquired, it is easy to obtain a different amount of information for each wavelength, and the accuracy of the obtained vital information is expected to improve. In addition, the sensing system is preferably low-cost. Therefore, the use of a multispectral camera, a hyperspectral camera, and the like that include a general and inexpensive CMOS image sensor and acquire an image including more wavelengths than RGB is being considered.

In this sensing system, it is desired to use a light emitting device having a high emission intensity in the near-infrared range to cover the characteristic of a general CMOS image sensor of the light receiving sensitivity being low in the red to near-infrared range NIR of wavelengths of 750 to 950 nm.

As a sensing system light emitting device using a general CMOS image sensor, a light emitting device having the characteristic of an emission spectrum $EP_1$ illustrated in FIG. 13 is known. However, with the emission spectrum $EP_1$ of this light emitting device, the intensity in the red to near-infrared range NIR of wavelengths from 750 to 950 nm is low and decreases at the longer wavelength side. Thus, even when this light emitting device is used, the characteristic of the general CMOS image sensor of the light receiving sensitivity being low in the red to near-infrared range NIR as illustrated in FIG. 12 cannot be covered.

In addition, a light emitting device having a high light emission intensity in the near-infrared range is investigated. Specifically, Patent Literature 1 discloses a light emitting device that contains at least Tm or Cr as an active element and has a sharp emission spectrum where the emission peak wavelength is 700 to 1000 nm and the half width of the emission peak waveform is less than 60 nm.

CITATION LIST

Patent Literature

Patent Literature 1: International Publication No. 2018/143198

SUMMARY OF INVENTION

However, in the light emitting device disclosed in Patent Literature 1, the half width of the emission peak waveform is sharp as less than 60 nm, and thus the overall emission intensity in the near-infrared range cannot be made sufficiently high. Therefore, even when this light emitting device is used, it is not possible to cover the characteristic of the general CMOS image sensor in FIG. 12 of the light receiving sensitivity being low in the near-infrared range. Note that for example, when a phosphor having a fluorescence peak within a wavelength range of 750 nm or more and less than 900 nm is used, it is considered that the intensity of the red to near-infrared range NIR of wavelengths of 750 to 950 nm in the light emitting device can be sufficiently increased.

The present invention has been made in consideration of such issues as described above, which are inherent in related art. An object of the present invention is to provide a phosphor, a light emitting device, a sensing system light source, and a sensing system illumination system, each having a high fluorescence intensity in the red to near-infrared range NIR of wavelengths of 750 to 950 nm.

In response to the above issues, a phosphor according to an aspect of the present invention is represented by general formula (1) below.

[Chemical formula 1]

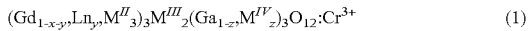

$(Gd_{1-x-y}Ln_y M^{II}_3)_3 M^{III}_2 (Ga_{1-z} M^{IV}_z)_3 O_{12}:Cr^{3+}$      (1)

(In the formula, Ln is one or more elements selected from La, Pr, Nd, Sm, Eu, Tb, Dy, Ho, Er, Yb, and Lu, $M^{II}$ is a divalent element, $M^{III}$ is a trivalent element, $M^{IV}$ is a tetravalent element, and x, y, and z satisfy $0<x<0.5$, $0\leq y<0.5$, and $0<z<0.5$.)

A light emitting device according to an aspect of the present invention includes the phosphor and a solid-state light source having an emission peak on a shorter wavelength side of a fluorescence peak of the phosphor.

A sensing system light source according to an aspect of the present invention includes the light emitting device.

A sensing system illumination system according to an aspect of the present invention includes the light emitting device.

DESCRIPTION OF EMBODIMENTS

Figure 1:
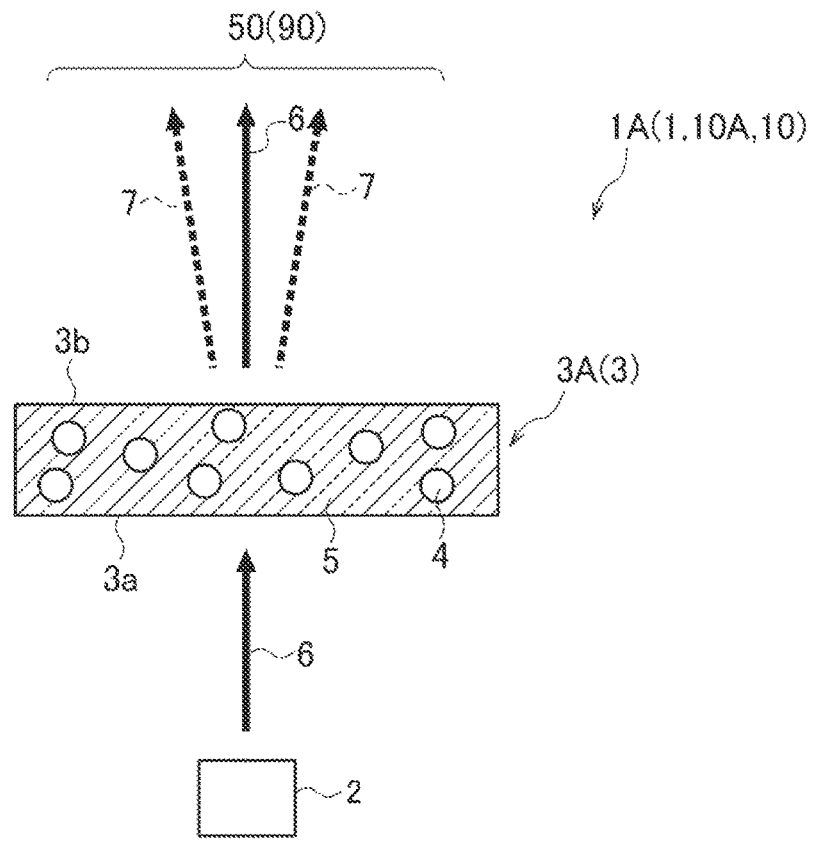
FIG. 1 is a schematic cross-sectional view illustrating an example of a light emitting device according to a first embodiment.

A phosphor and a light emitting device according to embodiments will be described below with reference to the drawings. A sensing system including a sensing system light source and a sensing system illumination system according to embodiments will also be described with reference to the drawings. Note that dimensional ratios in the drawings are exaggerated for convenience of the description and are sometimes different from actual ratios.

<Light Emitting Device>

Figure 2:
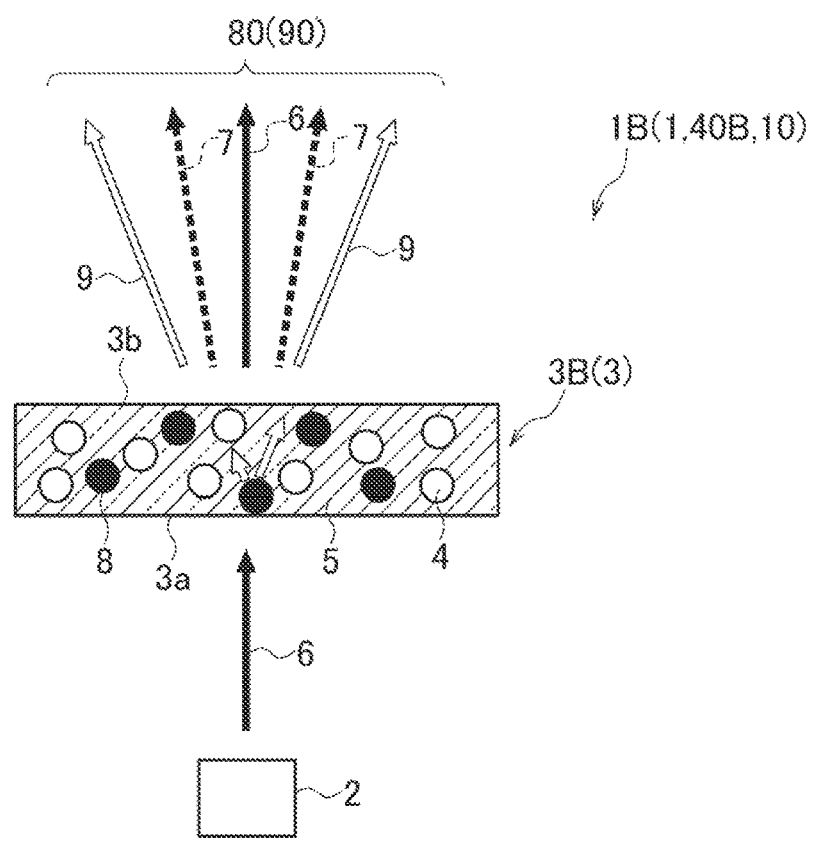
FIG. 2 is a schematic cross-sectional view illustrating an example of a light emitting device according to a second embodiment.
Figure 3:
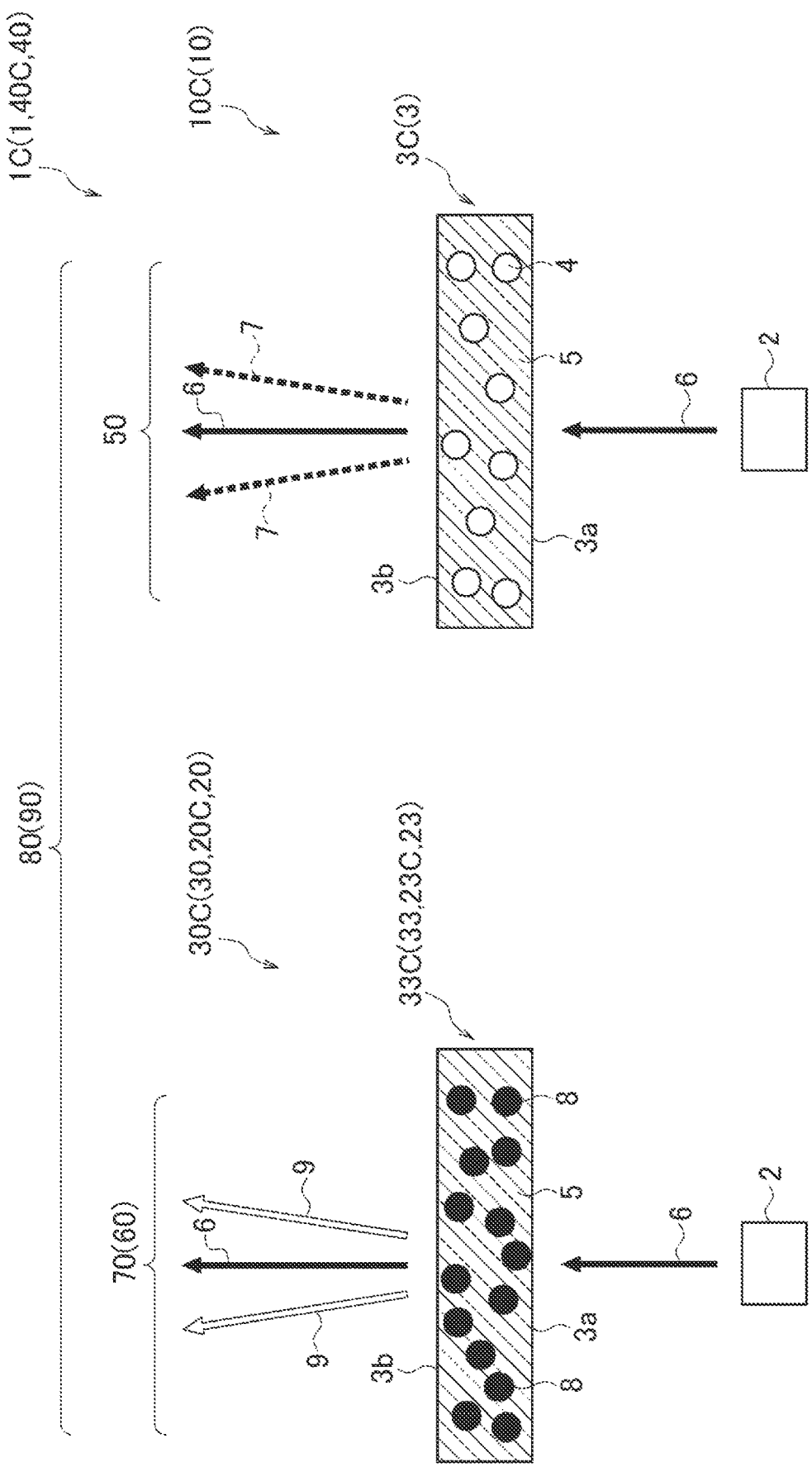
FIG. 3 is a schematic cross-sectional view illustrating an example of a light emitting device according to a third embodiment.
Figure 4:
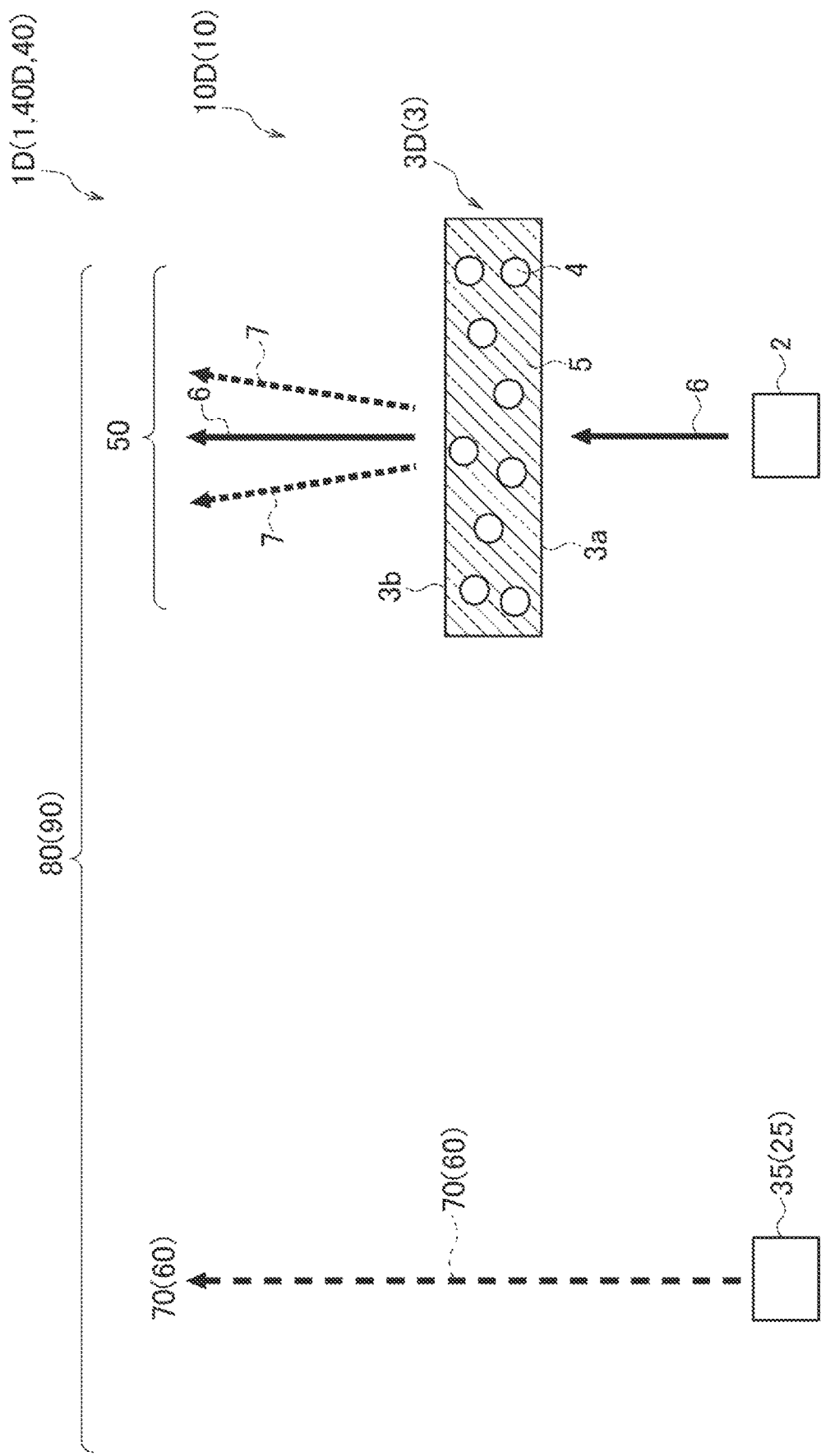
FIG. 4 is a schematic cross-sectional view illustrating an example of a light emitting device according to a fourth embodiment.
Figure 5:
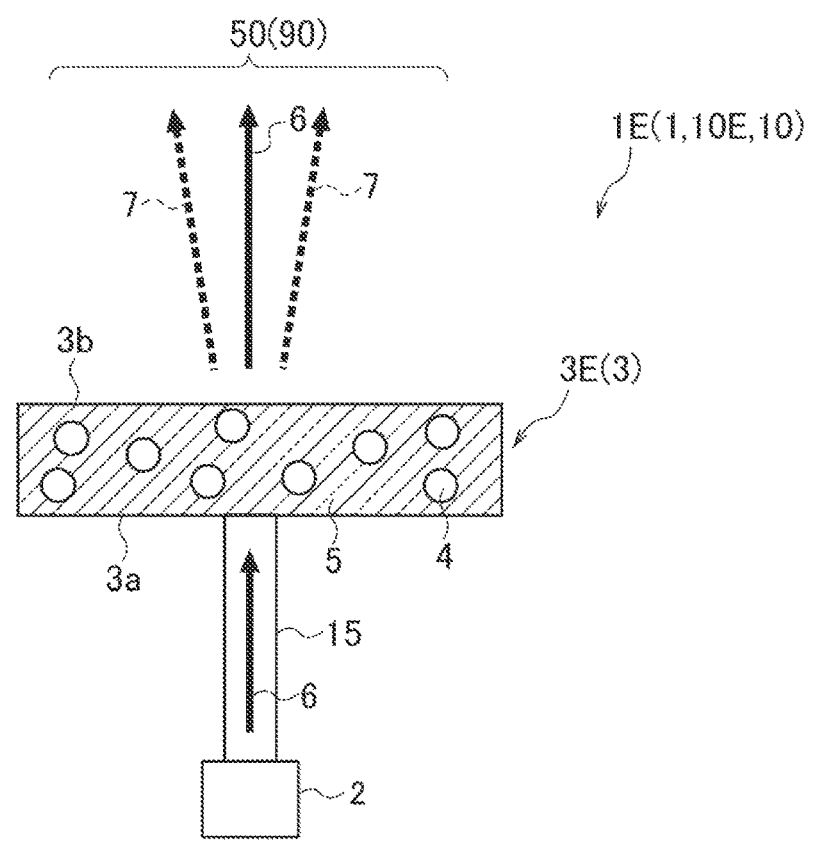
FIG. 5 is a schematic cross-sectional view illustrating an example of a light emitting device according to a fifth embodiment.
Figure 6:
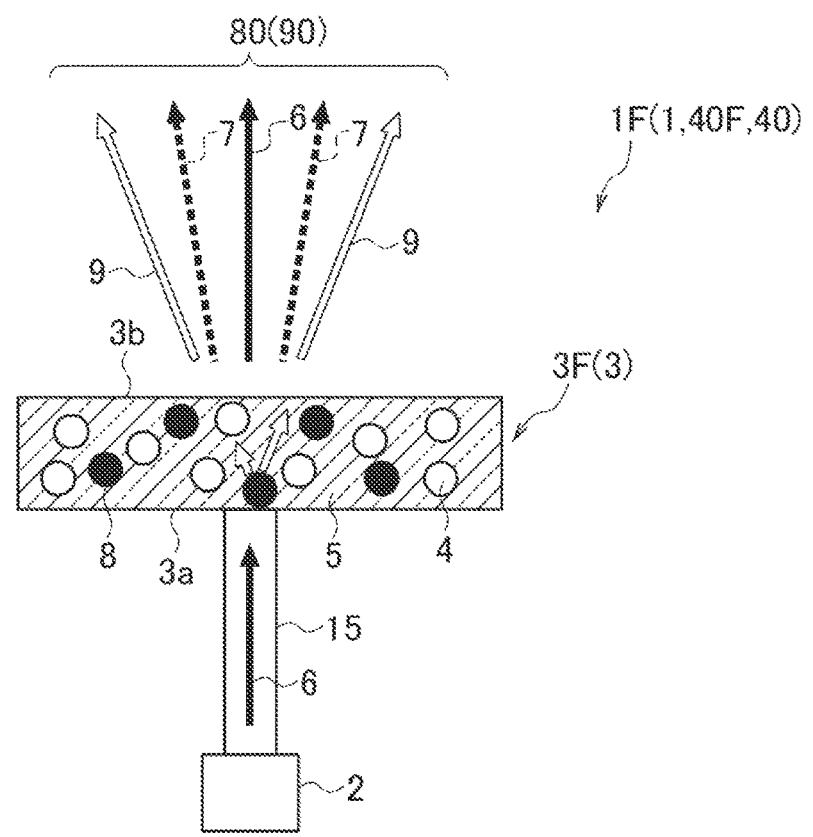
FIG. 6 is a schematic cross-sectional view illustrating an example of a light emitting device according to a sixth embodiment.
Figure 7:
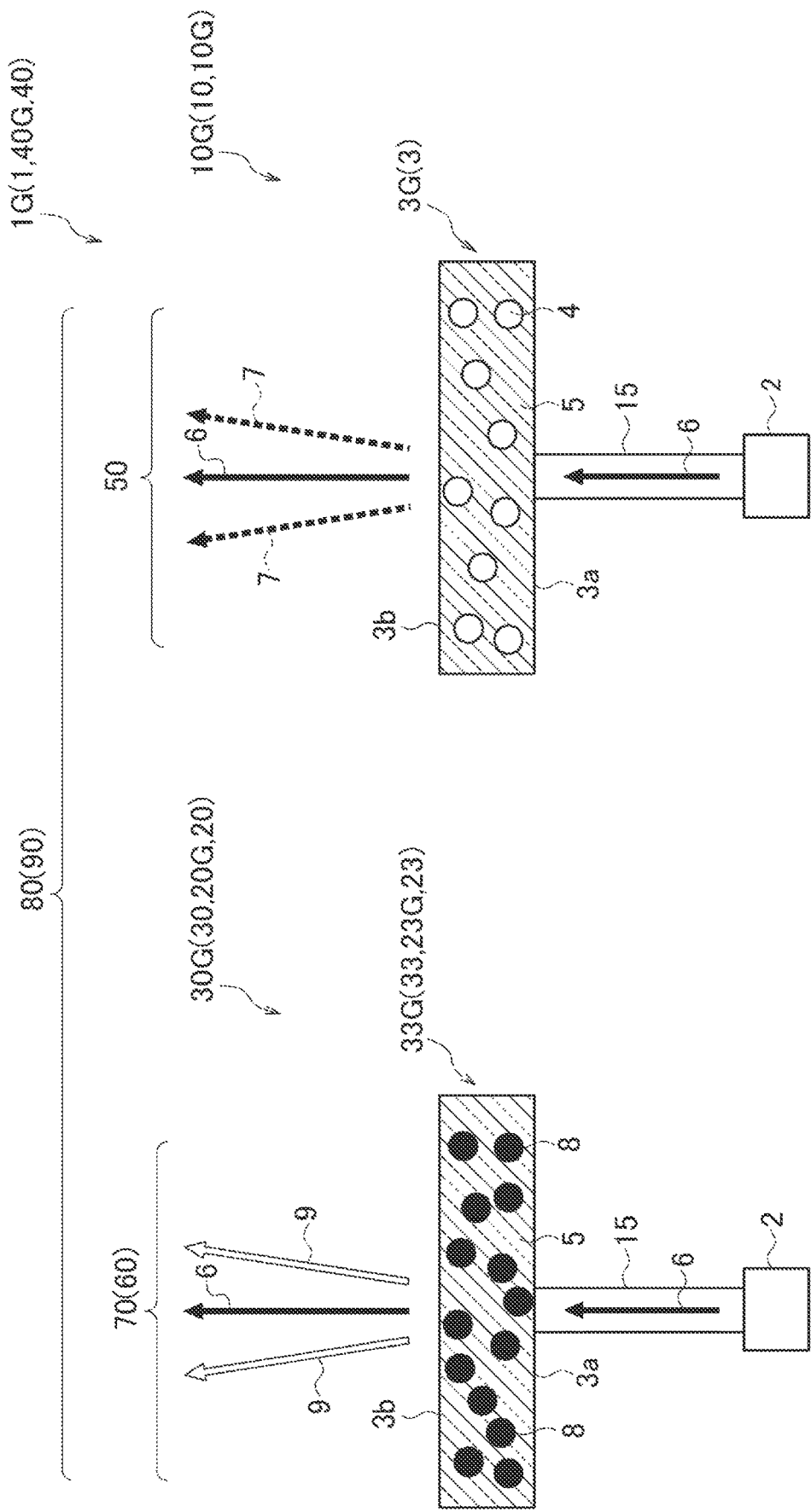
FIG. 7 is a schematic cross-sectional view illustrating an example of a light emitting device according to a seventh embodiment.

Light emitting devices 1 (1A to 1G) according to embodiments are illustrated in FIGS. 1 to 7. FIG. 1 is a schematic cross-sectional view illustrating an example of a light emitting device according to a first embodiment. FIG. 2 is a schematic cross-sectional view illustrating an example of a light emitting device according to a second embodiment. FIG. 3 is a schematic cross-sectional view illustrating an example of a light emitting device according to a third embodiment. FIG. 4 is a schematic cross-sectional view illustrating an example of a light emitting device according to a fourth embodiment. FIG. 5 is a schematic cross-sectional view illustrating an example of a light emitting device according to a fifth embodiment. FIG. 6 is a schematic cross-sectional view illustrating an example of a light emitting device according to a sixth embodiment. FIG. 7 is a schematic cross-sectional view illustrating an example of a light emitting device according to a seventh embodiment.

The light emitting devices 1E to 1G according to the fifth to seventh embodiments further include a light guiding member 15 that guides primary light 6 to a wavelength converter 3, but otherwise respectively have the same configurations as the light emitting devices 1A to 1C according to the first to third embodiments. Note that although not illustrated, as a modified example, a near-infrared light emitting device 10D of the light emitting device 1D according to the fourth embodiment can further include the light guiding member 15 that guides primary light 6 to the wavelength converter 3.

The light emitting devices 1A to 1G according to the first to seventh embodiments include: in common a solid-state light source 2 emitting primary light 6; and the wavelength converter 3 including a first phosphor 4 that absorbs the primary light 6 and emits first wavelength-converted light 7 including a near-infrared light component. Thus, the light emitting devices 1A to 1G according to the first to seventh embodiments can emit output light 90 that includes the first wavelength-converted light 7 including at least the near-infrared light component.

Specifically, in the light emitting devices 1A to 1G according to the first to seventh embodiments, when the primary light 6 emitted from the solid-state light source 2 enters the wavelength converter 3, a phosphor such as the first phosphor 4 included in the wavelength converter 3 emits fluorescence. The first phosphor 4 emits the first wavelength-converted light 7 including a near-infrared light component when receiving the primary light 6.

More specifically, wavelength converters 3A to 3G of the light emitting devices 1A to 1G according to the first to seventh embodiments can receive primary light 6 and emit output light 90 including at least the primary light 6 and first wavelength-converted light 7 including a near-infrared light component. The wavelength converters 3A to 3G included in the light emitting devices 1A to 1G emit near-infrared light-including light 50 or NIR+α light 80. Here, the near-infrared light-including light 50 is light including the primary light 6 and the first wavelength-converted light 7 including a near-infrared light component. The NIR+α light 80 is light including the primary light 6, the first wavelength-converted light 7 including a near-infrared light component, and second wavelength-converted light 9. In other words, the NIR+α light 80 is light including the near-infrared light-including light 50 and the second wavelength-converted light 9.

The light emitting devices 1A to 1G according to the first to seventh embodiments can emit output light 90 including near-infrared light-including light 50 or NIR+α light 80, and thus can emit output light 90 including at least the near-infrared light-including light 50.

Note that the light emitting devices 1C, 1D, and 1G according to the third, fourth, and seventh embodiments can independently control the light emission of the near-infrared light emitting devices 10C, 10D, or 10G, and the light emission of a white light emitting device 30C, a white light source 35, or a white light emitting device 30G. Thus, the light emitting devices 1C, 1D, and 1G can emit output light 90 including at least the near-infrared light-including light 50, and can also emit only white light 70 that is derived from the white light emitting device 30C or the like, as output light 90. In a modified example where a visible light emitting device 20C, a visible light source 25, and the like are used instead of the white light emitting device 30C, the white light source 35, and the like in the light emitting devices 1C, 1D, and 1G, it becomes possible to emit only visible light 60 that is derived from the visible light emitting device 20C or the like, as output light 90.

The light emitting device 1D according to the fourth embodiment is a light emitting device that combines the near-infrared light emitting device 10D (10) which is a light emitting device emitting near-infrared light, and the white light source 35 which emits white light.

First Embodiment

The light emitting device 1A (1) according to the first embodiment will be described. The light emitting device 1A according to the first embodiment includes the solid-state light source 2 and the wavelength converter 3A (3).

In the light emitting device 1A, the solid-state light source 2 and the wavelength converter 3A are arranged spaced apart, and this can cause a subject to be irradiated, with a high degree of freedom, with output light 90 including first wavelength-converted light 7 emitted from the wavelength converter 3A. Output light 90 includes near-infrared light-including light 50.

The light emitting device 1A emits near-infrared light-including light 50 that includes primary light 6 and first wavelength-converted light 7 including a near-infrared light component, as output light 90. Thus, in detail, the light emitting device 1A can be said to be a near-infrared light emitting device 10A (10) that emits near-infrared light-including light 50.

(Solid-State Light Source)

The solid-state light source 2 emits primary light 6. Light having a high emission intensity is used as the primary light 6. As the light having a high emission intensity, for example, laser light, light radiated from a high power LED, or the like is used. As the primary light 6, light including blue light having a spectral distribution maximum intensity within a wavelength range of 400 nm or more and less than 500 nm is used, for example. As the blue light, light having a spectral distribution maximum intensity within a wavelength range of 420 nm or more and less than 480 nm is preferably used.

As the solid-state light source 2, a solid-state light emitting element is used, for example. It is preferable that the solid-state light source 2 be a solid-state light emitting element because of its excellent durability and long life. As the solid-state light source 2, a solid-state light emitting element such as an LED or a laser element is used.

The solid-state light source 2 emits light in which an emission spectrum $E_{LS}$ has an emission peak $EP_{LS}$ on the shorter wavelength side of a fluorescence peak $FP_1$ of a fluorescence spectrum $F_1$ of first wavelength-converted light of the first phosphor 4 included in the wavelength converter 3A (3). Here, A having an emission peak $EP_A$ on the shorter wavelength side of a fluorescence peak $FP_B$ of a fluorescence spectrum FB of B means that the emission peak wavelength of the emission peak $EP_A$ of A exists on the shorter wavelength side of the fluorescence peak wavelength of the fluorescence peak $FP_B$ of B. In addition, the fluorescence peak $FP_1$ means a portion indicating the maximum value when the fluorescence spectrum $F_1$ of the first phosphor 4 is an aggregate of spectral intensities in increments of 10 nm or less.

(Wavelength Converter)

The wavelength converter 3A (3) includes the first phosphor 4 and a sealant 5. In the wavelength converter 3A, the first phosphor 4 is included in the sealant 5.

<First Phosphor>

The first phosphor 4 is represented by general formula (1) below.

[Chemical formula 2]

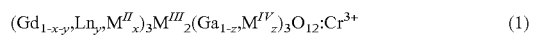

(In the formula, Ln is one or more elements selected from La, Pr, Nd, Sm, Eu, Tb, Dy, Ho, Er, Yb, and Lu, $M^{II}$ is a divalent element, $M^{III}$ is a trivalent element, $M^{IV}$ is a tetravalent element, and x, y, and z satisfy $0 < x < 0.5$, $0 \leq y < 0.5$, and $0 < z < 0.5$.)

In general formula (1), a part of the crystal structure of garnet represented by general formula (2) below is replaced with $Cr^3$.

[Chemical formula 3]

$$A'_3 B'_2 (C'O_4)_3 \quad (2)$$

In general formula (2), A', B', and C' are atoms constituting the host crystal of the garnet crystal structure. Specifically, A' is an "A-site", and the structure including the "A-site" is an A-site structure in which oxygen atoms O are dodecahedrally coordinated around an atom A'. B' is a "B-site", and the structure including the "B-site" is a B-site structure in which oxygen atoms O are octahedrally coordinated around an atom B'. C' is a "C-site", and the structure including the "C-site" is a C-site structure in which oxygen atoms O are tetrahedrally coordinated around an atom C'.

General formula (1) corresponds to general formula (2) in which Gd is included in the "A site", $M^{III}$ is included in the "B site", and Ga is included in the "C site" as essential components.

When Ln, $M^{II}$, $M^{III}$, and $M^{IV}$ are the above elements in general formula (1), the first wavelength-converted light 7 has a fluorescence peak within a wavelength range of 750 nm or more and less than 900 nm. Thus, it is preferable that Ln, $M^{II}$, $M^{III}$, and $M^{IV}$ be the above elements in general formula (1) because highly accurate sensing can be achieved by compensating for the low sensitivity in the near-infrared range of an image sensor with a CMOS using Si, or the like.

In general formula (1), $M^{II}$ is preferably a divalent element, and more preferably contains at least one of Ca or Sr. It is preferable that $M^{II}$ be one of these elements because the internal quantum efficiency IQE of the first wavelength-converted light 7 tends to be high.

In general formula (1), $M^{III}$ is preferably a trivalent element other than Gd and Ln, and more preferably contains at least one of Ga or Sc. It is preferable that $M^{III}$ be one of these elements because the internal quantum efficiency IQE of the first wavelength-converted light 7 tends to be high.

In general formula (1), $M^{IV}$ is preferably a tetravalent element, and more preferably contains at least one of Si or Ge. It is preferable that $M^{IV}$ be one of these elements because the internal quantum efficiency IQE of the first wavelength-converted light 7 tends to be high.

In general formula (1), it is preferable that $M^{II}$ be a divalent element, $M^{III}$ be a trivalent element other than Gd and Ln, and $M^{IV}$ be a tetravalent element. It is preferable that general formula (1) have a combination of these elements, the internal quantum efficiency IQE of the first wavelength-converted light 7 tends to be high.

In general formula (1), it is more preferable that $M^{II}$ contain at least one of Ca or Sr, $M^{III}$ contain at least one of Ga or Sc, and $M^{IV}$ contain at least one of Si or Ge. It is preferable that general formula (1) have a combination of these elements because the internal quantum efficiency IQE of the first wavelength-converted light 7 tends to be higher.

In general formula (1), it is even more preferable that $M^{II}$ contain at least one of Ca or Sr, and $M^{IV}$ contain Ge. It is preferable that general formula (1) have a combination of these elements because the internal quantum efficiency IQE of the first wavelength-converted light 7 tends to be even higher.

In general formula (1), it is even more preferable that $M^{II}$ contain Sr and $M^{IV}$ contain at least one of Si or Ge. It is preferable that general formula (1) have a combination of these elements because the internal quantum efficiency IQE of the first wavelength-converted light 7 tends to be even higher.

In general formula (1), it is particularly preferable that $M^{II}$ contain Sr and $M^{IV}$ contain Ge. It is preferable that general formula (1) have a combination of these elements because the internal quantum efficiency IQE of the first wavelength-converted light 7 tends to be particularly high.

It is preferable that x and z satisfy x−0.1≤z≤x+0.1 in general formula (1) because the charge balance of the first phosphor 4 represented by general formula (1) is maintained and the structure of the first phosphor 4 is stable.

In the first phosphor 4 represented by general formula (1), $Cr^{3+}$ is replaced, for example, with a part of $M^{III}$ (B site). In this case, general formula (1) can be represented by general formula (3) below.

[Chemical formula 4]

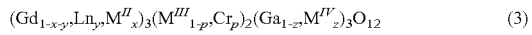

$$(Gd_{1-x-y},Ln_y,M^{II}_x)_3(M^{III}_{1-p},Cr_p)_2(Ga_{1-z},M^{IV}_z)_3O_{12} \qquad (3)$$

(In the formula, Ln is one or more elements selected from La, Pr, Nd, Sm, Eu, Tb, Dy, Ho, Er, Yb, and Lu, $M^{II}$ is a divalent element, $M^{III}$ is a trivalent element, $M^{IV}$ is a tetravalent element, and x, y, and z satisfy 0<x<0.5, 0≤y<0.5, and 0<z<0.5, and 0.001<p<0.1.)

In general formula (3), p preferably satisfies 0.005<p<0.08, and more preferably satisfies 0.01<p<0.05. It is preferable that p be within the above ranges because the external quantum efficiency EQE tends to be high.

The first wavelength-converted light 7 has the fluorescence peak $FP_1$ within a wavelength range of 750 nm or more and less than 900 nm. The first wavelength-converted light 7 has the fluorescence peak $FP_1$ preferably within a wavelength range of 770 nm or more and less than 900 nm, and more preferably within a wavelength range of 780 nm or more and less than 900 nm.

It is preferable that the fluorescence spectrum $F_1$ of the first wavelength-converted light 7 have the fluorescence peak $FP_1$ within the above wavelength ranges because only light in the red to near-infrared range is emitted which is suitable for acquiring vital information, such as information about blood pressure, pulse waves, and blood vessels deep in a living body.

It is not preferable that the fluorescence spectrum $F_1$ of the first wavelength-converted light 7 have the fluorescence peak $FP_1$ within a wavelength range of 900 nm or more because light energy is easily wasted by emitting light in a wavelength range where the light receiving sensitivity of a general CMOS image sensor is very low.

In the first wavelength-converted light 7, the full width at half maximum of the fluorescence peak $FP_1$ within a wavelength range of 750 nm or more and less than 900 nm is usually 110 nm or more and less than 250 nm. In the first wavelength-converted light 7, the full width at half maximum of the fluorescence peak $FP_1$ is preferably 120 nm or more and less than 220 nm.

It is preferable that the full width at half maximum of the fluorescence peak $FP_1$ be within the above ranges because the fluorescence peak $FP_1$ is broad and thus highly accurate sensing can be achieved by widely compensating for the low sensitivity in the near-infrared range of an image sensor with a CMOS using Si, or the like. In contrast, when the full width at half maximum of the fluorescence peak $FP_1$ exceeds 250 nm, the efficiency of light use may be reduced.

In the first wavelength-converted light 7, the 1/e afterglow value is generally 1 μs or more and less than 100 μs. In the first wavelength-converted light 7, the 1/e afterglow value is preferably 1 μs or more and less than 80 μs. Here, the 1/e afterglow value means a time until the emission intensity becomes 1/e. It is preferable that the 1/e afterglow value of the first wavelength-converted light 7 be within the above ranges because the output and stop of the near-infrared light can be controlled with good responsiveness to the output and stop operation of the primary light 6 emitted from the solid-state light source 2.

<Sealant>

In the wavelength converter 3, the first phosphor 4 is included in the sealant 5. Preferably, the first phosphor 4 is dispersed in the sealant 5. When the first phosphor 4 is dispersed in the sealant 5, it becomes possible to efficiently absorb the primary light 6 emitted by the solid-state light source 2 and efficiently convert the wavelength thereof to that of near-infrared light. When the first phosphor 4 is dispersed in the sealant 5, it becomes easier to form the wavelength converter 3 into a sheet or film shape.

The sealant 5 is made from at least one of an organic material or an inorganic material. The sealant 5 is preferably made from at least one of a transparent (translucent) organic material or a transparent (translucent) inorganic material. An example of the organic material sealant is a transparent organic material, such as silicone resin. An example of the inorganic material sealant is a transparent inorganic material, such as low melting point glass.

Note that the wavelength converter 3 is preferably made from an inorganic material. An inorganic material here means a material other than an organic material, and includes ceramics and metals as a concept. When the wavelength converter 3 is made from an inorganic material, the thermal conductivity thereof is higher than that of the wavelength converter including an organic material such as a sealing resin, and this facilitates the heat dissipation design. Thus, even when the first phosphor 4 is photoexcited at high density by the primary light 6 emitted from the solid-state light source 2, the temperature rise of the wavelength converter 3 can be effectively suppressed. Consequently, the temperature quenching of the first phosphor 4 in the wavelength converter 3 is suppressed, and it becomes possible to achieve high output of emitted light.

When the wavelength converter 3 is made from an inorganic material, the sealant 5 is preferably made from an inorganic material. The inorganic material for the sealant 5 is preferably zinc oxide (ZnO). When the sealant 5 is made from an inorganic material, the heat dissipation of the first phosphor 4 is further enhanced and thus a decrease in output of the first phosphor 4 due to temperature quenching is suppressed, and this makes it possible to emit high-output near-infrared light.

Note that as a modified example of the light emitting device 1A, a wavelength converter without the sealant 5 can be used instead of the wavelength converter 3. In this case, it is sufficient that particles of the first phosphor 4 be fixed to each other using an organic or inorganic binder. Particles of the first phosphor 4 can also be fixed to each other through a heating reaction of the first phosphor 4. A generally used resin-based adhesive, ceramic fine particles, low-melting-point glass, or the like can be used as the binder. With a wavelength converter without the sealant 5, the thickness of the wavelength converter can be reduced.

(Action)

The action of the light emitting device 1A will be described. As illustrated in FIG. 1, first, the primary light 6 emitted from the solid-state light source 2 is emitted on a front surface 3a of the wavelength converter 3A. The emitted primary light 6 penetrates the wavelength converter 3A. When the primary light 6 penetrates the wavelength converter 3A, the first phosphor 4 included in the wavelength converter 3A absorbs part of the primary light 6 and emits the first wavelength-converted light 7. In this way, the output light 90 including the primary light 6 and the first wavelength-converted light 7 is emitted from a back surface 3b of the wavelength converter 3A.

The first wavelength-converted light 7 includes a near-infrared light component having a fluorescence peak within a wavelength range of 750 nm or more and less than 900 nm. Thus, the output light 90 output from the light emitting device 1A is near-infrared light-including light 50 which is light including primary light 6 and first wavelength-converted light 7 including a near-infrared light component.
(Effect)

The first phosphor 4 included in the wavelength converter 3A of the light emitting device 1A emits first wavelength-converted light 7 including a large amount of a near-infrared light component. Thus, the wavelength converter 3A of the light emitting device 1A emits near-infrared light-including light 50 including a near-infrared light component, as output light 90.

Therefore, by irradiating a subject 110 with the output light 90 of the light emitting device 1A, even when a camera 150 using a CMOS image sensor having a low light receiving sensitivity in the red to near-infrared range is used, high-quality image data 170 with the near-infrared range compensated can be obtained. Thus, the light emitting device 1A can provide a phosphor and a light emitting device that have a high fluorescence intensity in the red to near-infrared range NIR of wavelengths of 750 to 950 nm.

In addition, the light emitting device 1A can be used for a sensing system light source 100A and a sensing system illumination system 300A described below.

Thus, the light emitting device 1A can provide a sensing system light source and a sensing system illumination system that have a high fluorescence intensity in the red to near-infrared range NIR of wavelengths of 750 to 950 nm.

Second Embodiment

The light emitting device 1B (1) according to a second embodiment will be described. The light emitting device 1B according to the second embodiment includes the solid-state light source 2 and the wavelength converter 3B (3). The light emitting device 1B according to the second embodiment uses the wavelength converter 3B instead of the wavelength converter 3A of the light emitting device 1A according to the first embodiment. In contrast to the wavelength converter 3A, the wavelength converter 3B further includes a second phosphor 8.

As output light 90, the light emitting device 1B emits NIR+α light 80 that includes near-infrared light-including light 50 including primary light 6 and first wavelength-converted light 7, and second wavelength-converted light 9 which is a light component other than the near-infrared light-including light 50. Thus, in detail, the light emitting device 1B can be said to be an NIR+α light emitting device 40B (40) that emits NIR+α light 80.
(Wavelength Converter)

The wavelength converter 3B includes the first phosphor 4, the second phosphor 8, and the sealant 5. In the wavelength converter 3B, the first phosphor 4 and the second phosphor 8 are included in the sealant 5. That is, the wavelength converter 3B of the light emitting device 1B further includes the second phosphor 8 that absorbs primary light 6 and converts it into second wavelength-converted light 9 different from the first wavelength-converted light 7.

That is, the wavelength converter 3B includes the first phosphor 4 and the second phosphor 8 having an emission peak wavelength different from the emission peak wavelength of the first phosphor 4.

The wavelength converter 3B is the same as the wavelength converter 3A of the light emitting device 1 according to the first embodiment except that it further includes the second phosphor 8. Thus, the second phosphor 8 is mainly described below, and the description of other configurations and actions will be omitted or simplified.

The light emitting device 1B including the wavelength converter 3B includes the wavelength converter 3B and the solid-state light source 2 having an emission peak on the shorter wavelength side of the emission peak of the first phosphor 4 and the emission peak of the second phosphor 8. Thus, the light emitting device 1B includes the first phosphor 4, the second phosphor 8, and the solid-state light source 2.
<Second Phosphor>

The second phosphor 8 is a phosphor having a fluorescence peak wavelength different from the fluorescence peak wavelength of the first phosphor 4. Here, the fluorescence peak wavelength of the first phosphor 4 is the wavelength of the fluorescence peak $FP_1$ in the fluorescence spectrum $F_1$ of the first wavelength-converted light 7. The fluorescence peak wavelength of the second phosphor 8 is the wavelength of the fluorescence peak $FP_2$ in the fluorescence spectrum $E_2$ of the second wavelength-converted light 9. Thus, the second phosphor 8 is a phosphor having the peak wavelength of the fluorescence peak $FP_2$ of the second wavelength-converted light 9, which is different from the peak wavelength of the fluorescence peak $FP_1$ of the first wavelength-converted light 7 of the first phosphor 4.

As the second phosphor 8, for example, a phosphor is used in which the peak wavelength of the fluorescence peak $FP_2$ of the second wavelength-converted light 9 is on the shorter wavelength side of the peak wavelength of the fluorescence peak $FP_1$ of the first wavelength-converted light 7 of the first phosphor 4. As the second wavelength-converted light 9 emitted from such a second phosphor 8, for example, visible light, white light, or the like is used.

Output light 90 output from the light emitting device 1B is NIR+α light 80 that includes near-infrared light-including light 50 including the primary light 6 and the first wavelength-converted light 7, and second wavelength-converted light 9 which is a light component other than the near-infrared light-including light 50. Here, NIR+α light 80 means light including near-infrared light-including light 50 and a light component other than the near-infrared light-including light 50. When the second wavelength-converted light 9 is visible light 60 such as white light 70, NIR+α light 80 is light including the near-infrared light-including light 50 and the visible light 60 such as the white light 70.

Since the wavelength converter 3B further includes the second phosphor 8 in addition to the first phosphor 4, the light emitting device 1B can emit, as output light 90, NIR+α light 80 including near-infrared light-including light 50 and a light component other than the near-infrared light-including light 50.

As described above, when the wavelength converter 3B further includes the second phosphor 8 in addition to the first phosphor 4, the shape and excitation characteristics of the fluorescence spectrum emitted from the wavelength converter 3B can be controlled. Thus, it becomes possible for the obtained light emitting device 1B to easily adjust the spectral distribution of the output light according to the application.

The second phosphor 8 is not particularly limited as long as the fluorescence peak wavelength of the fluorescence peak $FP_2$ in the fluorescence spectrum $F_2$ of the second wavelength-converted light 9 is different from the fluorescence peak wavelength of the fluorescence peak $FP_1$ in the fluorescence spectrum $F_1$ of the first wavelength-converted light 7 of the first phosphor 4.

The second phosphor 8 preferably includes a phosphor of a garnet crystal structure containing $Ce^{3+}$. It is preferable that the second phosphor 8 include a phosphor of a garnet crystal structure containing $Ce^{3+}$ because it has a fluorescence peak wavelength from 500 to 600 nm, resulting in broad emission in a wide band.

As the phosphor of a garnet crystal structure containing $Ce^{3+}$, for example, $Y_3Al_5O_{12}:Ce^{3+}$, $Y_3(Al, Ga)_5O_{12}:Ce^{3+}$, $Lu_2Al_5O_{12}:Ce^{3+}$, $Lu_2CaMg_2Si_3O_{12}:Ce^{3+}$, or the like is used. When a second phosphor 8 including such a phosphor of a garnet crystal structure containing $Ce^{3+}$ is used, it becomes possible to obtain output light having a large amount of light components from green-based to yellow-based light components.

Such a second phosphor 8 absorbs light well within a wavelength range of 430 or more and 480 nm or less to convert it with high efficiency to green-based to yellow-based light having the maximum intensity value within a wavelength range of 500 or more and less than 600 nm. Thus, it becomes possible to easily obtain visible light components by having a solid-state light source 2 that emits blue light as the primary light 6 and then using the second phosphor 8.

When the wavelength converter 3B includes the first phosphor 4 and the second phosphor 8, it is preferable that the first phosphor 4 emit the first wavelength-converted light 7 by absorbing at least one of the primary light 6 emitted by the solid-state light source 2 or the second wavelength-converted light 9 emitted by the second phosphor 8. As described above, it is preferable that the first phosphor 4 be a phosphor that absorbs the primary light 6 emitted by the solid-state light source 2 and emits the first wavelength-converted light 7, which is near-infrared light.

The first phosphor 4 may be a phosphor that absorbs the second wavelength-converted light 9 emitted by the second phosphor 8 and emits the first wavelength-converted light 7, which is near-infrared light. That is, the second phosphor 8 may be excited by the primary light 6 to emit the second wavelength-converted light 9, and the first phosphor 4 may be excited by the second wavelength-converted light 9 to emit the first wavelength-converted light 7. In this case, even when the first phosphor 4 is a phosphor that is hardly excited by the primary light 6, by means of the second phosphor 8, it becomes possible for the first phosphor 4 to be excited by the fluorescence emitted by the second phosphor 8.

Therefore, when the first phosphor 4 absorbs the second wavelength-converted light 9 and emits the first wavelength-converted light 7, it becomes possible to select as the first phosphor 4 a phosphor that absorbs the visible light, and this broadens the choice of the first phosphor 4 and facilitates the industrial production of the light emitting device 1B. In addition, when the first phosphor 4 absorbs the second wavelength-converted light 9 and emits the first wavelength-converted light 7, it becomes possible for the light emitting device 1B to emit first wavelength-converted light 7 having a large near-infrared light component intensity.

Note that the second phosphor 8 may include two or more types of phosphor of a garnet crystal structure containing $Ce^{3+}$. It is preferable that the second phosphor 8 contain two or more types of $Ce^{3+}$-activated phosphor because a more broadband light emission is achieved.

(Action)

The action of the light emitting device 1B will be described. As illustrated in FIG. 2, first, the primary light 6 emitted from the solid-state light source 2 is emitted on the front surface 3a of the wavelength converter 3B. The emitted primary light 6 penetrates the wavelength converter 3B. Then, when the primary light 6 penetrates the wavelength converter 3B, the second phosphor 8 included in the wavelength converter 3B absorbs part of the primary light 6 and emits the second wavelength-converted light 9. Furthermore, the first phosphor 4 included in the wavelength converter 3B absorbs part of the primary light 6 and/or part of the second wavelength-converted light 9 and emits the first wavelength-converted light 7. In this way, the output light 90 including the primary light 6, the first wavelength-converted light 7, and the second wavelength-converted light 9 is emitted from the back surface 3b of the wavelength converter 3B.

The first wavelength-converted light 7 includes a near-infrared light component having a fluorescence peak within a wavelength range of 750 nm or more and less than 900 nm. Thus, the output light 90 output from the light emitting device 1B is NIR+α light 80 that is light including primary light 6, first wavelength-converted light 7 including the near-infrared light component, and second wavelength-converted light 9.

(Effect)

The first phosphor 4 included in the wavelength converter 3B of the light emitting device 1B emits first wavelength-converted light 7 including a large amount of the near-infrared light component. Thus, the wavelength converter 3B of the light emitting device 1B emits NIR+α light 80 including the near-infrared light component, as output light 90.

Therefore, the light emitting device 1B achieves the same effect as that of the light emitting device 1A according to the first embodiment.

In addition, since the wavelength converter 3B of the light emitting device 1B further includes the second phosphor 8, it becomes possible for the light emitting device 1B to easily adjust the spectral distribution of the output light according to the application.

In addition, the light emitting device 1B emits, as output light 90, NIR+α light 80 including near-infrared light-including light 50 and visible light 60 such as white light 70. Thus, the light emitting device 1B can be used as an illumination device.

Furthermore, the light emitting device 1B can output near-infrared light-including light 50 having a wider band by combining visible light 60 such as white light 70 and the near-infrared light-including light 50.

Third Embodiment

The light emitting device 1C (1) according to the third embodiment will be described. The light emitting device 1C according to the third embodiment includes the near-infrared light emitting device 10C (10) that is a device emitting near-infrared light-including light 50, and the white light emitting device 30C (30) that is a device emitting white light 70.

That is, the light emitting device 1C is a light emitting device including the near-infrared light emitting device 10C (10) that is a light emitting device emitting near-infrared light, and the white light emitting device 30C (30) that is a light emitting device emitting white light.

The light emitting device 1C emits, as output light 90, NIR+α light 80 that includes: near-infrared light-including light 50 including primary light 6 and first wavelength-converted light 7; and second wavelength-converted light 9 that is a light component other than the near-infrared light-including light 50. Thus, in detail, the light emitting device 1C can be said to be an NIR+α light emitting device 40C (40) that emits NIR+α light 80.

(Near-Infrared Light Emitting Device)

The near-infrared light emitting device 10C is a device that emits near-infrared light-including light 50. The near-infrared light emitting device 10C includes the solid-state light source 2 and the wavelength converter 3C (3). Note that the solid-state light source 2 and the wavelength converter 3C of the near-infrared light emitting device 10C have the same structures as those of the solid-state light source 2 and the wavelength converter 3A of the light emitting device 1A according to the first embodiment, respectively. That is, the near-infrared light emitting device 10C has the same structure as that of the light emitting device 1A according to the first embodiment.

The output light 90 output from the near-infrared light emitting device 10C, like the output light 90 output from the light emitting device 1A, is near-infrared light-including light 50 that is light including primary light 6 and first wavelength-converted light 7 including a near-infrared light component.

(White Light Emitting Device)

The white light emitting device 30C is a device that emits white light 70. The white light emitting device 30C includes the solid-state light source 2 and a white light wavelength converter 33C (33). The solid-state light source 2 of the white light emitting device 30C has the same configuration as that of the solid-state light source 2 of the light emitting device 1A according to the first embodiment.

The solid-state light source 2 included in the near-infrared light emitting device 10C and the solid-state light source 2 included in the white light emitting device 30C may have the same characteristic or different characteristics.

(Visible Light Emitting Device)

Note that although the white light emitting device 30C is a device that emits white light 70, the visible light emitting device 20C (20) emitting visible light 60 may be used, as necessary, instead of the white light emitting device 30C, as a modified example. The visible light emitting device 20C includes the solid-state light source 2 and a visible light wavelength converter 23C (23). The visible light emitting device 20C can be manufactured by changing, for example, the solid-state light source 2, the second phosphor 8 in the white light wavelength converter 33C, and the like, making up the white light emitting device 30C.

(White Light Wavelength Converter)

The white light wavelength converter 33C (33) includes the second phosphor 8 and the sealant 5. The white light wavelength converter 33C corresponds to one obtained by replacing all of the first phosphor 4 with the second phosphor 8 in the wavelength converter 3B included in the light emitting device 1B according to the second embodiment.

The white light wavelength converter 33C is the same as the wavelength converter 3B included in the light emitting device 1B according to the second embodiment except that all of the first phosphor 4 is replace with the second phosphor 8. Thus, the description of the structure and action will be omitted or simplified hereinafter.

(Visible Light Wavelength Converter)

Note that as necessary, the visible light wavelength converter 23C (23) may be used instead of the white light wavelength converter 33C. The visible light wavelength converter 23C, like the white light wavelength converter 33C, includes the second phosphor 8 and the sealant 5. The visible light wavelength converter 23C can be manufactured by changing the second phosphor 8 and the like in the white light wavelength converter 33C.

(Action)

The action of the light emitting device 1C will be described. As illustrated in FIG. 3, the action of the light emitting device 1C is a combination of the action of the near-infrared light emitting device 10C and the action of the white light emitting device 30C.

The action of the near-infrared light emitting device 10C is the same as that of the light emitting device 1A according to the first embodiment except that output light 90 is not emitted. That is, first, the primary light 6 emitted from the solid-state light source 2 is emitted on a front surface 3a of the wavelength converter 3C. The emitted primary light 6 penetrates the wavelength converter 3C. When the primary light 6 penetrates the wavelength converter 3C, the first phosphor 4 included in the wavelength converter 3C absorbs part of the primary light 6 and emits the first wavelength-converted light 7. In this way, near-infrared light-including light 50 including the primary light 6 and the first wavelength-converted light 7 is emitted from a back surface 3b of the wavelength converter 3C.

The action of the white light wavelength converter 33C is the same as that of the light emitting device 1B according to the second embodiment except that there is no action by the first phosphor 4 and output light 90 is not emitted. That is, first, primary light 6 emitted from the solid-state light source 2 is emitted on a front face 3a of the white light wavelength converter 33C. The emitted primary light 6 penetrates the white light wavelength converter 33C. When the primary light 6 penetrates the white light wavelength converter 33C, the second phosphor 8 included in the white light wavelength converter 33C absorbs part of the primary light 6 and emits the second wavelength-converted light 9. In this way, white light 70 that is light including the primary light 6 and the second wavelength-converted light 9 is emitted from a back surface 3b of the white light wavelength converter 33C.

The action of the light emitting device 1C is a combination of the action of the near-infrared light emitting device 10C and the action of the white light emitting device 30C. When the near-infrared light emitting device 10C and the white light emitting device 30C are operated together, the action of the light emitting device 1C is the sum of the action of the near-infrared light emitting device 10C and the action of the white light emitting device 30C. When only one of the near-infrared light emitting device 10C and the white light emitting device 30C is operated, the action of the light emitting device 1C is the action of the near-infrared light emitting device 10C or the action of the white light emitting device 30C.

When the near-infrared light emitting device 10C and the white light emitting device 30C are operated together, the light emitting device 1C emits NIR+α light 80 that includes: near-infrared light-including light 50 which includes primary light 6 and first wavelength-converted light 7; and white light 70 which is light including primary light 6 and second wavelength-converted light 9.

Note that when the visible light emitting device 20C using the visible light wavelength converter 23C instead of the white light wavelength converter 33C is used, the action of the visible light wavelength converter 23C is as follows. That is, first, primary light 6 emitted from the solid-state light source 2 is emitted on a front face 3a of the visible light wavelength converter 23C. The emitted primary light 6 penetrates the visible light wavelength converter 23C. When the primary light 6 penetrates the visible light wavelength converter 23C, the second phosphor 8 included in the visible light wavelength converter 23C absorbs part of the primary light 6 and emits second wavelength-converted light 9. Thus, visible light 60 that is light including the primary light 6 and the second wavelength-converted light 9 is emitted from a back surface 3b of the visible light wavelength converter 23C.

When the near-infrared light emitting device 10C and the visible light emitting device 20C are operated together, the light emitting device 1C emits NIR+α light 80 that includes: near-infrared light-including light 50 which includes primary light 6 and first wavelength-converted light 7; and visible light 60 which is light including primary light 6 and second wavelength-converted light 9.

The first wavelength-converted light 7 includes a near-infrared light component having a fluorescence peak within a wavelength range of 750 nm or more and less than 900 nm. Thus, when the near-infrared light emitting device 10C and the white light emitting device 30C are operated together, output light 90 output from the light emitting device 1C is NIR+α light 80 that is light including primary light 6, first wavelength-converted light 7 including the near-infrared light component, and second wavelength-converted light 9.
(Effect)

The first phosphor 4 contained in the wavelength converter 3C included in the near-infrared light emitting device 10C of the light emitting device 1C emits first wavelength-converted light 7 including a large amount of a near-infrared light component. The white light wavelength converter 33C included in the white light emitting device 30C of the light emitting device 1C emits white light 70. Thus, when the near-infrared light emitting device 10C and the white light emitting device 30C are operated together, the light emitting device 1C emits NIR+α light 80 including the near-infrared light component, as output light 90.

When the visible light emitting device 20C is used instead of the white light emitting device 30C in the light emitting device 1C, the visible light wavelength converter 23C included in the visible light emitting device 20C of the light emitting device 1C emits visible light 60. Thus, when the near-infrared light emitting device 10C and the visible light emitting device 20C are operated together, the light emitting device 1C emits NIR+α light 80 including the near-infrared light component, as output light 90.

As described above, the light emitting device 1C achieves the same effect as that of the light emitting device 1A according to the first embodiment.

In addition, the light emitting device 1C can be used as an illumination device as the light emitting device 1B according to the second embodiment, and can output near-infrared light-including light 50 having a wider band.

Furthermore, in the light emitting device 1C, at least one of the near-infrared light emitting device 10C or the white light emitting device 30C can be operated. Thus, the light emitting device 1C can change the intensity ratio between near-infrared light-including light 50 and white light 70.

Furthermore, when the visible light emitting device 20C is used instead of the white light emitting device 30C, at least one of the near-infrared light emitting device 10C or the visible light emitting device 20C can be operated in the light emitting device 1C. Thus, the light emitting device 1C using the visible light emitting device 20C instead of the white light emitting device 30C can change the intensity ratio between near-infrared light-including light 50 and visible light 60.

Fourth Embodiment

The light emitting device 1D (1) according to the fourth embodiment will be described. The light emitting device 1D according to the fourth embodiment includes the near-infrared light emitting device 10D (10) that is a device emitting near-infrared light-including light 50, and the white light source 35 that is a light source emitting white light 70.

That is, the light emitting device 1D is a light emitting device including: the near-infrared light emitting device 10D (10) that is a light emitting device emitting near-infrared light; and the white light source 35 that is a light source emitting white light 70.

The light emitting device 1D differs from the light emitting device 1C according to the third embodiment in that the white light source 35 is used instead of the white light emitting device 30C, and the other points are the same. Thus, the white light source 35 will be mainly described below, and the description of other configurations and actions will be omitted or simplified.

The light emitting device 1D emits, as output light 90, NIR+α light 80 that includes: near-infrared light-including light 50 which includes primary light 6 and first wavelength-converted light 7; and second wavelength-converted light 9 which is a light component other than the near-infrared light-including light 50. Thus, in detail, the light emitting device 1D can be said to be an NIR+α light emitting device 40D (40) that emits the NIR+α light 80.
(Near-Infrared Light Emitting Device)

The near-infrared light emitting device 10D includes the solid-state light source 2 and the wavelength converter 3D (3). The solid-state light source 2 and the wavelength converter 3D of the near-infrared light emitting device 10D have the same structures as those of the solid-state light source 2 and the wavelength converter 3C of the near-infrared light emitting device 10C included in the light emitting device 1C according to the third embodiment, respectively. Thus, the solid-state light source 2 and the wavelength converter 3D of the near-infrared light emitting device 10D have the same structures as those of the solid-state light source 2 and the wavelength converter 3A of the light emitting device 1A according to the first embodiment.

Output light 90 output from the near-infrared light emitting device 10D, like the output light 90 output from the near-infrared light emitting device 10C and the light emitting device 1A, is near-infrared light-including light 50 that is light including primary light 6 and first wavelength-converted light 7 including a near-infrared light component.
(White Light Source)

The white light source 35 is a light source that emits white light 70. As the white light source 35, a known light source can be used.
(Visible Light Source)

Note that although the white light source 35 is a light source that emits white light 70, as necessary, the visible light source 25 that emits visible light 60 may be used instead of the white light source 35, as a modified example. As the visible light source 25, a known light source can be used.

(Action)

The action of the light emitting device 1D will be described. As illustrated in FIG. 4, the action of the light emitting device 1D is a combination of the action of the light emitting device 1C according to the third embodiment and the action of the white light source 35.

The action of the near-infrared light emitting device 10D is the same as that of the near-infrared light emitting device 10C included in the light emitting device 1C according to the third embodiment. That is, first, primary light 6 emitted from the solid-state light source 2 is emitted on a front face 3a of the wavelength converter 3D. The emitted primary light 6 penetrates the wavelength converter 3D. When the primary light 6 penetrates the wavelength converter 3D, the first phosphor 4 included in the wavelength converter 3D absorbs part of the primary light 6 and emits first wavelength-converted light 7. Thus, the near-infrared light-including light 50 including the primary light 6 and the first wavelength-converted light 7 is emitted from a back surface 3b of the wavelength converter 3D.

The action of the white light source 35 is an action of emitting white light 70.

The action of the light emitting device 1D is a combination of the action of the near-infrared light emitting device 10D and the action of the white light source 35. When the near-infrared light emitting device 10D and the white light source 35 are operated together, the action of the light emitting device 1D is the sum of the action of the near-infrared light emitting device 10D and the action of the white light source 35. When only one of the near-infrared light emitting device 10D and the white light source 35 is operated, the action of the light emitting device 1D is the action of the near-infrared light emitting device 10D or the action of the white light source 35.

When the near-infrared light emitting device 10D and the white light source 35 are operated together, the light emitting device 1D emits NIR+α light 80 that includes: near-infrared light-including light 50 including the primary light 6 and the first wavelength-converted light 7; and the white light 70.

Note that when the visible light emitting device 20C using the visible light source 25 instead of the white light source 35 is used, the action of the visible light source 25 is the action of emitting visible light 60.

When the near-infrared light emitting device 10D and the visible light source 25 are operated together, the light emitting device 1D emits the NIR+α light 80 that includes: near-infrared light-including light 50 including primary light 6 and first wavelength-converted light 7; and visible light 60.

The first wavelength-converted light 7 includes a near-infrared light component having a fluorescence peak within a wavelength range of 750 nm or more and less than 900 nm. Thus, when the near-infrared light emitting device 10D and the white light source 35 are operated together, output light 90 output from the light emitting device 1D is NIR+α light 80 that includes primary light 6, first wavelength-converted light 7 including the near-infrared light component, and white light 70.

When the near-infrared light emitting device 10D and the visible light source 25 are operated together, output light 90 output from the light emitting device 1D is NIR+α light 80 that includes primary light 6, first wavelength-converted light 7 including the near-infrared light component, and visible light 60.

(Effect)

The first phosphor 4 contained in the wavelength converter 3D included in the near-infrared light emitting device 10D of the light emitting device 1D emits first wavelength-converted light 7 including a large amount of the near-infrared light component. The white light source 35 of the light emitting device 1D emits white light 70. Thus, when the near-infrared light emitting device 10D and the white light source 35 are operated together, the light emitting device 1D emits NIR+α light 80 including the near-infrared light component, as output light 90.

When the visible light source 25 is used instead of the white light source 35 in the light emitting device 1D, the visible light source 25 of the light emitting device 1D emits visible light 60. Thus, when the near-infrared light emitting device 10D and the visible light source 25 are operated together, the light emitting device 1D emits NIR+α light 80 including the near-infrared light component, as output light 90.

Thus, the light emitting device 1D achieves the same effect as that of the light emitting device 1A according to the first embodiment.

In addition, the light emitting device 1D can be used as an illumination device as the light emitting device 1B according to the second embodiment, and can output near-infrared light-including light 50 having a wider band.

Furthermore, in the light emitting device 1D, at least one of the near-infrared light emitting device 10D or the white light source 35 can be operated. Thus, the light emitting device 1D can change the intensity ratio between the near-infrared light-including light 50 and the white light 70.

Furthermore, when the visible light source 25 is used instead of the white light source 35, at least one of the near-infrared light emitting device 10D or the visible light source 25 can be operated in the light emitting device 1D. Thus, the light emitting device 1D using the visible light source 25 instead of the white light source 35 can change the intensity ratio between near-infrared light-including light 50 and visible light 60.

Fifth Embodiment

The light emitting device 1E (1) according to the fifth embodiment will be described. The light emitting device 1E according to the fifth embodiment includes the solid-state light source 2, the wavelength converter 3E (3), and a light guiding member 15. The light emitting device 1E according to the fifth embodiment is obtained by adding the light guiding member 15 to the light emitting device 1A according to the first embodiment.

The light emitting device 1E according to the fifth embodiment differs from the light emitting device 1A according to the first embodiment only in the light guiding member 15. Thus, the light guiding member 15 will be mainly described below, and the description of configurations and actions of other members will be omitted or simplified.

In the light emitting device 1E, the solid-state light source 2 and the wavelength converter 3E are arranged spaced apart in such a manner that the primary light 6 emitted from the solid-state light source 2 passes through the inside of the light guiding member 15 to be emitted to the wavelength converter 3E.

(Light Guiding Member)

The light guiding member 15 is a member arranged between the solid-state light source 2 and the wavelength converter 3E to guide primary light 6 to the wavelength converter 3E. The primary light 6 is to pass through the inside of the light guiding member 15.

In the light emitting device 1E, the solid-state light source 2 and the wavelength converter 3E are arranged spaced apart. However, the light guiding member 15 allows the primary light 6 emitted by the solid-state light source 2 to pass through the inside of the light guiding member 15 to be emitted on the wavelength converter 3E. In the light emitting device 1E, by providing the light guiding member 15, the primary light 6 can be efficiently guided to the wavelength converter 3E even when the solid-state light source 2 and the wavelength converter 3E are arranged spaced apart.

For example, an optical fiber or the like is used as the light guiding member 15.

(Action)

The action of the light emitting device 1E will be described. As illustrated in FIG. 5, first, primary light 6 emitted from the solid-state light source 2 passes through the inside of the light guiding member 15 to be emitted on a front face 3a of the wavelength converter 3E. The emitted primary light 6 penetrates the wavelength converter 3E. When the primary light 6 penetrates the wavelength converter 3E, the first phosphor 4 included in the wavelength converter 3E absorbs part of the primary light 6 and emits the first wavelength-converted light 7. In this way, the output light 90 including the primary light 6 and the first wavelength-converted light 7 is emitted from the back surface 3b of the wavelength converter 3E.

The first wavelength-converted light 7 includes a near-infrared light component having a fluorescence peak within a wavelength range of 750 nm or more and less than 900 nm. Thus, output light 90 output from the light emitting device 1E is near-infrared light-including light 50 that includes primary light 6 and first wavelength-converted light 7 including the near-infrared light component.

(Effect)

Since the first phosphor 4 included in the wavelength converter 3E of the light emitting device 1E emits the first wavelength-converted light 7 including a large amount of a near-infrared light component, the wavelength converter 3E of the light emitting device 1E emits output light 90 including the near-infrared light component.

Thus, the light emitting device 1E achieves the same effect as that of the light emitting device 1A according to the first embodiment.

Since the light emitting device 1E includes the light guiding member 15, it is possible to have a configuration in which the solid-state light source 2 and the wavelength converter 3 are separated in distance. Thus, with the light emitting device 1E, the degree of freedom in designing the arrangement of the solid-state light source 2 and the wavelength converter 3 in the light emitting device 1 becomes relatively large.

Sixth Embodiment

The light emitting device 1F (1) according to the sixth embodiment will be described. The light emitting device 1F according to the sixth embodiment includes the solid-state light source 2, the wavelength converter 3F (3), and the light guiding member 15. The light emitting device 1F according to the sixth embodiment is obtained by adding the light guiding member 15 to the light emitting device 1B according to the second embodiment.

The light emitting device 1F according to the sixth embodiment differs from the light emitting device 1B according to the second embodiment only in the light guiding member 15. The light guiding member 15 is the same as that used in the light emitting device 1E according to the fifth embodiment. Thus, only the action of the light emitting device 1F will be described below, and the description of constituent members will be omitted or simplified.

In the light emitting device 1F, the solid-state light source 2 and the wavelength converter 3F are arranged spaced apart in such a manner that the primary light 6 emitted from the solid-state light source 2 passes through the inside of the light guiding member 15 to be emitted to the wavelength converter 3F.

The light emitting device 1F emits, as output light 90, NIR+α light 80 that includes: near-infrared light-including light 50 which includes primary light 6 and first wavelength-converted light 7; and second wavelength-converted light 9 which is a light component other than the near-infrared light-including light 50. Thus, in detail, the light emitting device 1F can be said to be an NIR+α light emitting device 40F (40) that emits the NIR+α light 80.

(Action)

The action of the light emitting device 1F will be described. As illustrated in FIG. 6, first, the primary light 6 emitted from the solid-state light source 2 passes through the inside of the light guiding member 15 to be emitted on a front face 3a of the wavelength converter 3F. The emitted primary light 6 penetrates the wavelength converter 3F. When the primary light 6 penetrates the wavelength converter 3F, the second phosphor 8 included in the wavelength converter 3F absorbs part of the primary light 6 and emits the second wavelength-converted light 9. Furthermore, the first phosphor 4 included in the wavelength converter 3F absorbs part of the primary light 6 and/or part of the second wavelength-converted light 9 to emit the first wavelength-converted light 7. In this way, the output light 90 including the primary light 6, the first wavelength-converted light 7, and the second wavelength-converted light 9 is emitted from a back surface 3b of the wavelength converter 3F.

The first wavelength-converted light 7 includes a near-infrared light component having a fluorescence peak within a wavelength range of 750 nm or more and less than 900 nm. Thus, output light 90 output from the light emitting device 1F is NIR+α light 80 that includes the primary light 6, the first wavelength-converted light 7 including the near-infrared light component, and the second wavelength-converted light 9.

(Effect)

The first phosphor 4 included in the wavelength converter 3F of the light emitting device 1F emits the first wavelength-converted light 7 including a large amount of the near-infrared light component, and thus the wavelength converter 3F of the light emitting device 1F emits the NIR+α light 80 including the near-infrared light component, as output light 90.

Thus, the light emitting device 1F achieves the same effect as that of the light emitting device 1A according to the first embodiment.

Since the wavelength converter 3F of the light emitting device 1F further includes the second phosphor 8, it becomes possible for the light emitting device 1F to easily adjust the spectral distribution of the output light according to the application.

Since the light emitting device 1F includes the light guiding member 15, it is possible to have a configuration in which the solid-state light source 2 and the wavelength converter 3 are separated in distance. Thus, with the light emitting device 1F, the degree of freedom in designing the arrangement of the solid-state light source 2 and the wavelength converter 3 in the light emitting device 1 becomes relatively large.

Seventh Embodiment

The light emitting device 1G (1) according to the seventh embodiment will be described. The light emitting device 1G according to the seventh embodiment includes the near-infrared light emitting device 10G (10) that is a device emitting near-infrared light-including light 50, and the white light emitting device 30G (30) that is a device emitting white light 70. The near-infrared light emitting device 10G is obtained by adding the light guiding member 15 to the near-infrared light emitting device 10C of the light emitting device 1C according to the third embodiment. The white light emitting device 30G is obtained by adding the light guiding member 15 to the white light emitting device 30C of the light emitting device 1C according to the third embodiment.

The light emitting device 1G according to the seventh embodiment differs from the light emitting device 1C according to the third embodiment only in the light guiding member 15. The light guiding member 15 is the same as that used in the light emitting device 1E according to the fifth embodiment. Thus, only the action of the light emitting device 1G will be mainly described below, and the description of constituent members will be omitted or simplified.

As output light 90, the light emitting device 1G emits NIR+α light 80 that includes: near-infrared light-including light 50 which includes primary light 6 and first wavelength-converted light 7; and second wavelength-converted light 9 which is a light component other than the near-infrared light-including light 50. Thus, in detail, the light emitting device 1G can be said to be an NIR+α light emitting device 40G (40) that is a device emitting the NIR+α light 80.

(Near-Infrared Light Emitting Device)

The near-infrared light emitting device 10G includes the solid-state light source 2, the wavelength converter 3G (3), and the light guiding member 15. The solid-state light source 2, the wavelength convener 3G, and the light guiding member 15 of the near-infrared light emitting device 10G have the same structures as those of the solid-state light source 2, the wavelength converter 3E, and the light guiding member 15 of the light emitting device 1E according to the fifth embodiment. In the near-infrared light emitting device 10G of the light emitting device 1G, the solid-state light source 2 and the wavelength converter 3E are arranged spaced apart in such a manner that the primary light 6 emitted from the solid-state light source 2 passes through the inside of the light guiding member 15 to be emitted to the wavelength converter 3G.

(White Light Emitting Device)

The white light emitting device 30G includes the solid-state light source 2, a white light wavelength converter 33G (33), and the light guiding member 15. The solid-state light source 2 and the white light wavelength converter 33G of the white light emitting device 30G have the same structures as those of the solid-state light source 2 and the white light wavelength converter 33C of the light emitting device 1C according to the third embodiment, respectively. In the white light emitting device 30G of the light emitting device 1G, the solid-state light source 2 and the white light wavelength converter 33G (33) are arranged spaced apart in such a manner that the primary light 6 emitted from the solid-state light source 2 passes through the inside of the light guiding member 15 to be emitted to the white light wavelength converter 33G.

The solid-state light source 2 included in the near-infrared light emitting device 10G and the solid-state light source 2 included in the white light emitting device 30G may have the same characteristic or different characteristics.

(Visible Light Emitting Device)

Note that although the white light emitting device 30G is a device that emits white light 70, the visible light emitting device 20G (20) emitting visible light 60 may be used, as necessary, instead of the white light emitting device 30G, as a modified example. The visible light emitting device 20G includes a solid-state light source 2 and a visible light wavelength converter 23G (23). The visible light emitting device 20G can be manufactured by changing, for example, the solid-state light source 2, a second phosphor 8 in the white light wavelength converter 33G, and the like, making up the white light emitting device 30G.

(Action)

The action of the light emitting device 1G will be described. As illustrated in FIG. 7, the action of the light emitting device 1G is a combination of the action of the near-infrared light emitting device 10G and the action of the white light emitting device 30G.

The action of the near-infrared light emitting device 10G is the same as that of the light emitting device 1C according to the third embodiment except that primary light 6 emitted from the solid-state light source 2 passes through the inside of the light guiding member 15 to be emitted to a front face 3a of the wavelength converter 3G. That is, first, the primary light 6 emitted from the solid-state light source 2 passes through the inside of the light guiding member 15 to be emitted on the front face 3a of the wavelength converter 3G. The emitted primary light 6 penetrates the wavelength converter 3G. When the primary light 6 penetrates the wavelength converter 3G, the first phosphor 4 included in the wavelength converter 3G absorbs part of the primary light 6 and emits the first wavelength-converted light 7. In this way, near-infrared light-including light 50 including the primary light 6 and the first wavelength-converted light 7 is emitted from a back surface 3b of the wavelength converter 3G.

The action of the white light emitting device 30G is the same as that of the light emitting device 1C according to the third embodiment except that the primary light 6 emitted from the solid-state light source 2 passes through the inside of the light guiding member 15 to be emitted on a front face 3a of the white light wavelength converter 33G. That is, first, the primary light 6 emitted from the solid-state light source 2 passes through the inside of the light guiding member 15 to be emitted on the front face 3a of the white light wavelength converter 33G. The emitted primary light 6 penetrates the white light wavelength converter 33G. When the primary light 6 penetrates the white light wavelength converter 33G, the second phosphor 8 included in the white light wavelength converter 33G absorbs part of the primary light 6 and emits the second wavelength-converted light 9. In this way, white light 70 that is light including the primary light 6 and the second wavelength-converted light 9 is emitted from a back surface 3b of the white light wavelength converter 33G.

The action of the light emitting device 1G is a combination of the action of the near-infrared light emitting device 10G and the action of the white light emitting device 30G. Since the action of the light emitting device 1G is the same as that of the light emitting device 1C except that the primary light 6 emitted from the solid-state light source 2 passes through the inside of the light guiding member 15, the description thereof will be omitted.

(Effect)

The first phosphor 4 contained in the wavelength converter 3G included in the near-infrared light emitting device 10G of the light emitting device 1G emits first wavelength-converted light 7 including a large amount of the near-infrared light component. The white light wavelength converter 33G included in the white light emitting device 30G of the light emitting device 1G emits white light 70. Thus, when the near-infrared light emitting device 10G and the white light emitting device 30G are operated together, the light emitting device 1G emits NIR+α light 80 including the near-infrared light component, as output light 90.

When the visible light emitting device 20G is used instead of the white light emitting device 30G in the light emitting device 1G, the visible light wavelength converter 23G included in the visible light emitting device 20G of the light emitting device 1G emits visible light 60. Thus, when the near-infrared light emitting device 10G and the visible light emitting device 20G are operated together, the light emitting device 1G emits NIR+α light 80 including the near-infrared light component, as output light 90.

As described above, the light emitting device 1G achieves the same effect as that of the light emitting device 1A according to the first embodiment.

In addition, the light emitting device 1G can be used as an illumination device as the light emitting device 1B according to the second embodiment, and can output near-infrared light-including light 50 having a wider band.

Furthermore, in the light emitting device 1G, at least one of the near-infrared light emitting device 10G or the white light emitting device 30G can be operated. Thus, the light emitting device 1G can change the intensity ratio between the near-infrared light-including light 50 and the white light 70.

Furthermore, when the visible light emitting device 20G is used instead of the white light emitting device 30G, at least one of the near-infrared light emitting device 10G or the visible light emitting device 20G can be operated in the light emitting device 1G. Thus, the light emitting device 1G using the visible light emitting device 20G instead of the white light emitting device 30G can change the intensity ratio between the near-infrared light-including light 50 and the visible light 60.

Since the light emitting device 1G includes the light guiding member 15, it is possible to have a configuration in which the solid-state light source 2 and the wavelength converter 3 are separated in distance. Thus, with the light emitting device 1G, the degree of freedom in designing the arrangement of the solid-state light source 2 and the wavelength converter 3 in the light emitting device 1 becomes relatively large.

Since the light emitting device 1G includes the light guiding member 15, it is possible to have a configuration in which the solid-state light source 2 and the white light wavelength converter 33 are separated in distance. Thus, with the light emitting device 1G, the degree of freedom in designing the arrangement of the solid-state light source 2 and the white light wavelength converter 33 in the light emitting device 1 becomes relatively large.

<Sensing System Illumination System>

Figure 8:
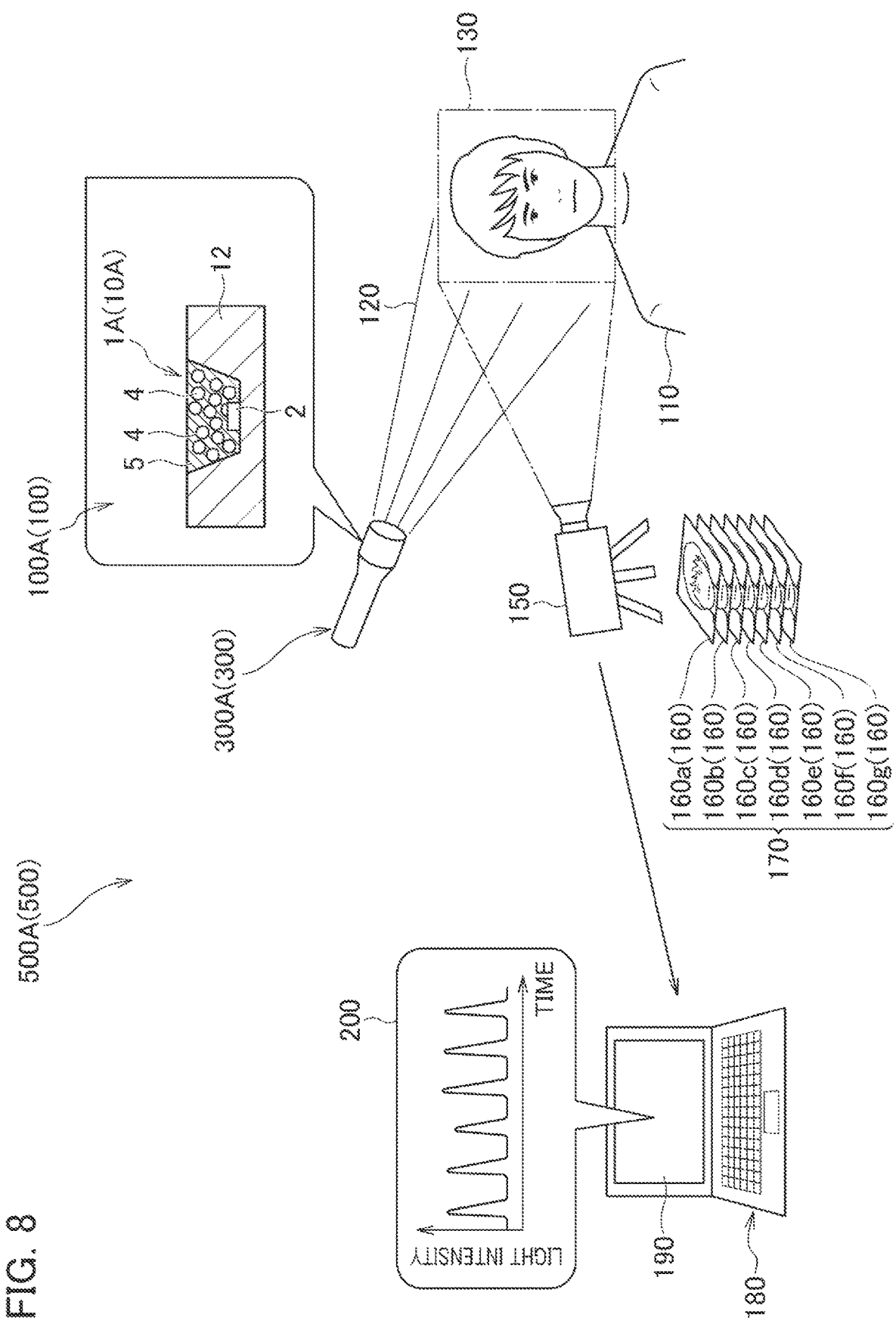
FIG. 8 is a diagram illustrating an example of a sensing system according to the first embodiment.
Figure 9:
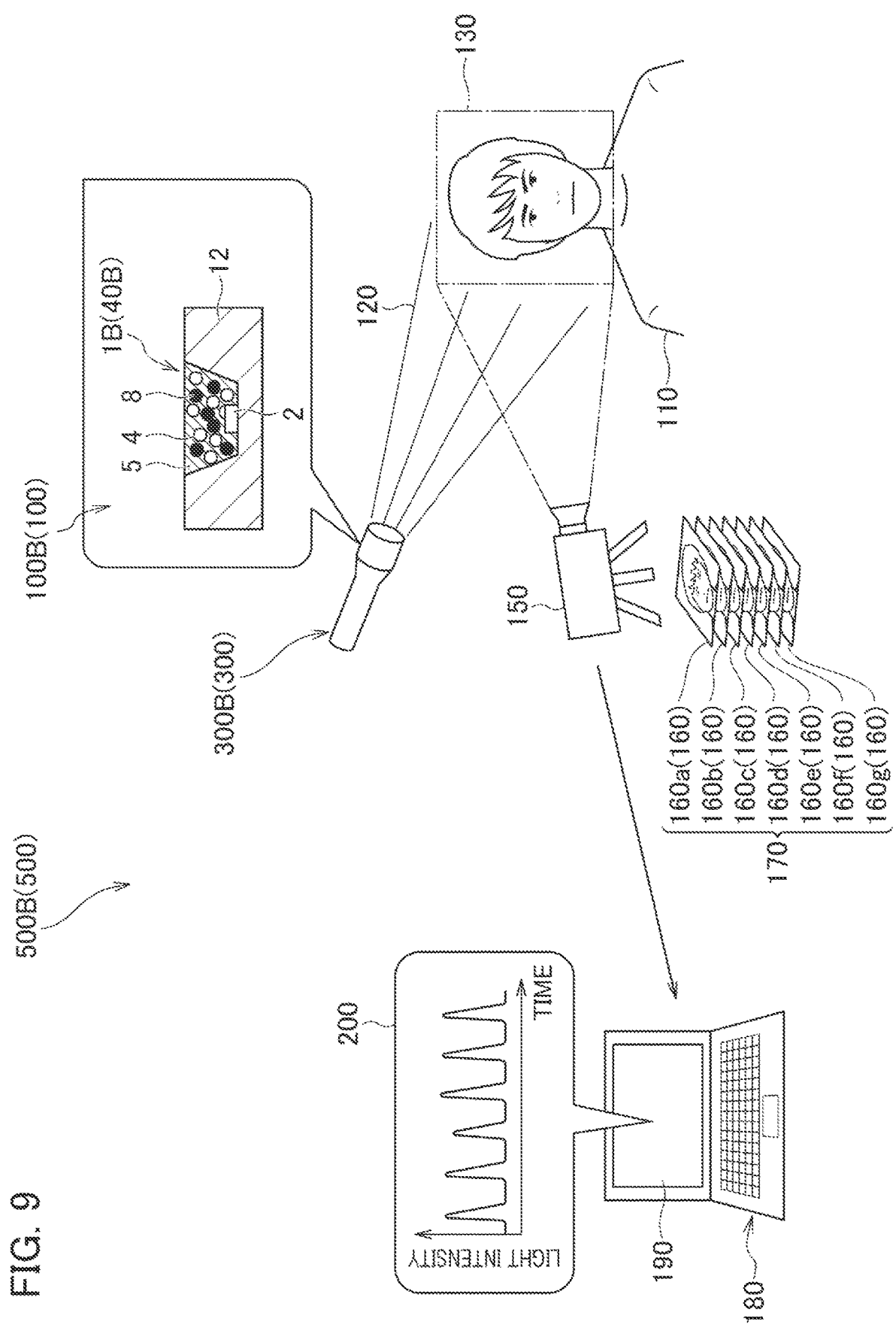
FIG. 9 is a diagram illustrating an example of a sensing system according to the second embodiment.
Figure 10:
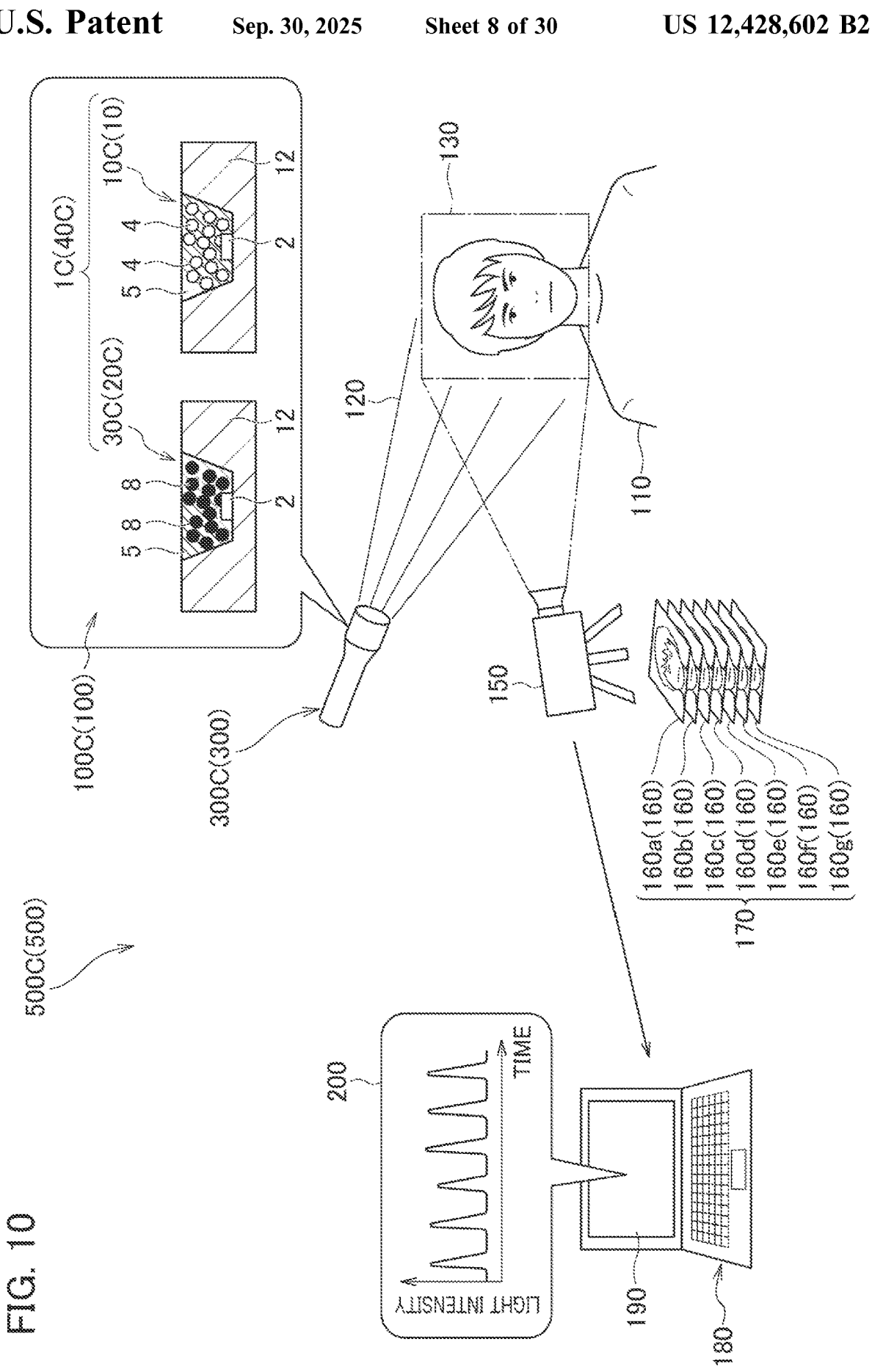
FIG. 10 is a diagram illustrating an example of a sensing system according to the third embodiment.
Figure 11:
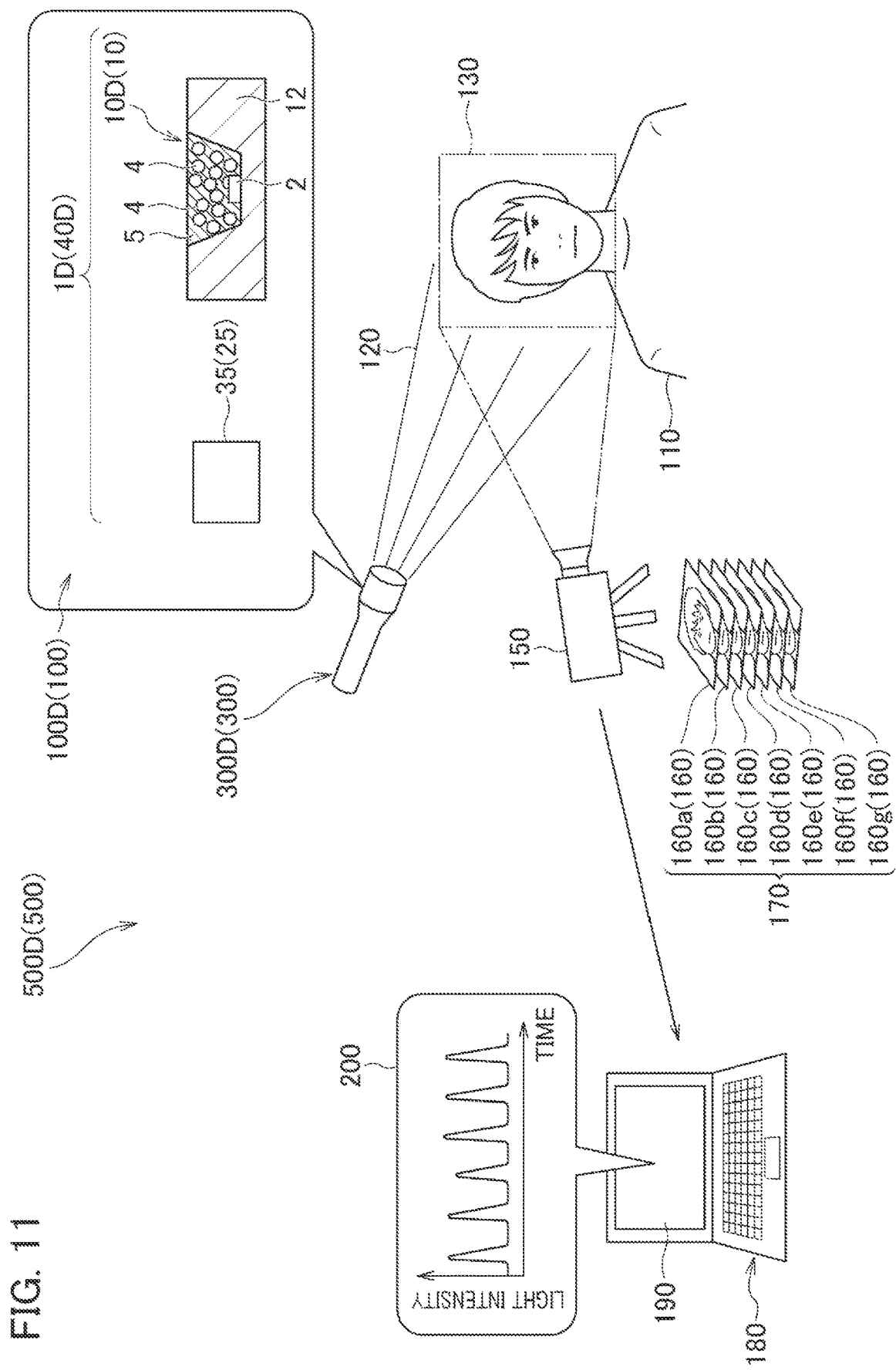
FIG. 11 is a diagram illustrating an example of a sensing system according to the fourth embodiment.

Next, sensing systems 500 (500A to 500D) according to embodiments are illustrated in FIGS. 8 to 11. FIG. 8 is a diagram illustrating an example of a sensing system according to the first embodiment. FIG. 9 is a diagram illustrating an example of a sensing system according to the second embodiment. FIG. 10 is a diagram illustrating an example of a sensing system according to the third embodiment. FIG. 11 is a diagram illustrating an example of a sensing system according to the fourth embodiment.

Specifically, FIG. 8 illustrates the sensing system 500A (500) according to the first embodiment. FIG. 9 illustrates the sensing system 500B (500) according to the second embodiment. FIG. 10 illustrates the sensing system 500C (500) according to the third embodiment. FIG. 11 illustrates the sensing system 500D (500) according to the fourth embodiment.

The sensing systems 500A to 500D according to the first to fourth embodiments include the light emitting devices 1A to 1D according to the first to fourth embodiments, respectively.

Specifically, the sensing system 500A according to the first embodiment includes the sensing system illumination system 300A (300). The sensing system illumination system 300A includes the light emitting device 1A according to the first embodiment as the sensing system light source 100A (100). That is, the sensing system light source 100A includes the light emitting device 1A according to the first embodiment. The sensing system illumination system 300A includes the light emitting device 1A according to the first embodiment. Note that the light emitting device 1A can be said to be the near-infrared light emitting device 10A (10) that is a device emitting near-infrared light-including light 50.

The sensing system 500B according to the second embodiment includes a sensing system illumination system 300B (300). The sensing system illumination system 300B includes the light emitting device 1B according to the second embodiment as a sensing system light source 100B (100). That is, the sensing system light source 100B includes the light emitting device 1B according to the second embodiment. The sensing system illumination system 300B includes the light emitting device 1B according to the second embodiment. Note that the light emitting device 1B can be said to be the NIR+α light emitting device 40B (40) that is a device emitting NIR+α light 80.

The sensing system 500C according to the third embodiment includes a sensing system illumination system 300C (300). The sensing system illumination system 300C includes the light emitting device 1C according to the third embodiment as a sensing system light source 100C (100). That is, the sensing system light source 100C includes the light emitting device 1C according to the third embodiment. The sensing system illumination system 300C includes the light emitting device 1C according to the third embodiment. Note that the light emitting device 1C can be said to be the NIR+α light emitting device 40C (40) that is a device emitting NIR+α light 80.

The sensing system 500D according to the fourth embodiment includes a sensing system illumination system 300D (300). The sensing system illumination system 300D includes the light emitting device 1D according to the fourth embodiment as a sensing system light source 100D (100). That is, the sensing system light source 100D includes the light emitting device 1D according to the fourth embodiment. The sensing system illumination system 300D includes the light emitting device 1D according to the fourth embodiment. Note that the light emitting device 1D can be said to be the NIR+α light emitting device 40D (40) that is a device emitting NIR+α light 80.

First Embodiment

The sensing system 500A according to the first embodiment will be described. The sensing system 500A according to the first embodiment illustrated in FIG. 8 includes the sensing system illumination system 300A, a spectral camera 150, and a computer 180.

(Sensing System Illumination System)

The sensing system illumination system 300A is an illumination system using the sensing system light source 100A (100) including the light emitting device 1A according to the first embodiment. Specifically, the sensing system illumination system 300A is an illumination system including the sensing system light source 100A (100) therein, the sensing system light source 100A (100) being made from a base member 12 and the light emitting device 1A according to the first embodiment formed in a recess part of the base member 12.

The sensing system illumination system 300A includes the sensing system light source 100A, and the sensing system light source 100A includes the light emitting device 1A according to the first embodiment. That is, the sensing system illumination system 300A and the sensing system light source 100A include the light emitting device 1A.

The sensing system illumination system 300A emits output light 90 from the light emitting device 1A in the sensing system light source 100A as irradiation light 120.

Note that the irradiation light 120 is light derived from the output light 90. In the sensing system illumination system 300A, the output light 90 is typically not emitted as it is, but is emitted as the irradiation light 120 after penetrating a transparent plate or the like. The characteristics of light may change between the output light 90 before penetrating a transparent plate or the like and the irradiation light 120 after penetrating a transparent plate or the like, and thus the irradiation light 120 and the output light 90 are separately described for convenience. Note that when there is no member or field that changes physical characteristics of light between the output light 90 and the irradiation light 120, the output light 90 and the irradiation light 120 are usually the same light.

(Spectral Camera)

The spectral camera 150 is, for example, a camera capable of acquiring image data 170 including four or more spectral images 160 having different wavelengths. The spectral camera 150 is not particularly limited as long as it is capable of acquiring image data 170 including four or more spectral images 160. As the spectral camera 150, a multispectral camera, a hyperspectral camera, or the like is used, for example. A spectral camera such as a multispectral camera, a hyperspectral camera, or the like is preferable because it is easy to obtain highly accurate vital information 200 by comparing fine differences among four or more spectral images 160. It is also preferable that the spectral camera 150 be a CMOS multispectral camera, a CMOS hyperspectral camera, or the like using an inexpensive CMOS image sensor because the sensing system 500A can be made low-cost.

For example, as illustrated in FIG. 8, the sensing system illumination system 300A irradiates a subject 110 with the irradiation light 120, and the spectral camera 150 photographs a photographing area 130 of the subject 110 to acquire the image data 170. The spectral camera 150 illustrated in FIG. 8 is an example of a CMOS hyperspectral camera capable of acquiring image data 170 including seven spectral images 160 (160a, 160b, 160c, 160d, 160e, 160f, 160g).

Figure 12:
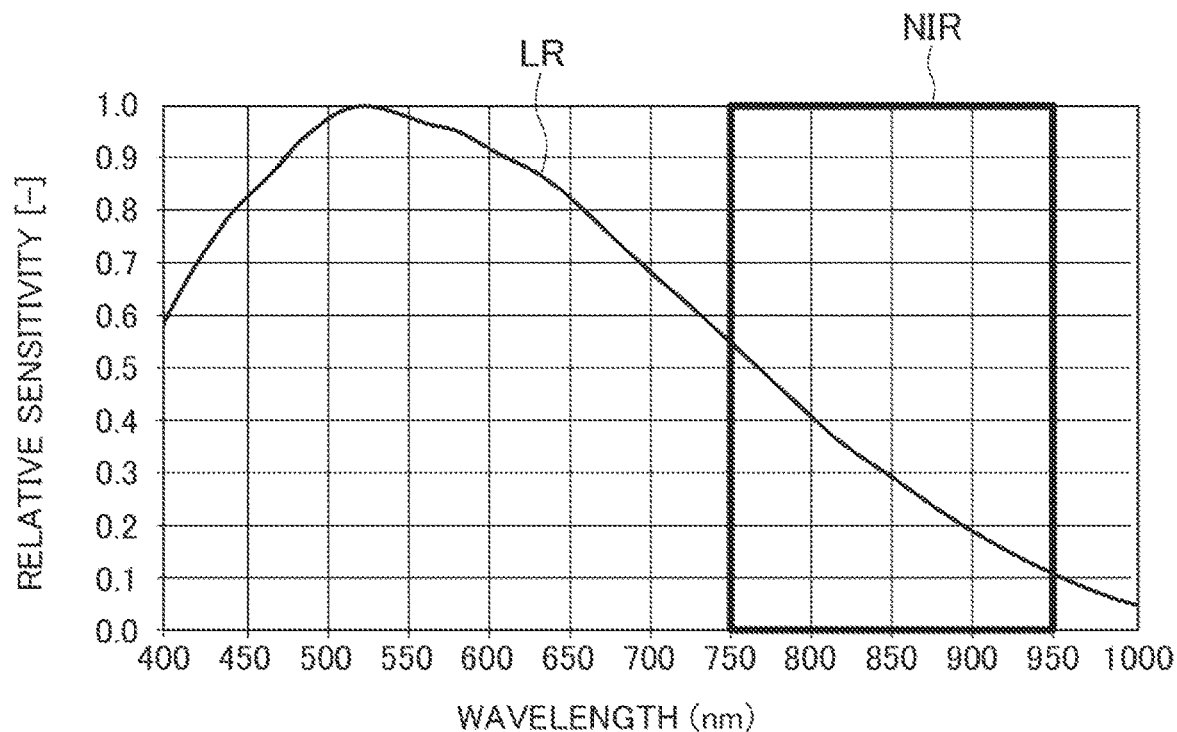
FIG. 12 is a graph illustrating an example of a light receiving sensitivity curve LR of a CMOS image sensor included in a general CMOS camera.
Figure 13:
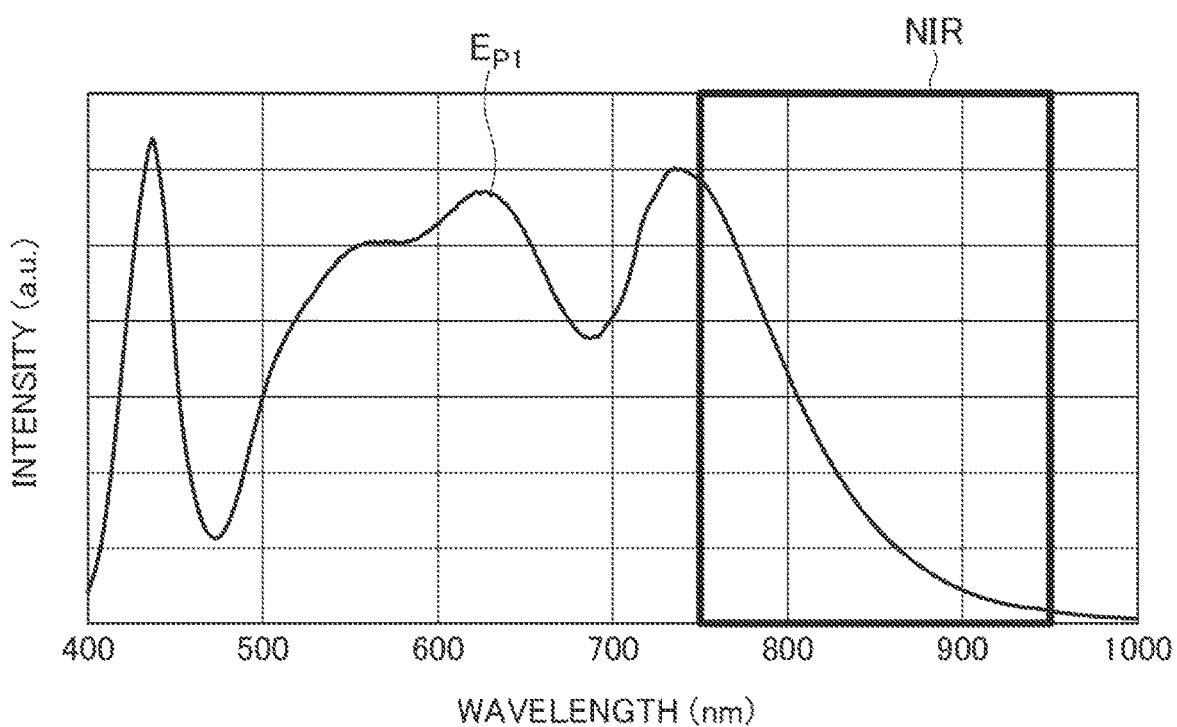
FIG. 13 is a graph illustrating an example of an emission spectrum of a solid-state light source using a conventional phosphor.
Figure 14:
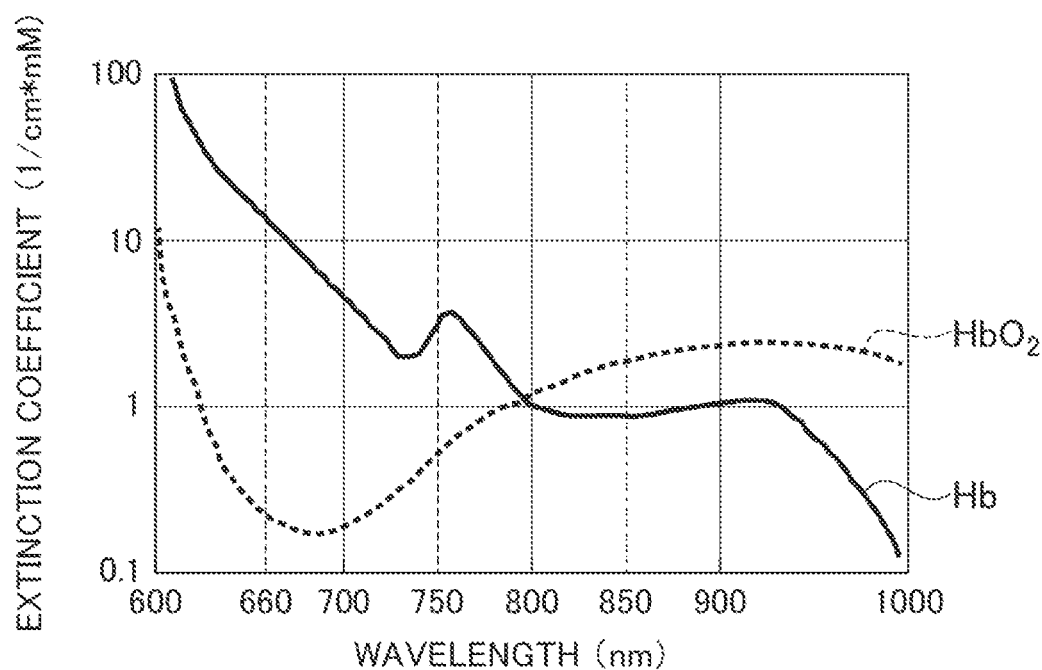
FIG. 14 is a diagram illustrating the relationship between wavelengths and extinction coefficients of oxyhemoglobin $HbO_2$ and deoxyhemoglobin Hb.

Note that when the CMOS image sensor used for the spectral camera 150 is an inexpensive one, as illustrated in FIG. 12, the light receiving sensitivity of the CMOS image sensor is likely to be low in the red to near-infrared range NIR of wavelengths of 750 nm or more and less than 900 nm. However, in the sensing system 500A, the light emitting device 1A included in the sensing system illumination system 300A emits light including first wavelength-converted light 7 that has the fluorescence peak $FP_1$ within a wavelength range of 750 nm or more and less than 900 nm and includes a large amount of near-infrared light. Specifically, the sensing system illumination system 300A emits the irradiation light 120 derived from the output light 90 including the first wavelength-converted light 7 toward the subject 110.

Thus, even when a spectral camera 150 using an inexpensive CMOS image sensor is used, the sensing system 500A can cover the shortcoming of the spectral camera 150. That is, even when an inexpensive spectral camera 150 including an inexpensive CMOS image sensor is used, the sensing system 500A can acquire high-quality image data 170 to obtain highly accurate vital information 200.

(Computer)

The computer 180 is a device capable of calculating vital information 200 based on image data 170 acquired from the spectral camera 150. Software including a vital data calculation algorithm capable of calculating vital information 200 based on image data 170 is installed in the computer 180. Also, the computer 180 usually includes a display unit 190 capable of displaying vital information 200, as illustrated in FIG. 12. In the sensing system 500A, the display unit 190 is included in the computer 180. However, as a modified example of the sensing system 500A, it is also possible to use a sensing system 500 where the display unit 190 is separate from the computer 180.

Software installed in the computer 180 calculates vital information 200 using a vital data calculation algorithm and image data 170. Examples of the vital information 200 include information on $SpO_2$, blood pressure, pulse waves, and blood vessels deep in a living body. FIG. 12 illustrates an example where the vital information 200 is a pulse wave.

The image data 170 includes seven spectral images 160a, 160b, 160c, 160d, 160e, 160f, and 160g, and thus the amount of information is larger than that obtained by a conventional RGB camera. Thus, in the sensing system 500A, it is possible to calculate highly accurate vital information 200 using image data 170 having a large amount of information.

(Action)

The action of the sensing system 500A will be described. As illustrated in FIG. 8, first, the irradiation light 120 is emitted from the sensing system illumination system 300A on the subject 110. The irradiation light 120 is light that is derived from the output light 90 including the first wavelength-converted light 7 and includes a large amount of a light component in the red to near-infrared range with the fluorescence peak $FP_1$ within a wavelength range of 750 nm or more and less than 900 nm.

Next, the spectral camera 150 photographs the photographing area 130 of the subject 110 on which the irradiation light 120 is emitted, and thus acquires the image data 170. Note that when the spectral camera 150 is an inexpensive spectral camera including an inexpensive CMOS image sensor, the light receiving sensitivity of the CMOS image sensor is likely to be low in the red to near-infrared range NIR of wavelengths of 750 to 950 nm.

However, in the sensing system 500A, the irradiation light 120 emitted from the sensing system illumination system 300A is light derived from the output light 90 including the first wavelength-converted light 7 and thus includes a large amount of a light component in the red to near-infrared range. Thus, in the sensing system 500A, even when the spectral camera 150 is an inexpensive spectral camera, it is possible to acquire high-quality image data 170 by using it in combination with the sensing system illumination system 300A.

In addition, the image data 170 obtained from the spectral camera 150 has a large amount of information, including seven spectral images 160a, 160b, 160c, 160d, 160e, 160f, and 160g. Thus, the sensing system 500A can acquire high-quality and information-rich image data 170.

Furthermore, the computer 180 acquires the image data 170 from the spectral camera 150 and calculates the vital information 200 based on the image data 170. The vital information 200 is calculated, for example, by inputting the seven spectral images 160a, 160b, 160c, 160d, 160e, 160f, and 160g included in the image data 170 to a vital data calculation algorithm in the computer 180. Since the computer 180 uses the high-quality and information-rich image data 170, it is possible to calculate vital information 200 having high accuracy. The calculated vital information 200 is displayed on the display unit 190 of the computer 180.

(Effect)

In the sensing system 500A, the sensing system light source 100A and the sensing system illumination system 300A include the light emitting device 1A. Thus, the sensing system light source 100A can provide a sensing system light source having a high fluorescence intensity in the red to near-infrared range NIR of wavelengths of 750 to 950 nm. The sensing system illumination system 300A can provide a sensing system illumination system having a high fluorescence intensity in the red to near-infrared range NIR of wavelengths of 750 to 950 nm.

The sensing system light source 100A and the sensing system illumination system 300A of the sensing system 500A include the light emitting device 1A and thus have a high fluorescence intensity in the red to near-infrared range NIR of wavelengths of 750 to 950 nm. Hence, with the sensing system 500A, even when the spectral camera 150 is an inexpensive spectral camera, high-quality image data 170 can be acquired, and thus it is possible to calculate highly accurate vital information 200.

Modified Example of First Embodiment

As a modified example of the sensing system 500A according to the first embodiment, the sensing system 500 can include the light emitting device 1E instead of the light emitting device 1A. The light emitting device 1E differs from the light emitting device 1A in that the light guiding member 15 is arranged between the solid-state light source 2 and the wavelength converter 3E. According to the modified example of the sensing system 500A, even when the solid-state light source 2 and the wavelength converter 3E in the light emitting device 1E are arranged spaced apart, it becomes possible to efficiently guide the primary light 6 to the wavelength converter 3E.

(Action)

The action of the modified example of the sensing system 500A is the same as that of the sensing system 500A except that it becomes possible to efficiently guide the primary light 6 to the wavelength converter 3E even when the solid-state light source 2 and the wavelength converter 3E in the light emitting device 1E are arranged spaced apart. Thus, the description of the action of the modified example of the sensing system 500A will be omitted.

(Effect)

The effect of the modified example of the sensing system 500A is the same as that of the sensing system 500A except that it becomes possible to efficiently guide the primary light 6 to the wavelength converter 3E even when the solid-state light source 2 and the wavelength converter 3E in the light emitting device 1E are arranged spaced apart.

Second Embodiment

The sensing system 500B (500) according to the second embodiment will be described. The sensing system 500B according to the second embodiment, which is illustrated in FIG. 9, includes the sensing system illumination system 300B, the spectral camera 150, and the computer 180.

The sensing system 500B according to the second embodiment uses the sensing system illumination system 300B instead of the sensing system illumination system 300A in the sensing system 500A according to the first embodiment. Thus, the sensing system 500B has the same configuration as that of the sensing system 500A except for the sensing system illumination system 300B. Hereinafter, the same components of the sensing system 500B and the sensing system 500A are denoted by the same reference signs, and the description of configurations and operations thereof will be omitted.

(Sensing System Illumination System)

The sensing system illumination system 300B uses the light emitting device 1B instead of the light emitting device 1A of the sensing system illumination system 300A. Specifically, the light emitting device 1B uses the wavelength converter 3B instead of the wavelength converter 3A of the light emitting device 1A. In contrast to the wavelength converter 3A, the wavelength converter 3B further includes the second phosphor 8. Configurations and differences of the light emitting devices 1A and 1B, and those of the wavelength converters 3A and 3B have been described above. Thus, description of the configuration of the sensing system illumination system 300B will be omitted.

(Action)

The action of the sensing system 500B will be described. As illustrated in FIG. 9, first, the irradiation light 120 is emitted from the sensing system illumination system 300B on a subject 110. The irradiation light 120 is light derived from output light 90 including first wavelength-converted light 7 and second wavelength-converted light 9, and includes a large amount of a light component in the red to near-infrared range having the fluorescence peak $FP_1$ within a wavelength range of 750 nm or more and less than 900 nm.

Next, the spectral camera 150 photographs the photographing area 130 of the subject 110 on which the irradiation light 120 is emitted, and thus acquires the image data 170. Note that when the spectral camera 150 is an inexpensive spectral camera including an inexpensive CMOS image sensor, the light receiving sensitivity of the CMOS image sensor is likely to be low in the red to near-infrared range NIR of wavelengths of 750 to 950 nm.

However, in the sensing system 500B, the irradiation light 120 emitted from the sensing system illumination system 300B is light derived from the output light 90 including the first wavelength-converted light 7 and the second wavelength-converted light 9 and thus includes a large amount of a light component in the red to near-infrared range. Thus, in the sensing system 500B, even when the spectral camera 150 is an inexpensive spectral camera, it is possible to acquire high-quality image data 170 by using it in combination with the sensing system illumination system 300B.

Since the action of the sensing system 500B after acquiring the image data 170 is the same as that of the sensing system 500A after acquiring the image data 170, the description will be omitted.
(Effect)

In the sensing system 500B, the sensing system light source 100B and the sensing system illumination system 300B include the light emitting device 1B. Thus, the sensing system light source 100B can provide a sensing system light source having a high fluorescence intensity in the red to near-infrared range NIR of wavelengths of 750 to 950 nm. The sensing system light source 100B and the sensing system illumination system 300B can provide a sensing system light source and a sensing system illumination system having a high fluorescence intensity in the red to near-infrared range NIR of wavelengths of 750 to 950 nm.

The sensing system light source 100B and the sensing system illumination system 300B of the sensing system 500B include the light emitting device 1B and thus have a high fluorescence intensity in the red to near-infrared range NIR of wavelengths of 750 to 950 nm. Hence, with the sensing system 500B, even when the spectral camera 150 is an inexpensive spectral camera, high-quality image data 170 can be acquired, and thus it is possible to calculate highly accurate vital information 200.

Furthermore, the wavelength converter 3B of the light emitting device 1B further includes the second phosphor 8. Thus, with the sensing system light source 100B, the sensing system illumination system 300B, and the sensing system 500B, it becomes possible to easily adjust the spectral distribution of the output light according to the application.

Modified Example of Second Embodiment

As a modified example of the sensing system 500B according to the second embodiment, the sensing system 500 can include the light emitting device 1F instead of the light emitting device 1B. The light emitting device 1F differs from the light emitting device 1B in that a light guiding member 15 is arranged between the solid-state light source 2 and the wavelength converter 3F. According to the modified example of the sensing system 500B, even when the solid-state light source 2 and the wavelength converter 3F in the light emitting device 1F are arranged spaced apart, it becomes possible to efficiently guide the primary light 6 to the wavelength converter 3F.
(Action)

The action of the modified example of the sensing system 500B is the same as that of the sensing system 500B except that it becomes possible to efficiently guide the primary light 6 to the wavelength converter 3F even when the solid-state light source 2 and the wavelength converter 3F in the light emitting device 1F are arranged spaced apart.
(Effect)

The effect of the modified example of the sensing system 500B is the same as that of the sensing system 500B except that it becomes possible to efficiently guide the primary light 6 to the wavelength converter 3F even when the solid-state light source 2 and the wavelength converter 3F in the light emitting device 1F are arranged spaced apart.

Third Embodiment

The sensing system 500C (500) according to the third embodiment will be described. The sensing system 500C according to the third embodiment illustrated in FIG. 10 includes the sensing system illumination system 300C, the spectral camera 150, and the computer 180.

The sensing system 500C according to the third embodiment uses the sensing system illumination system 300C instead of the sensing system illumination system 300A in the sensing system 500A according to the first embodiment. Thus, the sensing system 500C has the same configuration as that of the sensing system 500A except for the sensing system illumination system 300C. Hereinafter, the same components of the sensing system 500C and the sensing system 500A are denoted by the same reference signs, and the description of configurations and operations thereof will be omitted.
(Sensing System Illumination System)

The sensing system illumination system 300C uses the light emitting device 1C instead of the light emitting device 1A of the sensing system illumination system 300A. Specifically, the light emitting device 1C is a light emitting device that includes the near-infrared light emitting device 10C which is a light emitting device emitting near infrared light, and the white light emitting device 30C which is a light emitting device emitting white light 70. The configuration and the difference between the light emitting device 1A and the light emitting device 1C have been described above. Thus, the description of the configuration of the sensing system illumination system 300C will be omitted.
(Action)

The action of the sensing system 500C will be described. As illustrated in FIG. 10, first, the irradiation light 120 is emitted from the sensing system illumination system 300C on a subject 110. When the near-infrared light emitting device 10C and the white light emitting device 30C are operated together, the irradiation light 120 is light derived from output light 90 that includes: first wavelength-converted light 7 which has a fluorescence peak $FP_1$ within a range of 750 nm or more and less than 900 nm; and white light 70 which is second wavelength-converted light 9. When only the near-infrared light emitting device 10C is operated, the irradiation light 120 is light derived from output light 90 including the first wavelength-converted light 7. When only the white light emitting device 30C is operated, the irradiation light 120 is light derived from output light 90 including white light 70 which is the second wavelength-converted light 9.

Next, the spectral camera 150 photographs the photographing area 130 of the subject 110 on which the irradiation light 120 is emitted, and thus acquires the image data 170. Note that when the spectral camera 150 is an inexpensive spectral camera including an inexpensive CMOS image sensor, the light receiving sensitivity of the CMOS image sensor is likely to be low in the red to near-infrared range NIR of wavelengths of 750 to 950 nm.

However, when at least the near-infrared light emitting device 10C is operated, the emitted irradiation light 120 is at least light derived from output light 90 that includes first wavelength-converted light 7 having a fluorescence peak $FP_1$ within a range of 750 nm or more and less than 900 nm. Thus, the output light 90 includes a large amount of the light component in the red to near-infrared range. Hence, in the sensing system 500C, even when the spectral camera 150 is an inexpensive spectral camera, it is possible to acquire high-quality image data 170 by using it in combination with the sensing system illumination system 300C.

Since the action of the sensing system 500C after acquiring the image data 170 is the same as that of the sensing system 500A after acquiring the image data 170, the description will be omitted.

(Effect)

In the sensing system 500C, the sensing system light source 100C and the sensing system illumination system 300C include the light emitting device 1C. Thus, the sensing system light source 100C can provide a sensing system light source having a high fluorescence intensity in the red to near-infrared range NIR of wavelengths of 750 to 950 nm. The sensing system illumination system 300C can provide a sensing system illumination system having a high fluorescence intensity in the red to near-infrared range NIR of wavelengths of 750 to 950 nm.

The sensing system light source 100C and the sensing system illumination system 300C of the sensing system 500C include the light emitting device 1C and thus can increase the fluorescence intensity in the red to near-infrared range NIR of wavelengths of 750 to 950 nm. Hence, with the sensing system 500C, even when the spectral camera 150 is an inexpensive spectral camera, high-quality image data 170 can be acquired, and thus it is possible to calculate highly accurate vital information 200.

Furthermore, the white light wavelength converter 33C of the white light emitting device 30C of the light emitting device 1C further includes the second phosphor 8 emitting white light 70. Thus, with the sensing system light source 100C, the sensing system illumination system 300B, and the sensing system 500B, it becomes possible to easily adjust the spectral distribution of the output light according to the application.

Modified Example of Third Embodiment

As a modified example of the sensing system 500C according to the third embodiment, the sensing system 500 may include the light emitting device 1G instead of the light emitting device 1C. The light emitting device 1G differs from the light emitting device 1C in that the light guiding member 15 is arranged between the solid-state light source 2 and the wavelength converter 3G and that the light guiding member 15 is arranged between the solid-state light source 2 and the white light wavelength converter 33G. According to the modified example of the sensing system 500C, it becomes possible to efficiently guide the primary light 6 even when the solid-state light source 2 and the wavelength converter 3G are arranged spaced apart and the solid-state light source 2 and the white light wavelength converter 33G are arranged spaced apart in the light emitting device 1G. That is, the primary light 6 can be efficiently guided to the wavelength converter 3G and the white light wavelength converter 33G.

(Action)

The action of the modified example of the sensing system 500C is that it becomes possible to efficiently guide the primary light 6 to the wavelength converter 3G even when the solid-state light source 2 and the wavelength converter 3G are arranged spaced apart and the solid-state light source 2 and the white light wavelength converter 33G are arranged spaced apart in the light emitting device 1G. Other actions are the same as those of the sensing system 500C.

(Effect)

The effect of the modified example of the sensing system 500C is that the primary light 6 can be efficiently guided to the wavelength converter 3G even when the solid-state light source 2 and the wavelength converter 3G are arranged spaced apart in the light emitting device 1G. Other effects are the same as those of the sensing system 500C.

Fourth Embodiment

The sensing system 500D (500) according to the fourth embodiment will be described. The sensing system 500D according to the fourth embodiment illustrated in FIG. 11 includes the sensing system illumination system 300D, the spectral camera 150, and the computer 180.

The sensing system 500D according to the fourth embodiment uses the sensing system illumination system 300D instead of the sensing system illumination system 300A in the sensing system 500A according to the first embodiment. Thus, the sensing system 500D has the same configuration as that of the sensing system 500A except for the sensing system illumination system 300D. Hereinafter, the same components of the sensing system 500D and the sensing system 500A are denoted by the same reference signs, and the description of configurations and operations thereof will be omitted.

(Sensing System Illumination System)

The sensing system illumination system 300D uses the light emitting device 1D instead of the light emitting device 1A of the sensing system illumination system 300A. Specifically, the light emitting device 1D is a light emitting device that includes the near-infrared light emitting device 10D which is a light emitting device emitting near infrared light, and the white light source 35 which emits white light 70. The configuration and the difference between the light emitting device 1A and the light emitting device 1D have been described above. Thus, the description of the configuration of the sensing system illumination system 300D will be omitted.

(Action)

The action of the sensing system 500D will be described. As illustrated in FIG. 11, first, the irradiation light 120 is emitted from the sensing system illumination system 300D on a subject 110. When the near-infrared light emitting device 10D and the white light source 35 are operated together, the irradiation light 120 is light derived from output light 90 that includes; first wavelength-converted light 7 which has a fluorescence peak $FP_1$ within a range of 750 nm or more and less than 900 nm; and white light 70 which is second wavelength-converted light 9. When only the near-infrared light emitting device 10D is operated, the irradiation light 120 is light derived from output light 90 including the first wavelength-converted light 7. When only the white light source 35 is operated, the irradiation light 120 is light derived from output light 90 including white light 70 which is second wavelength-converted light 9.

Next, the spectral camera 150 photographs the photographing area 130 of the subject 110 on which the irradiation light 120 is emitted, and thus acquires the image data 170. Note that when the spectral camera 150 is an inexpensive spectral camera including an inexpensive CMOS image sensor, the light receiving sensitivity of the CMOS image sensor is likely to be low in the red to near-infrared range NIR of wavelengths of 750 to 950 nm.

However, when at least the near-infrared light emitting device 10C is operated, the emitted irradiation light 120 is at least light derived from output light 90 that includes first wavelength-converted light 7 having a fluorescence peak $FP_1$ within a range of 750 nm or more and less than 900 nm. Thus, the output light 90 includes a large amount of the light component in the red to near-infrared range. Hence, in the sensing system 500D, even when the spectral camera 150 is an inexpensive spectral camera, it is possible to acquire high-quality image data 170 by using it in combination with the sensing system illumination system 300D.

Since the action of the sensing system 500D after acquiring the image data 170 is the same as that of the sensing system 500A after acquiring the image data 170, the description will be omitted.

(Effect)

In the sensing system 500D, the sensing system light source 100D and the sensing system illumination system 300D include the light emitting device 1D. Thus, the sensing system light source 100D can provide a sensing system light source having a high fluorescence intensity in the red to near-infrared range NIR of wavelengths of 750 to 950 nm. The sensing system illumination system 300D can provide a sensing system illumination system having a high fluorescence intensity in the red to near-infrared range NIR of wavelengths of 750 to 950 nm.

The sensing system light source 100D and the sensing system illumination system 300D of the sensing system 500D include the light emitting device 1D and thus can increase the fluorescence intensity in the red to near-infrared range NIR of wavelengths of 750 to 950 nm. Hence, with the sensing system 500D, even when the spectral camera 150 is an inexpensive spectral camera, high-quality image data 170 can be acquired, and thus it is possible to calculate highly accurate vital information 200.

Furthermore, the light emitting device 1D further includes the white light source 35. Thus, with the sensing system light source 100D, the sensing system illumination system 300B, and the sensing system 500B, it becomes possible to easily adjust the spectral distribution of the output light according to the application.

EXAMPLES

Light emitting devices according to the above embodiments will be described in more detail below with examples and comparative examples, but the embodiments are not limited to these examples.

In the following examples and comparative examples, the following compound powders were used as raw materials.

Gadolinium oxide ($Gd_2O_3$): purity 4N, manufactured by Nippon Yttrium Co., Ltd.

Lanthanum hydroxide ($La(OH)_3$): purity 3N, manufactured by Shin-Etsu Chemical Co., Ltd.

Gallium oxide ($Ga_2O_3$): purity 4N, manufactured by Nippon Rare Metal, Inc.

Scandium oxide ($Sc_2O_3$): purity 4N, manufactured by Shin-Etsu Chemical Co., Ltd.

Chromium oxide ($Cr_2O_3$): purity 3N, manufactured by Kojundo Chemical Lab. Co., Ltd.

Calcium carbonate ($CaCO_3$): purity 3N, manufactured by Kojundo Chemical Lab. Co., Ltd.

Strontium carbonate ($SrCO_3$): purity 3N, manufactured by Kojundo Chemical Lab. Co., Ltd.

Silicon oxide ($SiO_2$): purity 3N, manufactured by Kojundo Chemical Lab. Co., Ltd.

Germanium oxide ($GeO_2$): purity 3N, manufactured by Kojundo Chemical Lab. Co., Ltd.

Example 1

(Preparation of Phosphor)

An oxide phosphor was synthesized using a preparation procedure using a solid-state reaction. Specifically, an oxide phosphor represented by the composition formula of $(Gd_2Ca)Ga_{1.94}Cr_{0.06}(Ga_2Si)O_{12}$ was synthesized.

First, the above raw materials were weighed to give the compound $(Gd_2Ca)Ga_{1.94}Cr_{0.06}(Ga_2Si)O_{12}$ of a stoichiometric composition. Then, dry mixing was performed using a mortar and pestle, and a raw material for calcination was obtained.

The above calcination raw material was moved to an alumina crucible having a lid and was calcined for 2 hours in a CO atmosphere at 1400° C. using a box-type electric furnace, and then the calcined material was lightly cracked to obtain a phosphor of example 1 (sample No. A1). Note that the sample after calcination was confirmed to be $(Gd_2Ca)Ga_{1.94}Cr_{0.06}(Ga_2Si)O_{12}$ using an X-ray diffraction method.

Figure 41:
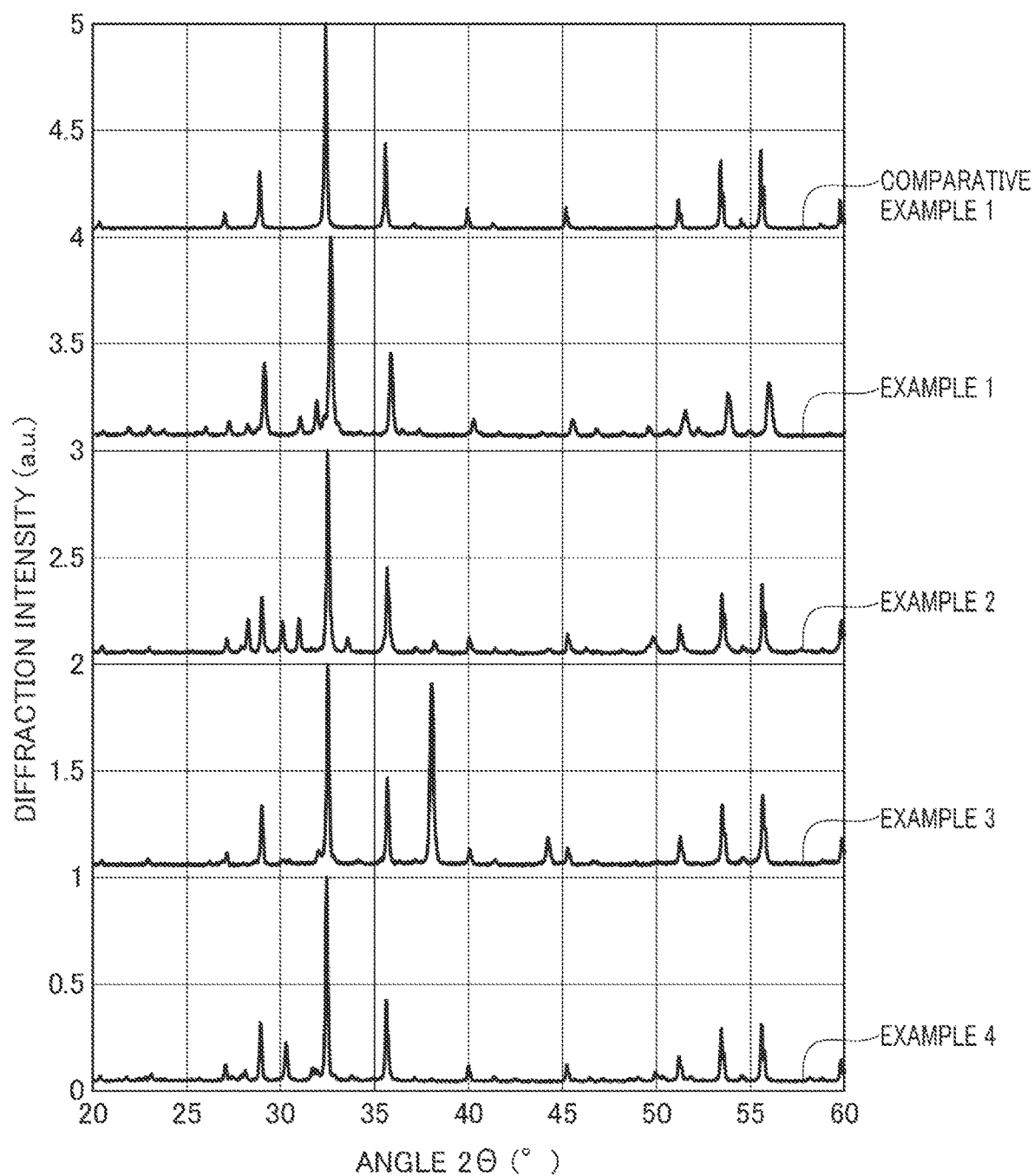
FIG. 41 is a diagram illustrating X-ray diffraction results of comparative example 1, and examples 1 to 4.
Figure 42:
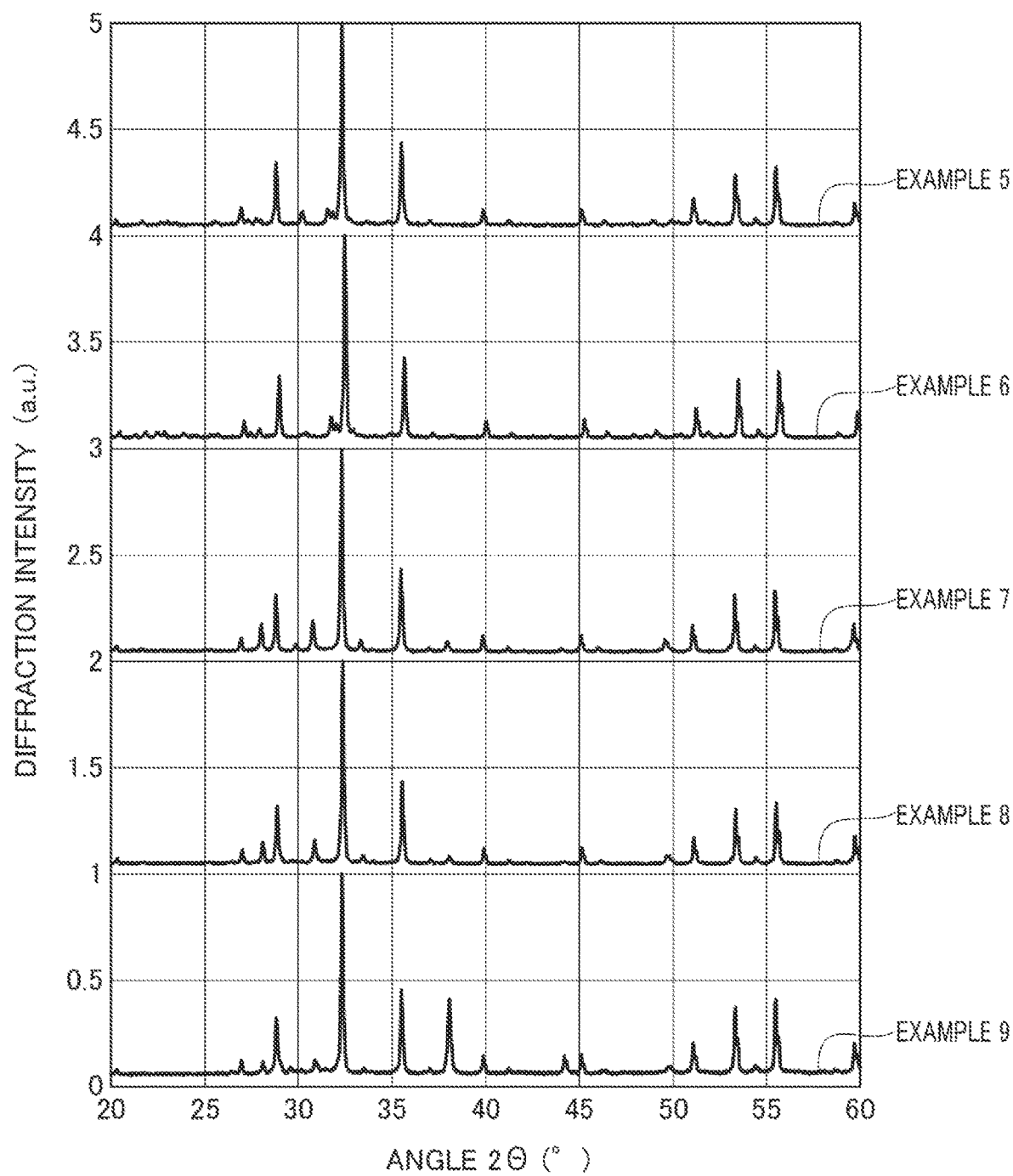
FIG. 42 is a diagram illustrating X-ray diffraction results of examples 5 to 9.
Figure 43:
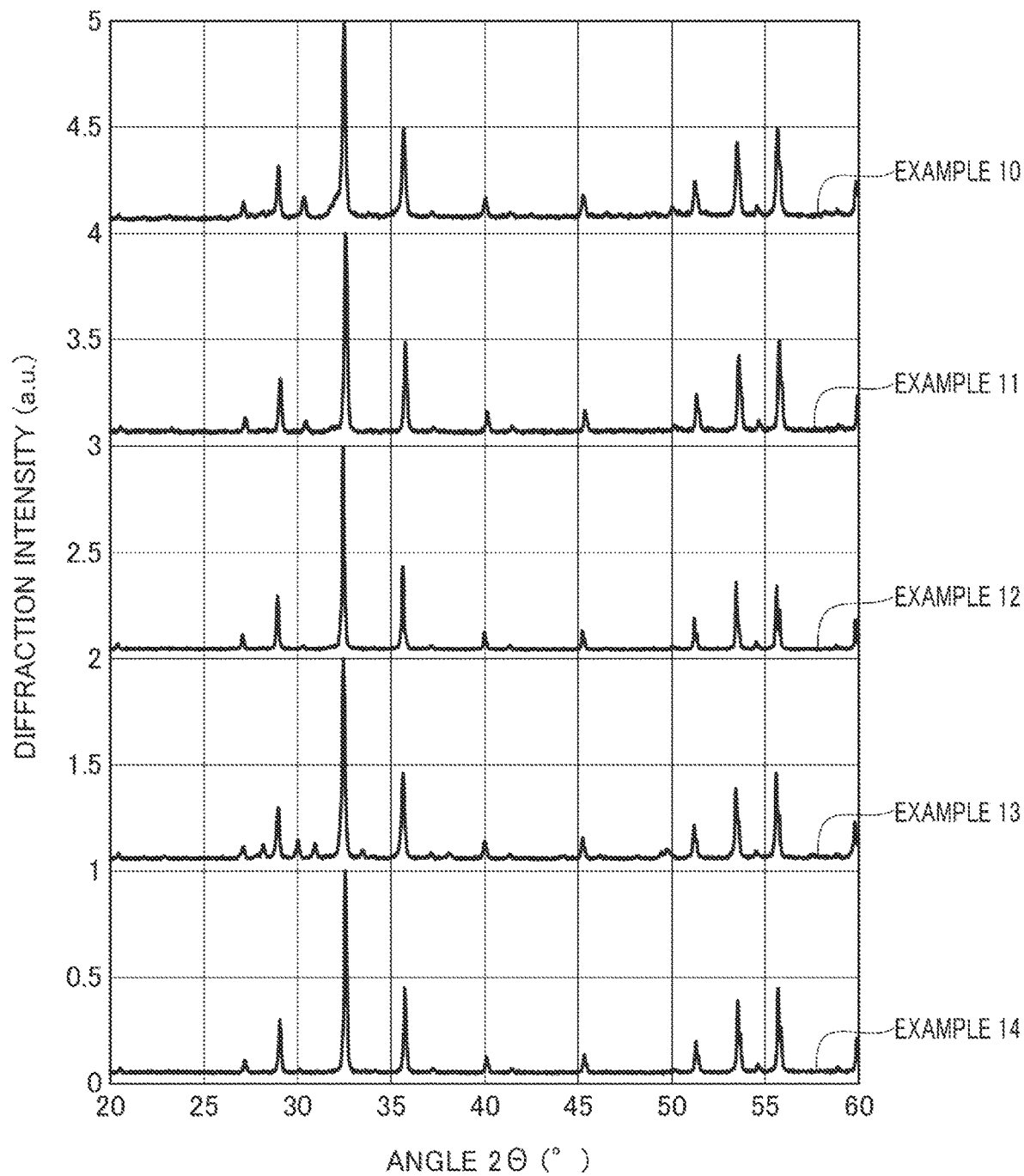
FIG. 43 is a diagram illustrating X-ray diffraction results of examples 10 to 14.
Figure 44:
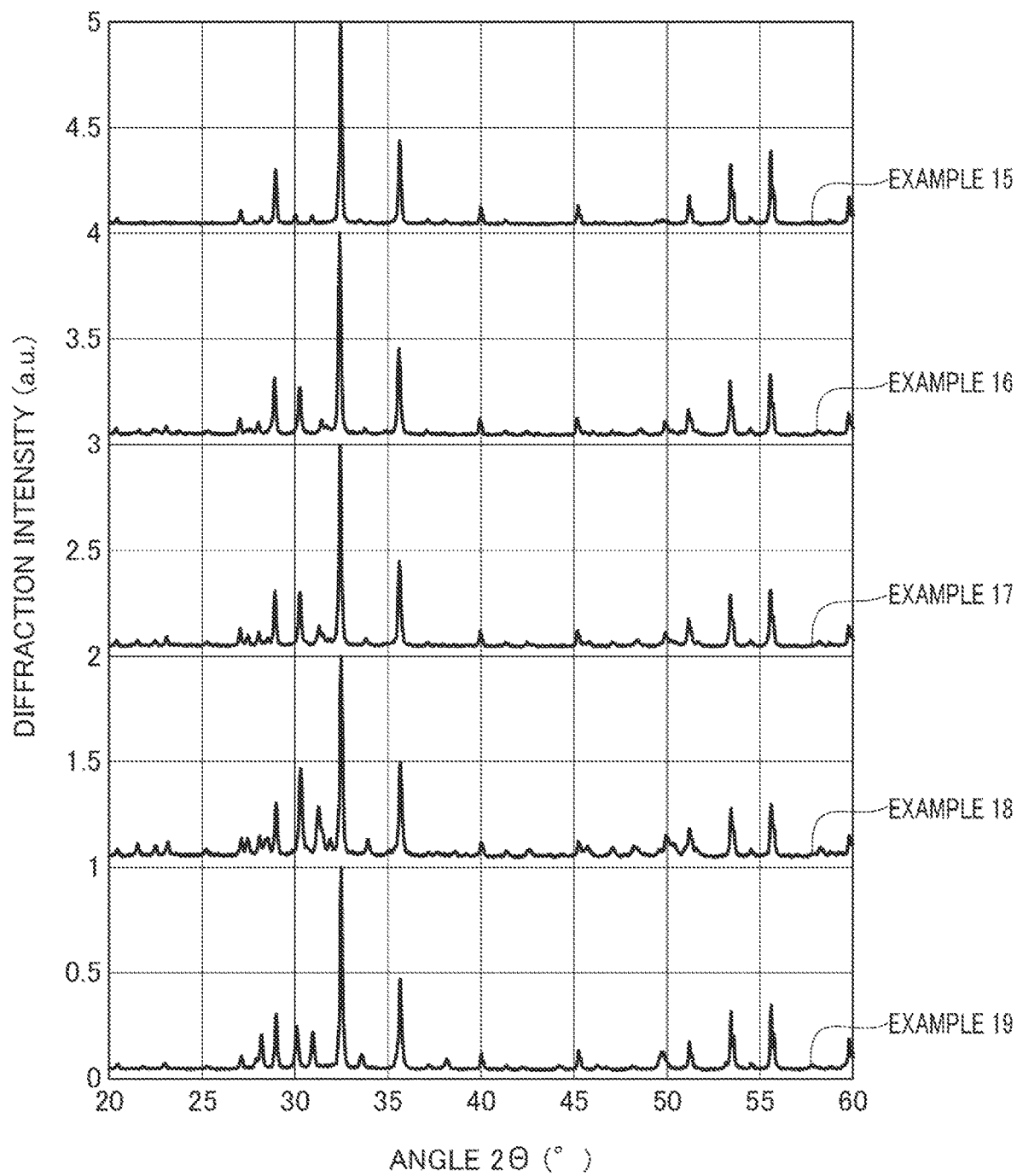
FIG. 44 is a diagram illustrating X-ray diffraction results of examples 15 to 19.
Figure 45:
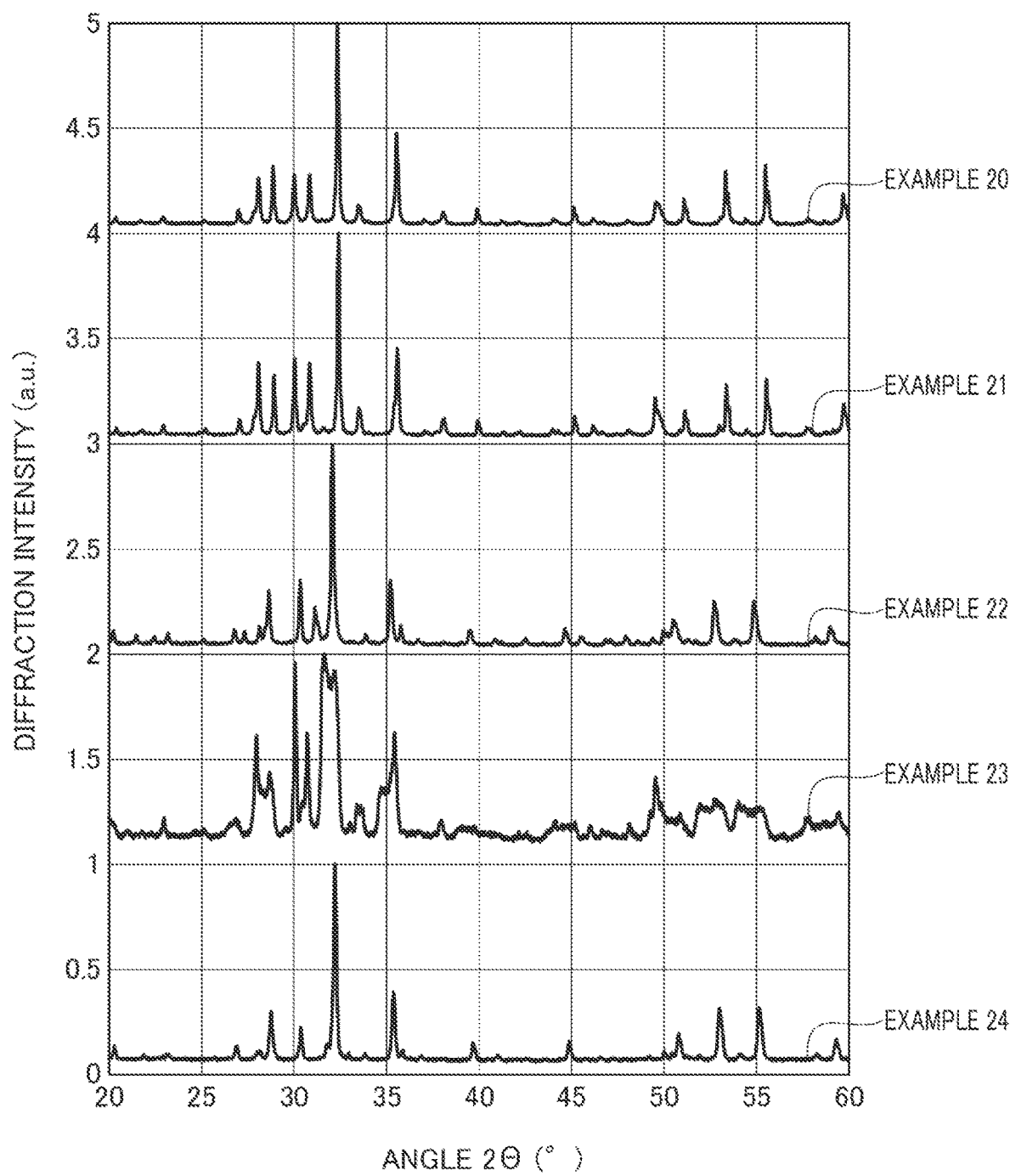
FIG. 45 is a diagram illustrating X-ray diffraction results of examples 20 to 24.
Figure 46:
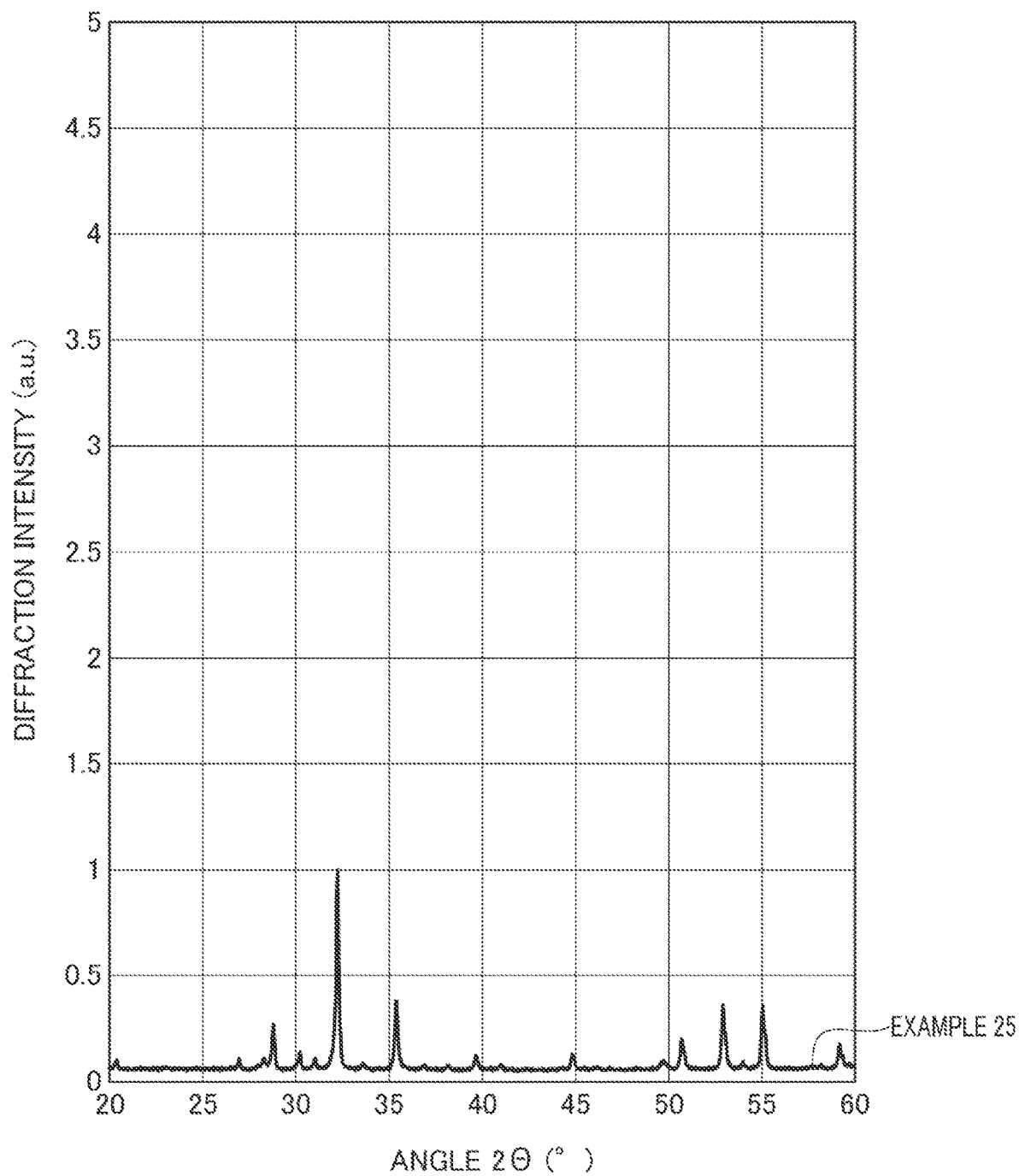
FIG. 46 is a diagram illustrating an X-ray diffraction result of example 25.

Table 1 shows manufacturing conditions and composition formulae of oxide phosphors. Table 2 details compositions of the oxide phosphors. FIG. 41 illustrates the results of X-ray diffraction.

Note that the oxide phosphor $(Gd_2Ca)Ga_{1.94}Cr_{0.06}(Ga_2Si)O_{12}$ of sample No. A1 corresponds to the oxide phosphor $Gd_3Ga_{1.94}Cr_{0.06}Ga_3O_{12}$ of sample No. B1 of comparative example 1, which is a reference material, with some of the elements replaced by Ca and Si. Thus, "Ca—Si" is noted in the remarks column of sample No. A1.

TABLE 1

| Example No. | Sample No. | Calcination condition Atmosphere | Temperature (° C.) | Composition formula | Remarks |
| --- | --- | --- | --- | --- | --- |
| Com. Ex. 1 | B1 | Air | 1550 | $Gd_3Ga_{1.94}Cr_{0.06}Ga_3O_{12}$ | Reference material |
| Example 1 | A1 | CO | 1400 | $(Gd_2Ca)Ga_{1.94}Cr_{0.06}(Ga_2Si)O_{12}$ | Ca—Si |
| Example 2 | A2 | Air | 1400 | $(Gd_2Sr)Ga_{1.94}Cr_{0.06}(Ga_2Ge)O_{12}$ | Sr—Ge |
| Example 3 | A3 | CO | 1400 | $(Gd_2Ca)Ga_{1.94}Cr_{0.06}(Ga_2Ge)O_{12}$ | Ca—Ge |
| Example 4 | A4 | Air | 1300 | $(Gd_2Sr)Ga_{1.94}Cr_{0.06}(Ga_2Si)O_{12}$ | Sr—Si |
| Example 5 | A5 | Air | 1300 | $(Gd_{2.25}Sr_{0.75})Ga_{1.94}Cr_{0.06}(Ga_2Si)O_{12}$ | $Sr_{0.75}$—Si |
| Example 6 | A6 | Air | 1300 | $(Gd_{2.50}Sr_{0.50})Ga_{1.94}Cr_{0.06}(Ga_2Si)O_{12}$ | $Sr_{0.50}$—Si |
| Example 7 | A7 | Air | 1300 | $(Gd_{2.25}Sr_{0.75})Ga_{1.94}Cr_{0.06}(Ga_2Ge)O_{12}$ | $Sr_{0.75}$—Ge |
| Example 8 | A8 | Air | 1300 | $(Gd_{2.50}Sr_{0.50})Ga_{1.94}Cr_{0.06}(Ga_2Ge)O_{12}$ | $Sr_{0.50}$—Ge |
| Example 9 | A9 | Air | 1300 | $(Gd_{2.75}Sr_{0.25})Ga_{1.94}Cr_{0.06}(Ga_2Ge)O_{12}$ | $Sr_{0.25}$—Ge |
| Example 10 | A10 | Air | 1300 | $(Gd_{2.25}Sr_{0.75})Ga_{1.94}Cr_{0.06}(Ga_{2.25}Si_{0.75})O_{12}$ | $Sr_{0.75}$—$Si_{0.75}$ |
| Example 11 | A11 | Air | 1300 | $(Gd_{2.50}Sr_{0.50})Ga_{1.94}Cr_{0.06}(Ga_{2.50}Si_{0.50})O_{12}$ | $Sr_{0.50}$—$Si_{0.50}$ |
| Example 12 | A12 | Air | 1300 | $(Gd_{2.75}Sr_{0.25})Ga_{1.94}Cr_{0.06}(Ga_{2.75}Si_{0.25})O_{12}$ | $Sr_{0.25}$—$Si_{0.25}$ |
| Example 13 | A13 | Air | 1300 | $(Gd_{2.25}Sr_{0.75})Ga_{1.94}Cr_{0.06}(Ga_{2.25}Ge_{0.75})O_{12}$ | $Sr_{0.75}$—$Ge_{0.75}$ |
| Example 14 | A14 | Air | 1300 | $(Gd_{2.50}Sr_{0.50})Ga_{1.94}Cr_{0.06}(Ga_{2.50}Ge_{0.50})O_{12}$ | $Sr_{0.50}$—$Ge_{0.50}$ |
| Example 15 | A15 | Air | 1300 | $(Gd_{2.75}Sr_{0.25})Ga_{1.94}Cr_{0.06}(Ga_{2.75}Ge_{0.25})O_{12}$ | $Sr_{0.25}$—$Ge_{0.25}$ |
| Example 16 | A16 | Air | 1300 | $(Gd_{1.85}La_{0.15}Sr)Ga_{1.94}Cr_{0.06}(Ga_2Si)O_{12}$ | La5%—Sr—Si |
| Example 17 | A17 | Air | 1300 | $(Gd_{1.70}La_{0.30}Sr)Ga_{1.94}Cr_{0.06}(Ga_2Si)O_{12}$ | La10%—Sr—Si |
| Example 18 | A18 | Air | 1400 | $(Gd_{1.40}La_{0.60}Sr)Ga_{1.94}Cr_{0.06}(Ga_2Si)O_{12}$ | La20%—Sr—Si |
| Example 19 | A19 | Air | 1400 | $(Gd_{1.85}La_{0.15}Sr)Ga_{1.94}Cr_{0.06}(Ga_2Ge)O_{12}$ | La5%—Sr—Ge |

TABLE 1-continued

| Example No. | Sample No. | Calcination condition Atmosphere | Temperature (° C.) | Composition formula | Remarks |
|---|---|---|---|---|---|
| Example 20 | A20 | Air | 1400 | $(Gd_{1.70}La_{0.30}Sr)Ga_{1.94}Cr_{0.06}(Ga_2Ge)O_{12}$ | La10%—Sr—Ge |
| Example 21 | A21 | Air | 1300 | $(Gd_{1.40}La_{0.60}Sr)Ga_{1.94}Cr_{0.06}(Ga_2Ge)O_{12}$ | La20%—Sr—Ge |
| Example 22 | A22 | Air | 1300 | $(Gd_{1.25}La_{0.75}Sr)(Ga_{0.97}Sc_{0.97})Cr_{0.06}(Ga_2Si)O_{12}$ | La25%—Sc50%—Sr—Si |
| Example 23 | A23 | Air | 1300 | $(Gd_{1.25}La_{0.75}Sr)(Ga_{0.97}Sc_{0.97})Cr_{0.06}(Ga_2Ge)O_{12}$ | La25%—Sc50%—Sr—Ge |
| Example 24 | A24 | Air | 1300 | $(Gd_2Sr)(Ga_{0.97}Sc_{0.97})Cr_{0.06}(Ga_2Si)O_{12}$ | Sc50%—Sr—Si |
| Example 25 | A25 | Air | 1400 | $(Gd_2Sr)(Ga_{0.97}Sc_{0.97})Cr_{0.06}(Ga_2Ge)O_{12}$ | Sc50%—Sr—Ge |

TABLE 2

Composition $(Gd_{1-x-y}, Ln_y, M^{II}_x)_3 M^{III}_{1.94} Cr_{0.06}(Ga_{1-z}, M^{IV}_z)_3 O_{12}$

| | | | A-site | | | | B-site | | C-site | | |
|---|---|---|---|---|---|---|---|---|---|---|---|
| | | | | Ln | $M^{II}$ | | $M^{III}$ | | $M^{IV}$ | | |
| Example No. | Sample No. | Composition formula | Gd $3(1-x-y)$ | La $3y$ | Ca $3x$ | Sr $3x$ | Ga | Sc | Ga $3(1-z)$ | Si $3z$ | Ge $3z$ |
| Com. Ex. 1 | B1 | $Gd_3Ga_{1.94}Cr_{0.06}Ga_3O_{12}$ | 3.00 | — | — | — | 1.94 | — | — | — | — |
| Example 1 | A1 | $(Gd_2Ca)Ga_{1.94}Cr_{0.06}(Ga_2Si)O_{12}$ | 2.00 | — | 1.00 | — | 1.94 | — | 2.00 | 1.00 | — |
| Example 2 | A2 | $(Gd_2Sr)Ga_{1.94}Cr_{0.06}(Ga_2Ge)O_{12}$ | 2.00 | — | — | 1.00 | 1.94 | — | 2.00 | — | 1.00 |
| Example 3 | A3 | $(Gd_2Ca)Ga_{1.94}Cr_{0.06}(Ga_2Ge)O_{12}$ | 2.00 | — | 1.00 | — | 1.94 | — | 2.00 | — | 1.00 |
| Example 4 | A4 | $(Gd_2Sr)Ga_{1.94}Cr_{0.06}(Ga_2Si)O_{12}$ | 2.00 | — | — | 1.00 | 1.94 | — | 2.00 | 1.00 | — |
| Example 5 | A5 | $(Gd_{2.25}Sr_{0.75})Ga_{1.94}Cr_{0.06}(Ga_2Si)O_{12}$ | 2.25 | — | — | 0.75 | 1.94 | — | 2.00 | 1.00 | — |
| Example 6 | A6 | $(Gd_{2.50}Sr_{0.50})Ga_{1.94}Cr_{0.06}(Ga_2Si)O_{12}$ | 2.50 | — | — | 0.50 | 1.94 | — | 2.00 | 1.00 | — |
| Example 7 | A7 | $(Gd_{2.25}Sr_{0.75})Ga_{1.94}Cr_{0.06}(Ga_2Ge)O_{12}$ | 2.25 | — | — | 0.75 | 1.94 | — | 2.00 | — | 1.00 |
| Example 8 | A8 | $(Gd_{2.50}Sr_{0.50})Ga_{1.94}Cr_{0.06}(Ga_2Ge)O_{12}$ | 2.50 | — | — | 0.50 | 1.94 | — | 2.00 | — | 1.00 |
| Example 9 | A9 | $(Gd_{2.75}Sr_{0.25})Ga_{1.94}Cr_{0.06}(Ga_2Ge)O_{12}$ | 2.75 | — | — | 0.25 | 1.94 | 3.0 | 2.00 | — | 1.00 |
| Example 10 | A10 | $(Gd_{2.25}Sr_{0.75})Ga_{1.94}Cr_{0.06}(Ga_{2.25}Si_{0.75})O_{12}$ | 2.25 | — | — | 0.75 | 1.94 | — | 2.25 | 0.75 | — |
| Example 11 | A11 | $(Gd_{2.50}Sr_{0.50})Ga_{1.94}Cr_{0.06}(Ga_{2.50}Si_{0.50})O_{12}$ | 2.50 | — | — | 0.50 | 1.94 | — | 2.50 | 0.50 | — |
| Example 12 | A12 | $(Gd_{2.75}Sr_{0.25})Ga_{1.94}Cr_{0.06}(Ga_{2.75}Si_{0.25})O_{12}$ | 2.75 | — | — | 0.25 | 1.94 | — | 2.75 | 0.25 | — |
| Example 13 | A13 | $(Gd_{2.25}Sr_{0.75})Ga_{1.94}Cr_{0.06}(Ga_{2.25}Ge_{0.75})O_{12}$ | 2.25 | — | — | 0.75 | 1.94 | — | 2.25 | — | 0.75 |
| Example 14 | A14 | $(Gd_{2.50}Sr_{0.50})Ga_{1.94}Cr_{0.06}(Ga_{2.50}Ge_{0.50})O_{12}$ | 2.50 | — | — | 0.50 | 1.94 | — | 2.50 | — | 0.50 |
| Example 15 | A15 | $(Gd_{2.75}Sr_{0.25})Ga_{1.94}Cr)0(Ga_{2.75}Ge_{0.25})O_{12}$ | 2.75 | — | — | 0.25 | 1.94 | — | 2.75 | — | 0.25 |
| Example 16 | A16 | $(Gd_{1.85}La_{0.15}Sr)Ga_{1.94}Cr_{0.06}(Ga_2Si)O_{12}$ | 1.85 | 0.15 | — | 1.00 | 1.94 | — | 2.00 | 1.00 | — |
| Example 17 | A17 | $(Gd_{1.70}La_{0.30}Sr)Ga_{1.94}Cr_{0.06}(Ga_2Si)O_{12}$ | 1.70 | 0.30 | — | 1.00 | 1.94 | — | 2.00 | 1.00 | — |
| Example 18 | A18 | $(Gd_{1.40}La_{0.60}Sr)Ga_{1.94}Cr_{0.06}(Ga_2Si)O_{12}$ | 1.40 | 0.60 | — | 1.00 | 1.94 | — | 2.00 | 1.00 | — |
| Example 19 | A19 | $(Gd_{1.85}La_{0.15}Sr)Ga_{1.94}Cr_{0.06}(Ga_2Ge)O_{12}$ | 1.85 | 0.15 | — | 1.00 | 1.94 | — | 2.00 | — | 1.00 |
| Example 20 | A20 | $(Gd_{1.70}La_{0.30}Sr)Ga_{1.94}Cr_{0.06}(Ga_2Ge)O_{12}$ | 1.70 | 0.30 | — | 1.00 | 1.94 | — | 2.00 | — | 1.00 |
| Example 21 | A21 | $(Gd_{1.40}La_{0.60}Sr)Ga_{1.94}Cr_{0.06}(Ga_2Ge)O_{12}$ | 1.40 | 0.60 | — | 1.00 | 1.94 | — | 2.00 | — | 1.00 |
| Example 22 | A22 | $(Gd_{1.25}La_{0.75}Sr)(Ga_{0.97}Sc_{0.97})Cr_{0.06}(Ga_2Si)O_{12}$ | 1.25 | 0.75 | — | 1.00 | 0.97 | 0.97 | 2.00 | 1.00 | — |
| Example 23 | A23 | $(Gd_{1.25}La_{0.75}Sr)(Ga_{0.97}Sc_{0.97})Cr_{0.06}(Ga_2Ge)O_{12}$ | 1.25 | 0.75 | — | 1.00 | 0.97 | 0.97 | 2.00 | — | 1.00 |
| Example 24 | A24 | $(Gd_2Sr)(Ga_{0.97}Sc_{0.97})Cr_{0.06}(Ga_2Si)O_{12}$ | 2.00 | — | — | 1.00 | 0.97 | 0.97 | 2.00 | 1.00 | — |
| Example 25 | A25 | $(Gd_2Sr)(Ga_{0.97}Sc_{0.97})Cr_{0.06}(Ga_2Ge)O_{12}$ | 2.00 | — | — | 1.00 | 0.97 | 0.97 | 2.00 | — | 1.00 |

(Evaluation of Phosphor)

<Measurement of Fluorescence Spectrum, Wavelength of Fluorescence Peak, and Full Width at Half Maximum of Fluorescence Peak>

The fluorescence spectrum of the phosphor upon excitation at an excitation wavelength of 450 nm was measured using a Quantaurus-QY Plus (extended absolute PL quantum yield measuring device) C13534-02 (manufactured by Hamamatsu Photonics K.K.).

Figure 16:
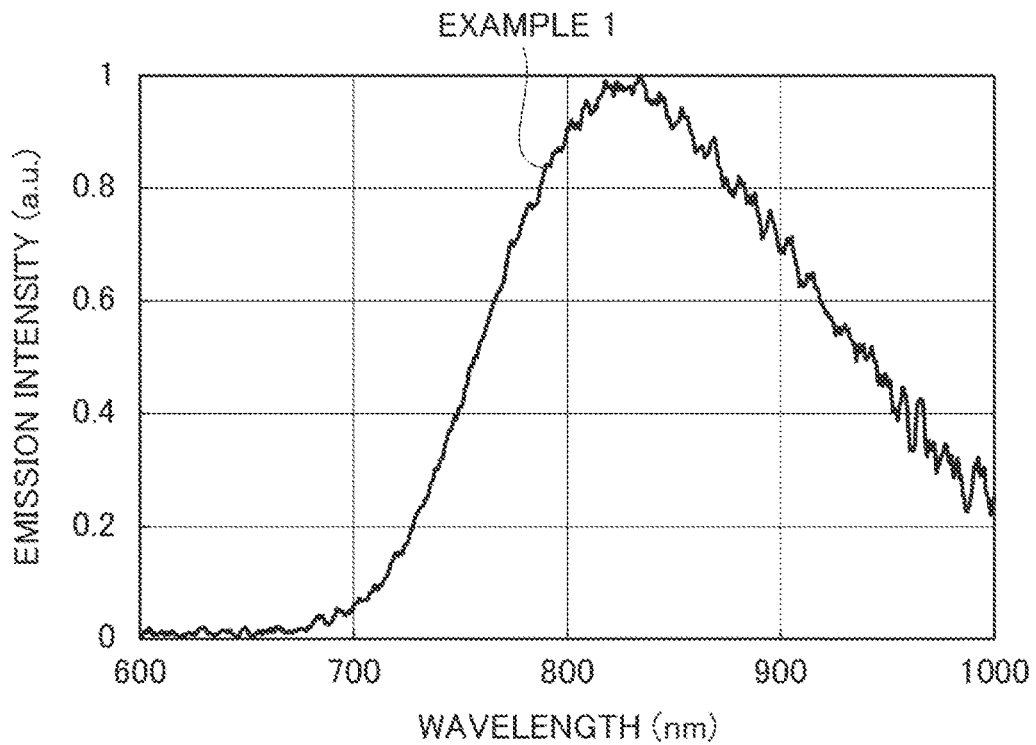
FIG. 16 is a diagram illustrating the emission spectrum of example 1.
Figure 17:
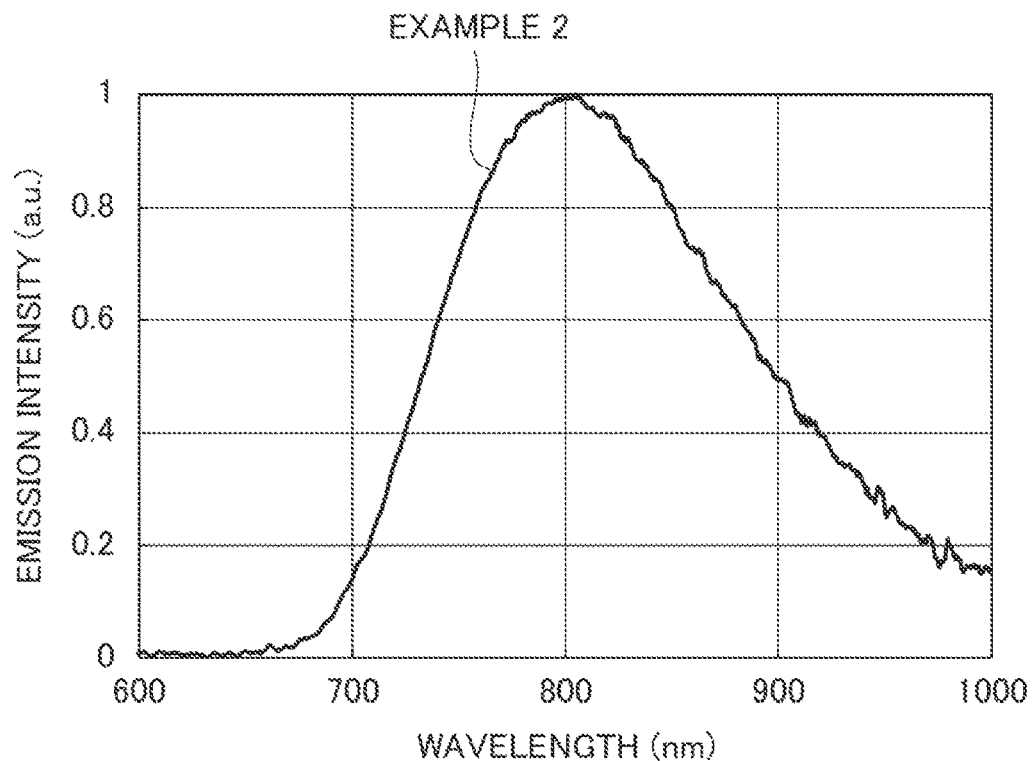
FIG. 17 is a diagram illustrating the emission spectrum of example 2.
Figure 18:
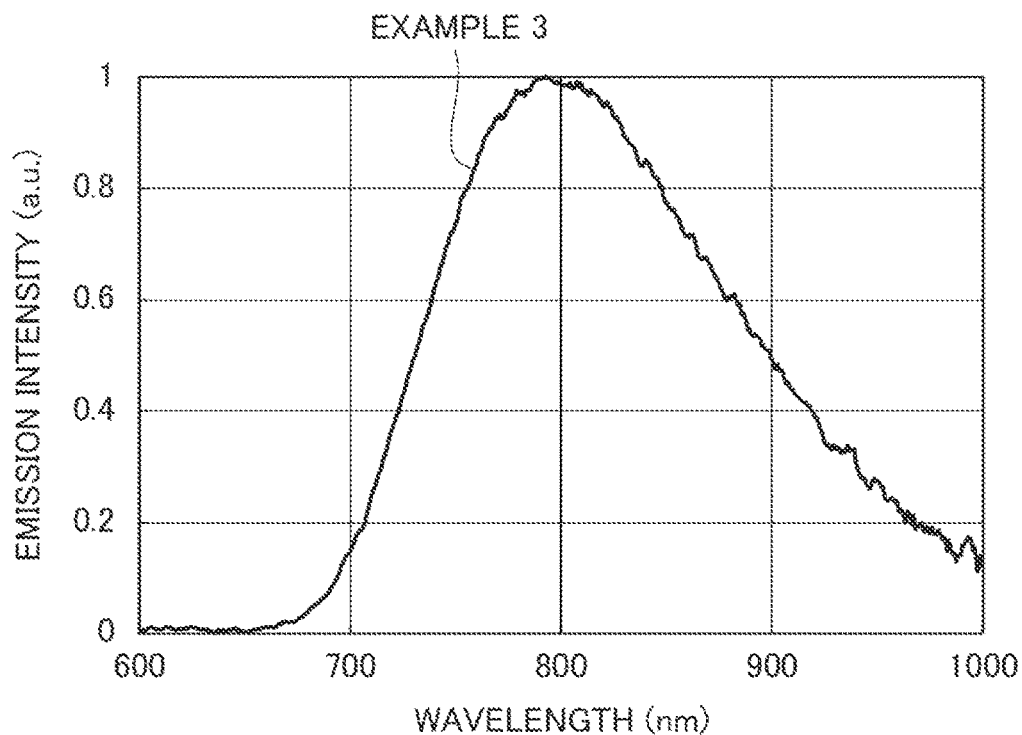
FIG. 18 is a diagram illustrating the emission spectrum of example 3.
Figure 19:
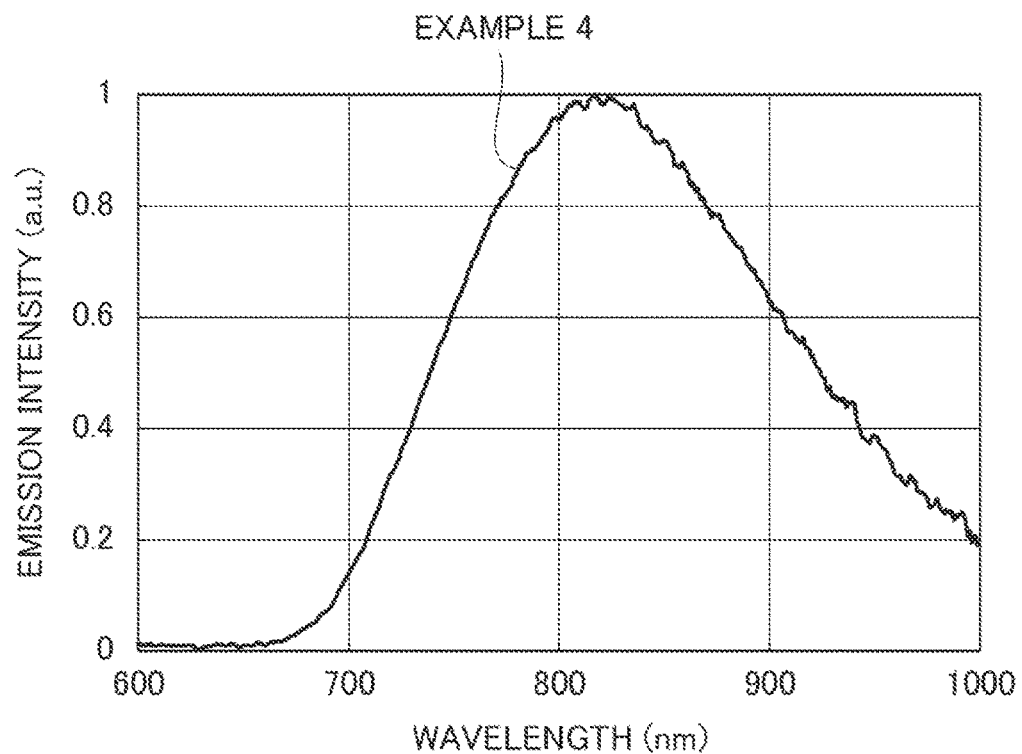
FIG. 19 is a diagram illustrating the emission spectrum of example 4.
Figure 20:
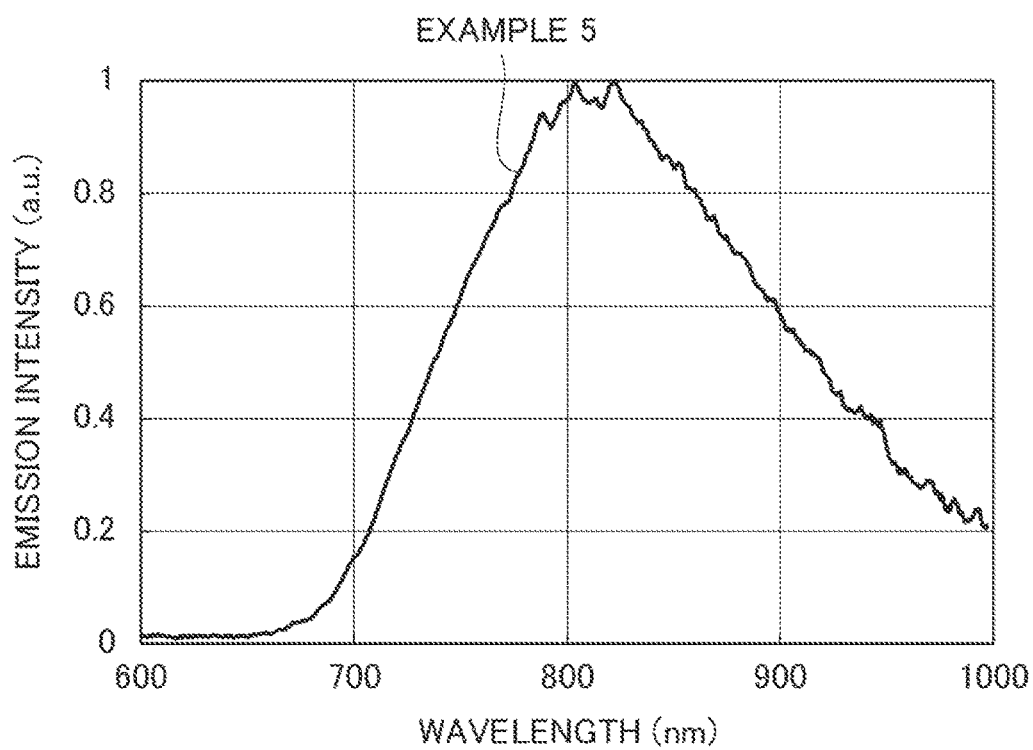
FIG. 20 is a diagram illustrating the emission spectrum of example 5.
Figure 21:
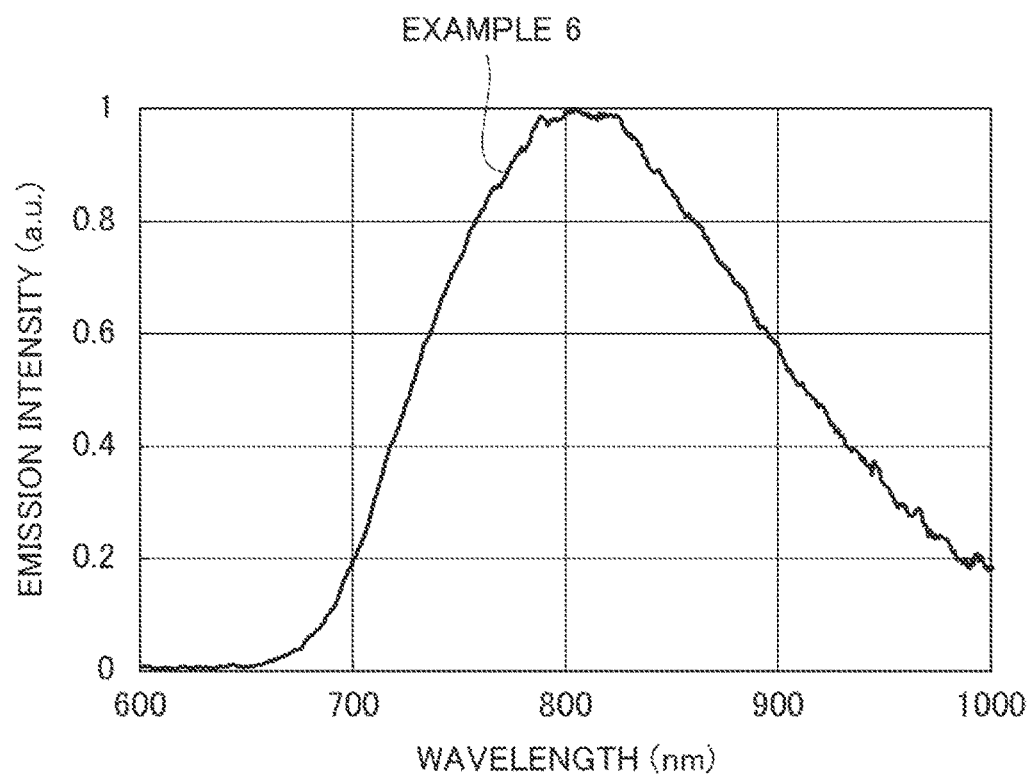
FIG. 21 is a diagram illustrating the emission spectrum of example 6.
Figure 22:
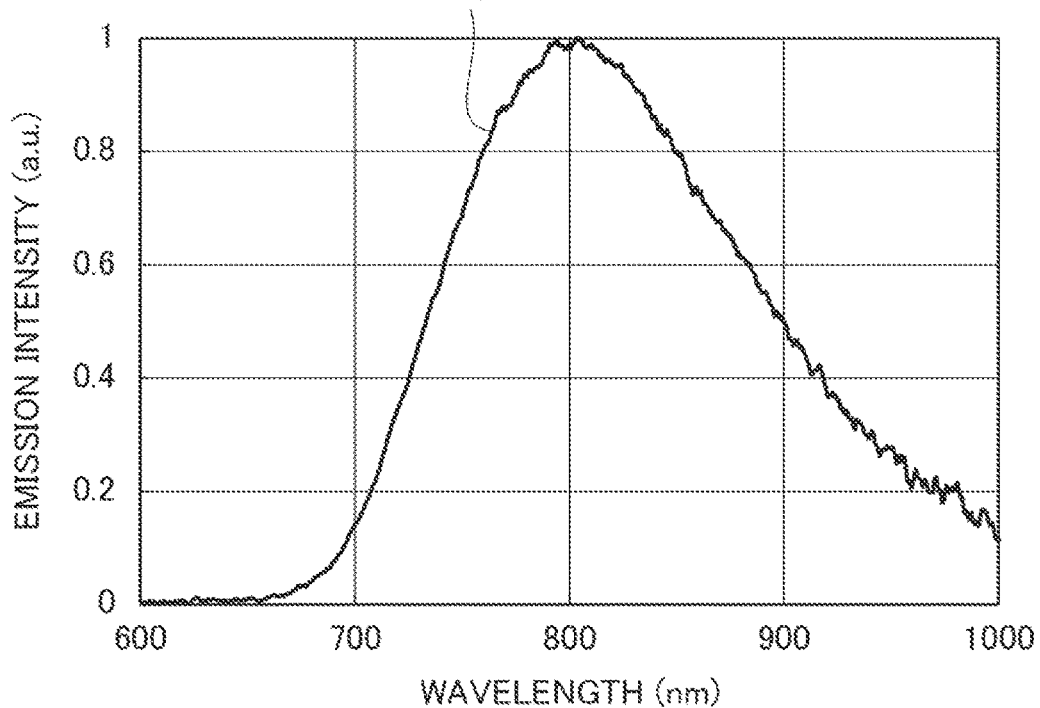
FIG. 22 is a diagram illustrating the emission spectrum of example 7.
Figure 23:
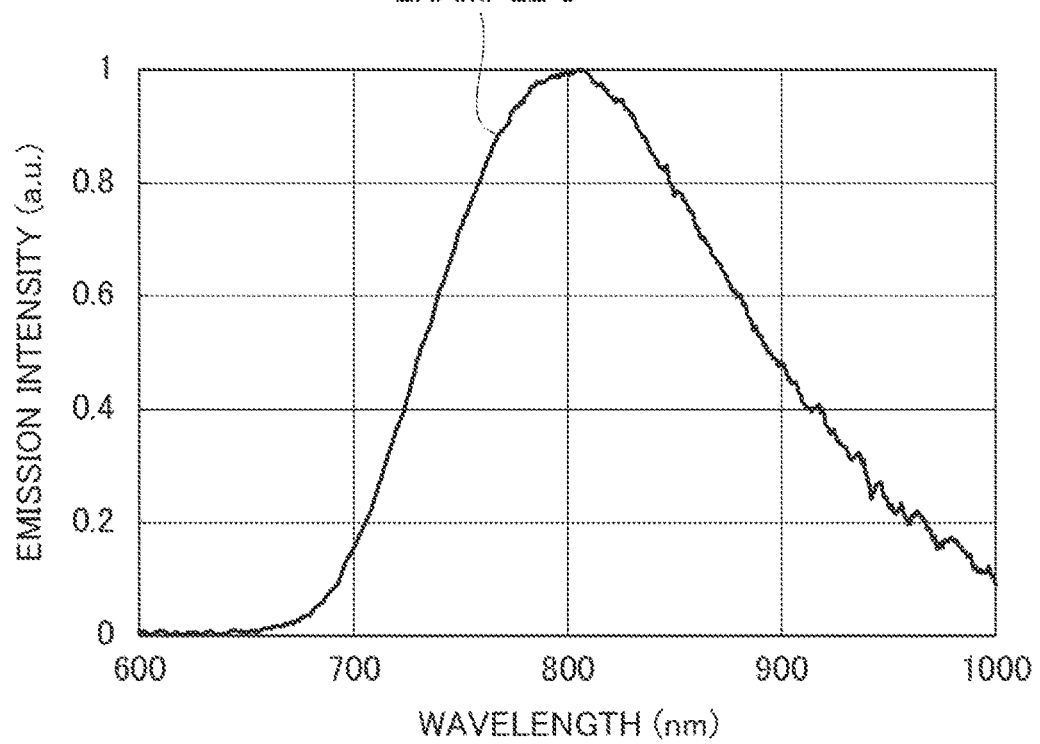
FIG. 23 is a diagram illustrating the emission spectrum of example 8.
Figure 24:
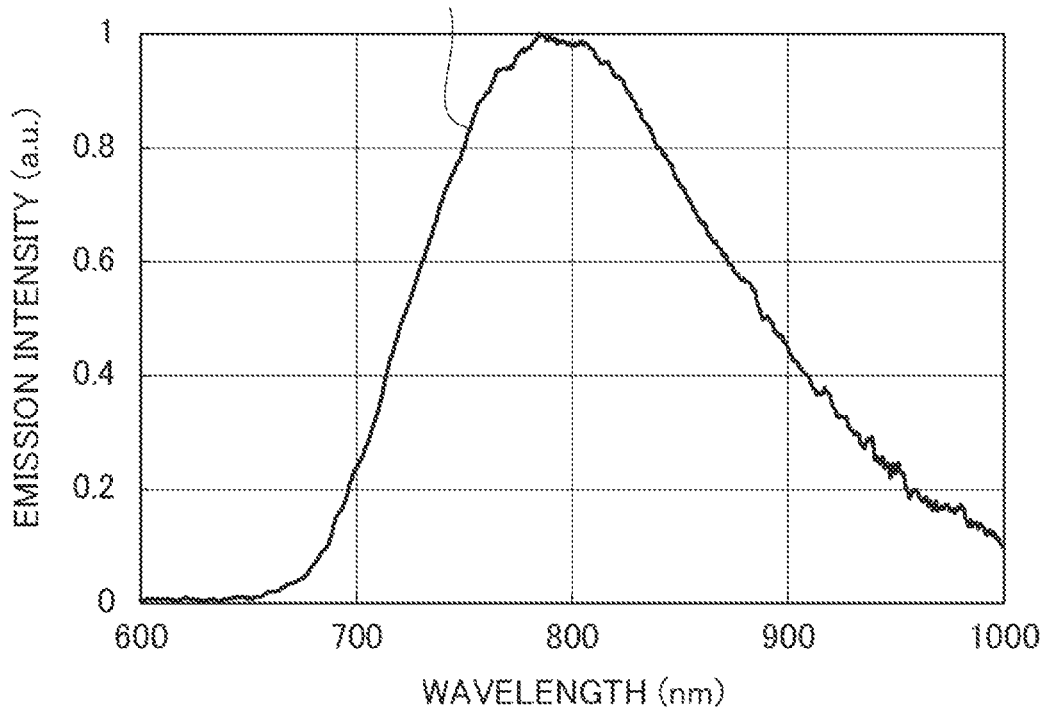
FIG. 24 is a diagram illustrating the emission spectrum of example 9.
Figure 25:
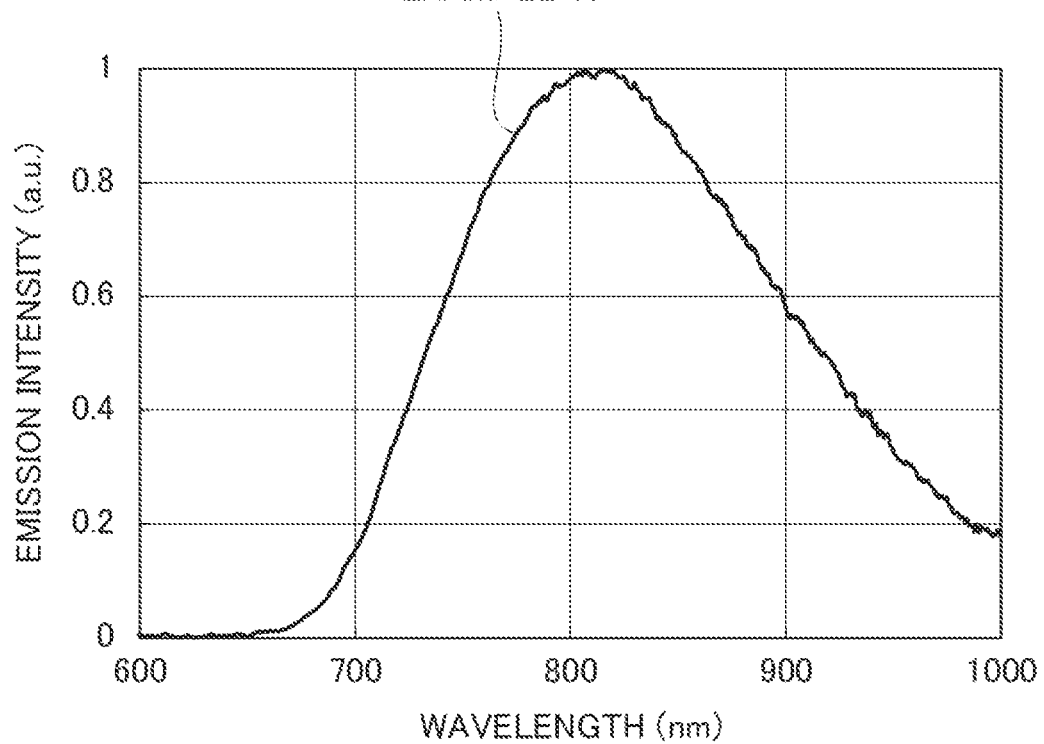
FIG. 25 is a diagram illustrating the emission spectrum of example 10.
Figure 26:
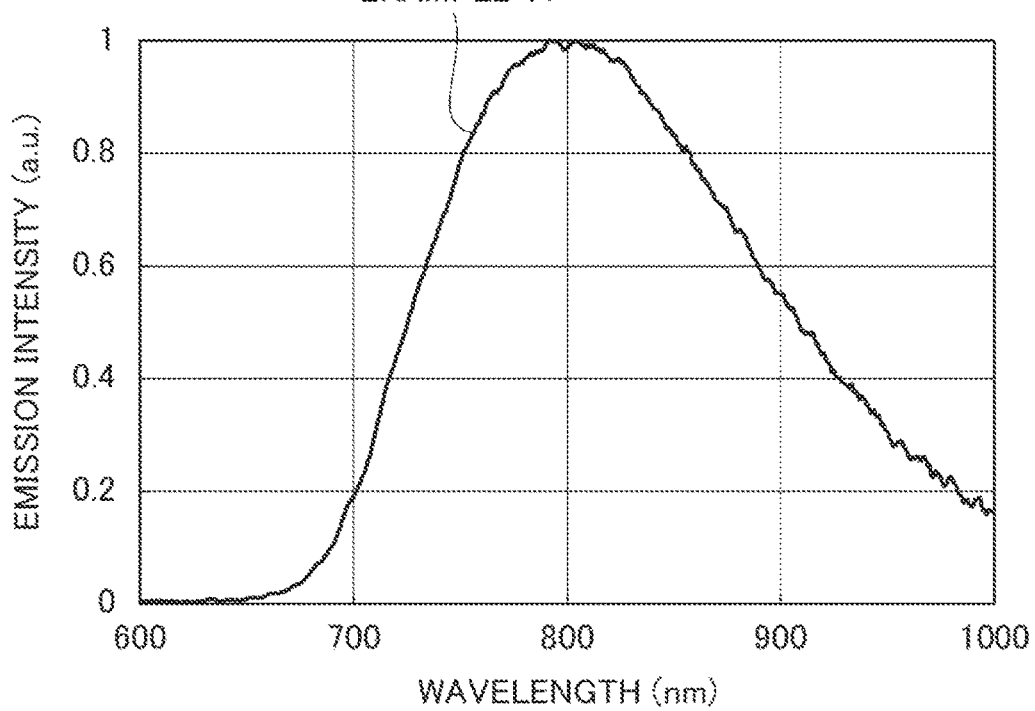
FIG. 26 is a diagram illustrating the emission spectrum of example 11.
Figure 27:
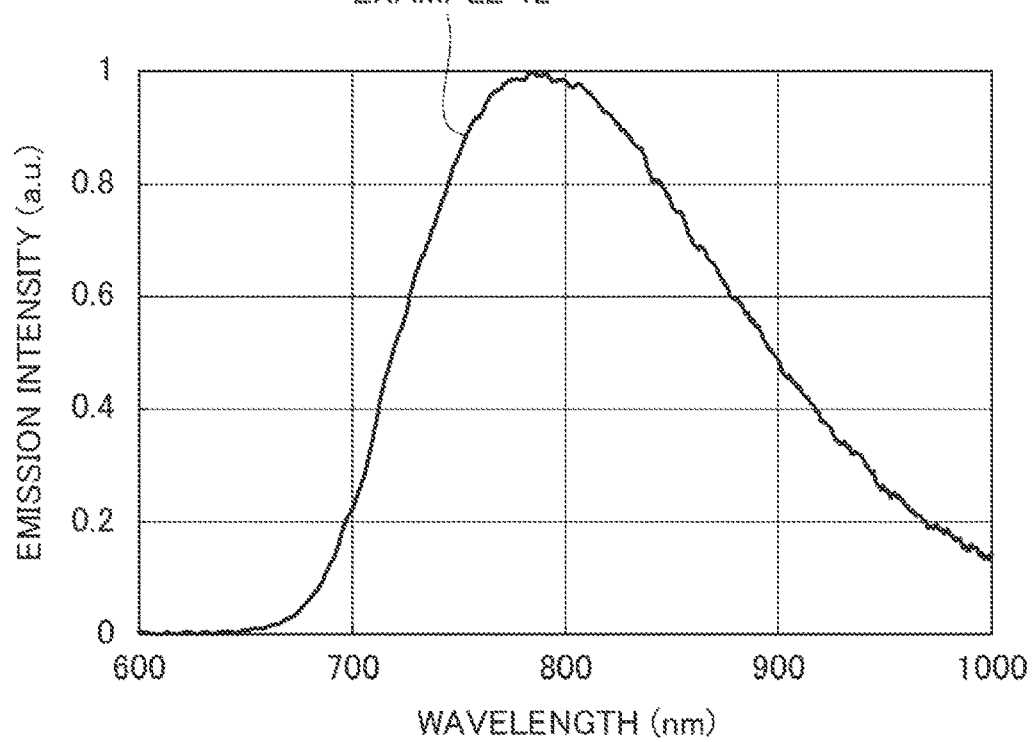
FIG. 27 is a diagram illustrating the emission spectrum of example 12.
Figure 28:
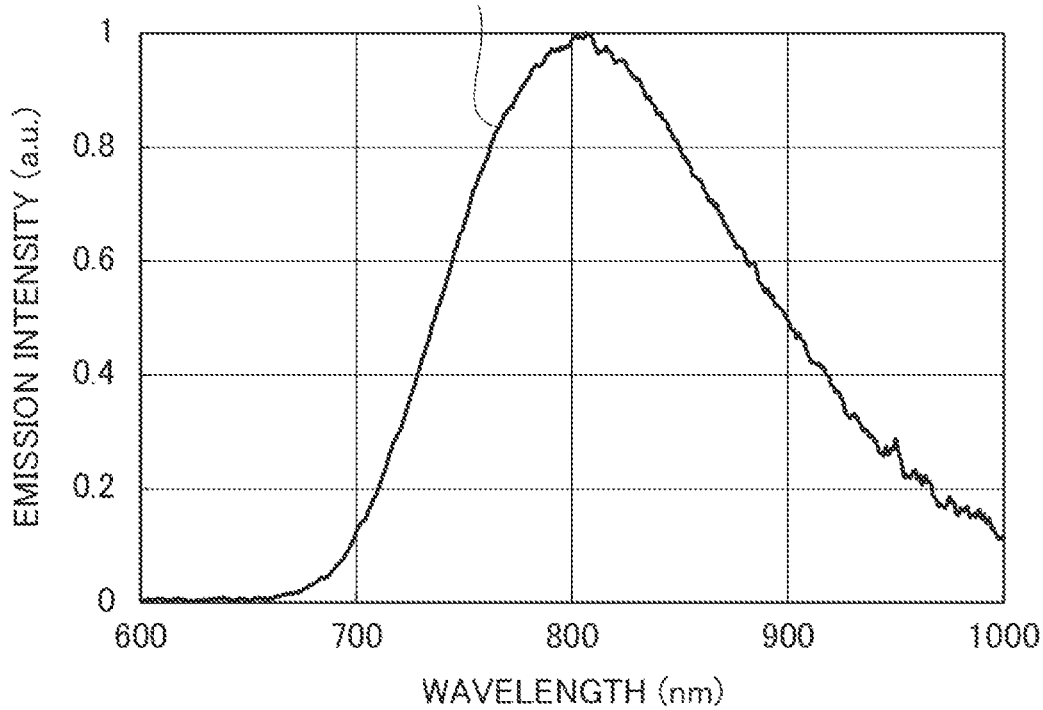
FIG. 28 is a diagram illustrating the emission spectrum of example 13.
Figure 29:
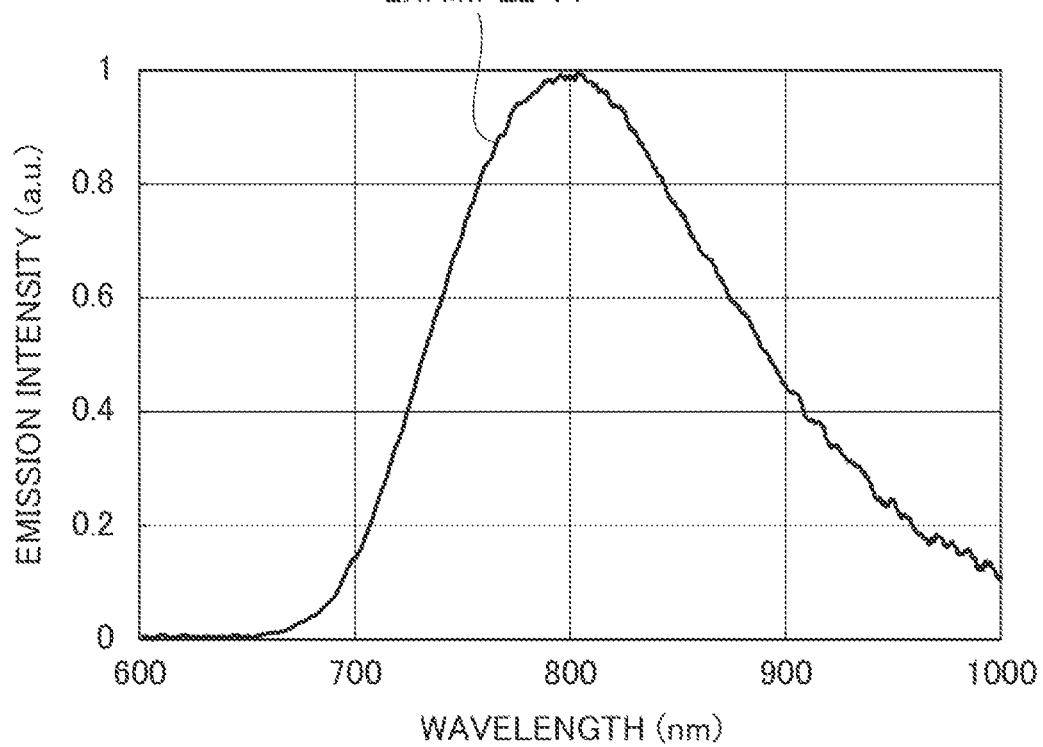
FIG. 29 is a diagram illustrating the emission spectrum of example 14.
Figure 30:
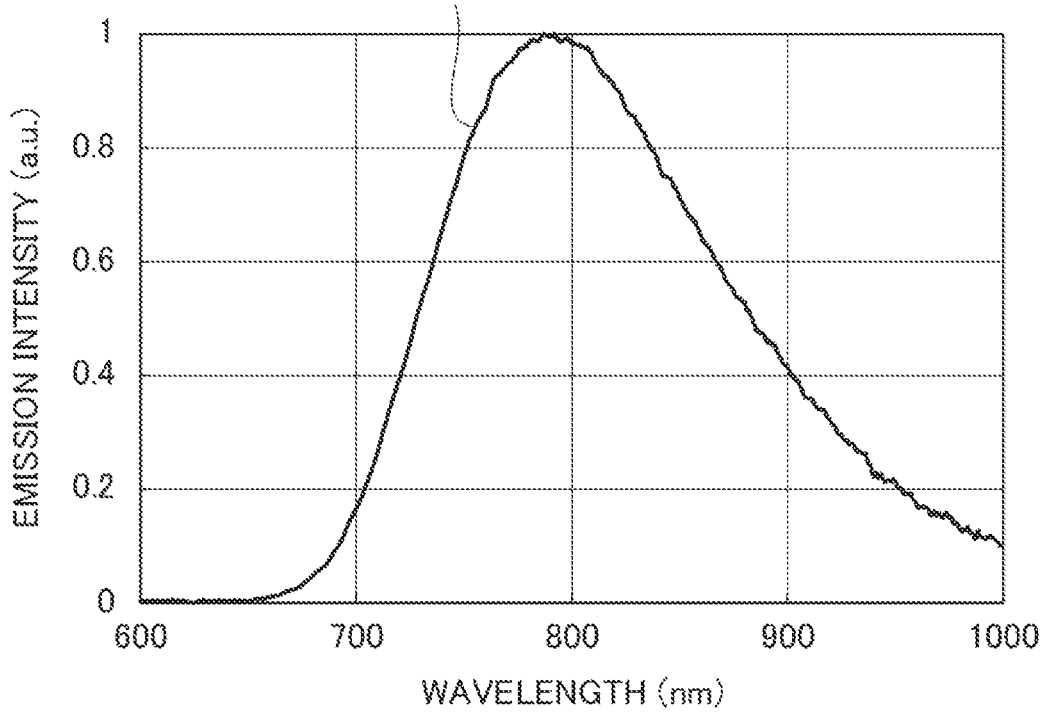
FIG. 30 is a diagram illustrating the emission spectrum of example 15.
Figure 31:
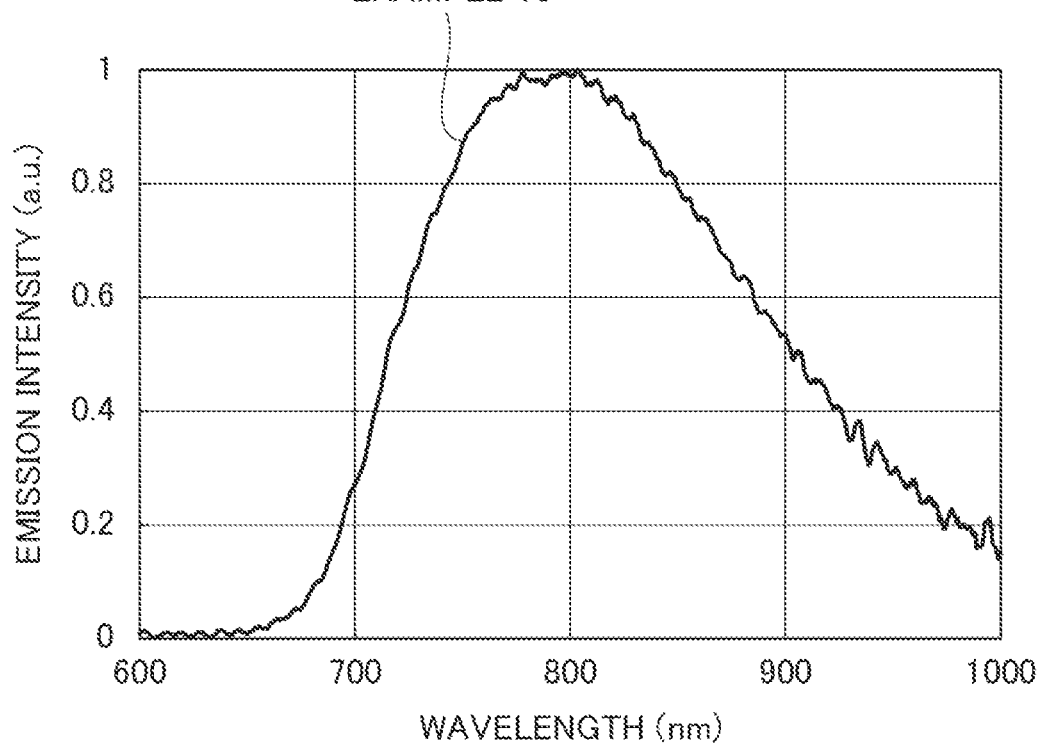
FIG. 31 is a diagram illustrating the emission spectrum of example 16.
Figure 32:
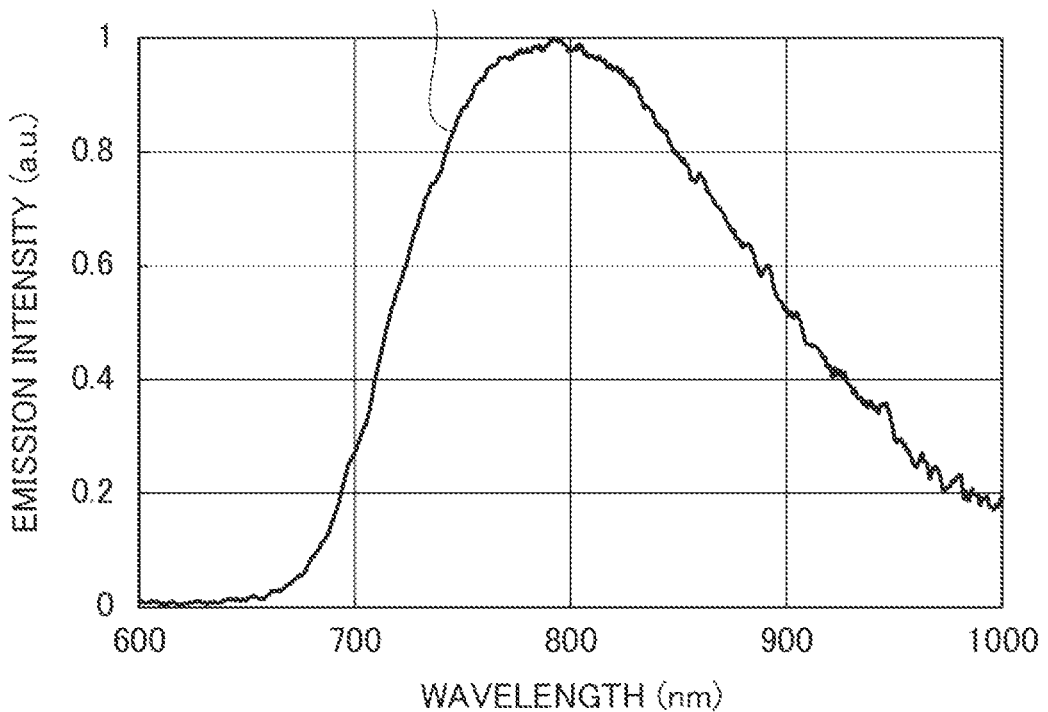
FIG. 32 is a diagram illustrating the emission spectrum of example 17.
Figure 33:
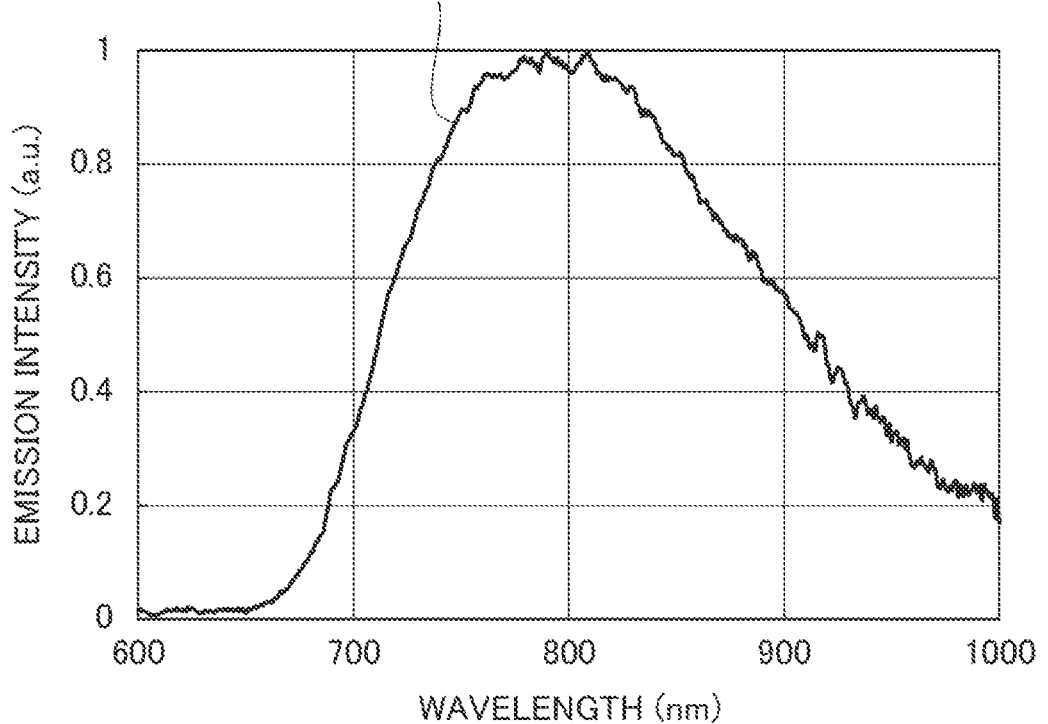
FIG. 33 is a diagram illustrating the emission spectrum of example 18.
Figure 34:
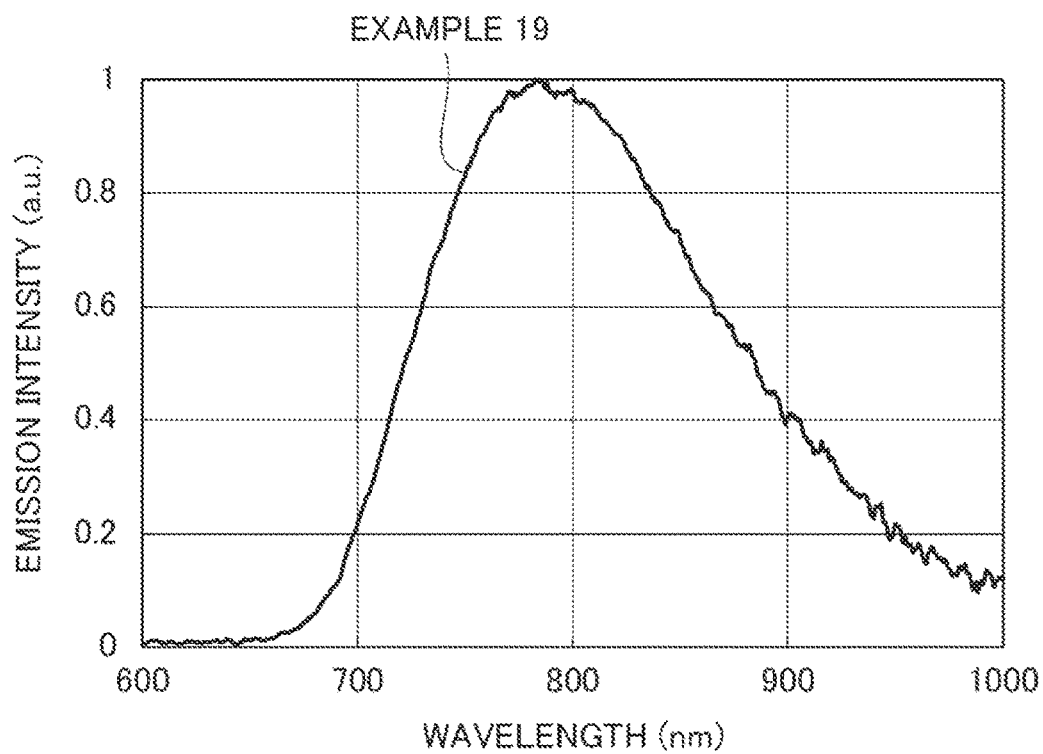
FIG. 34 is a diagram illustrating the emission spectrum of example 19.
Figure 35:
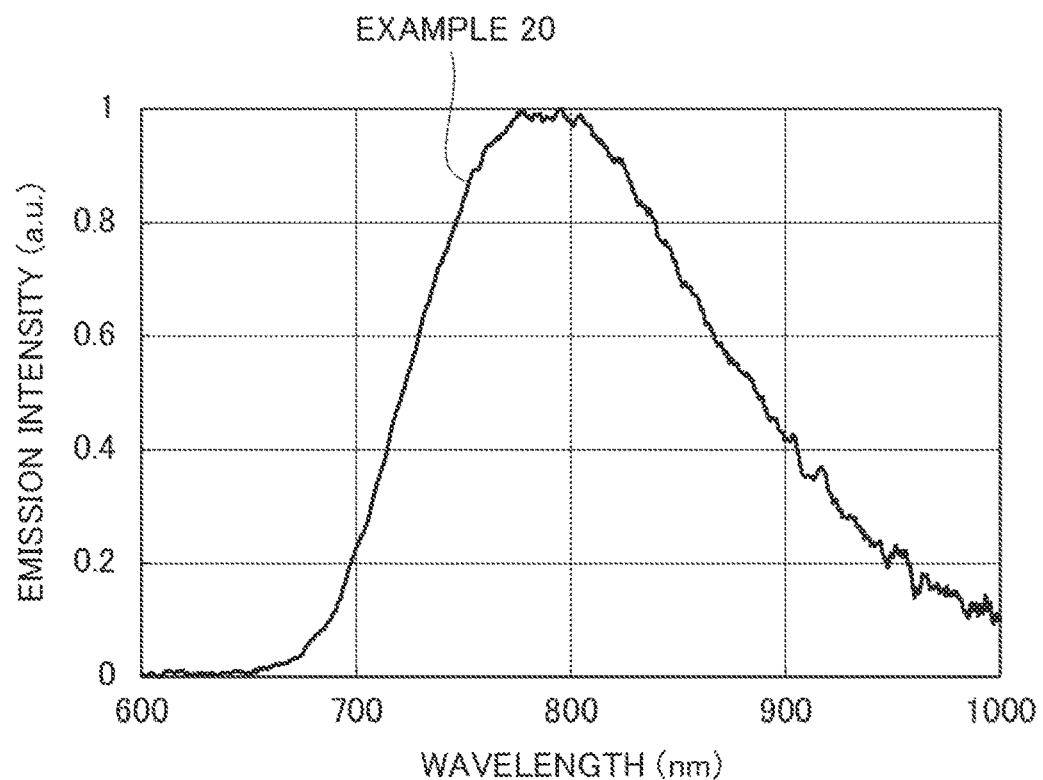
FIG. 35 is a diagram illustrating the emission spectrum of example 20.
Figure 36:
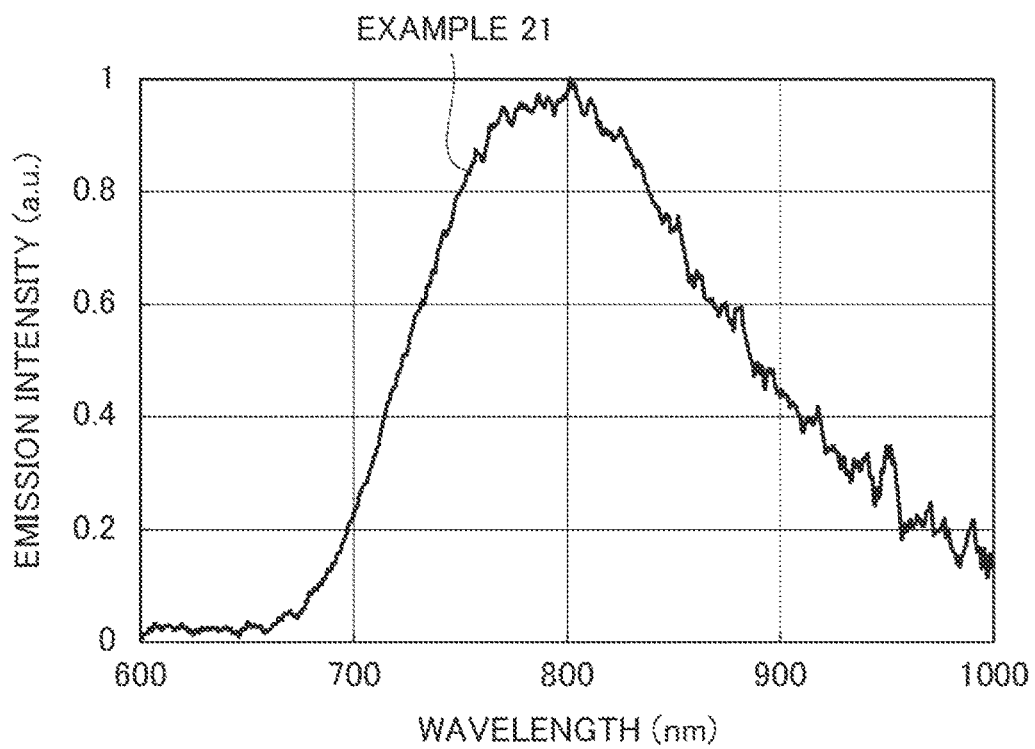
FIG. 36 is a diagram illustrating the emission spectrum of example 21.
Figure 37:
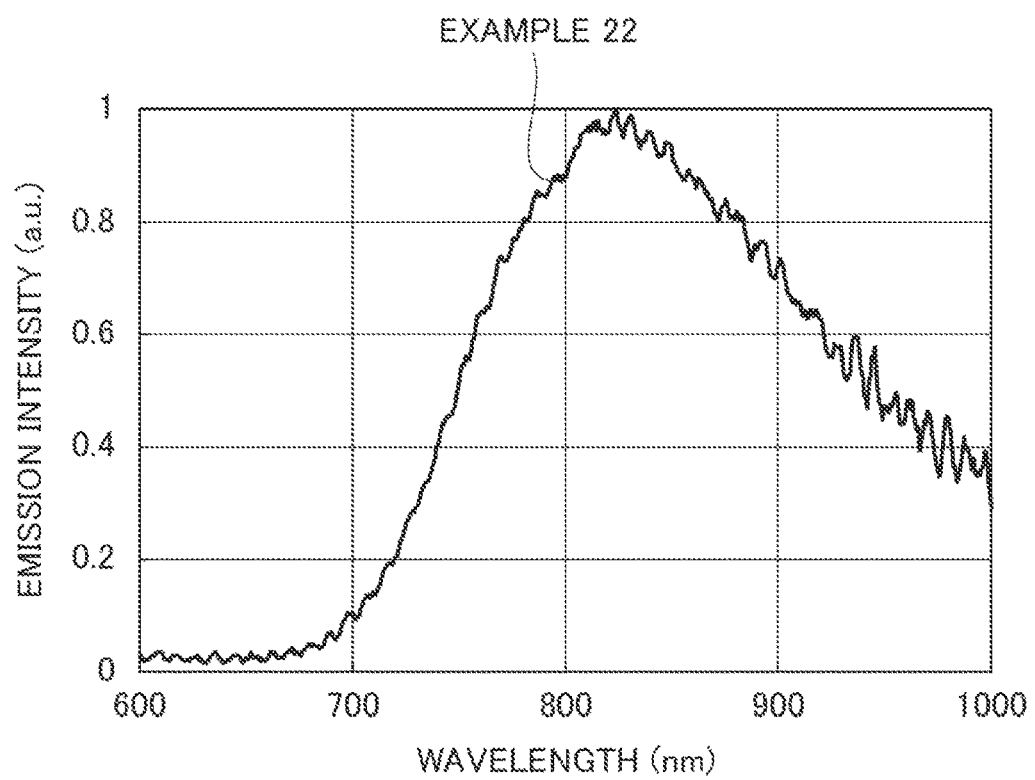
FIG. 37 is a diagram illustrating the emission spectrum of example 22.
Figure 38:
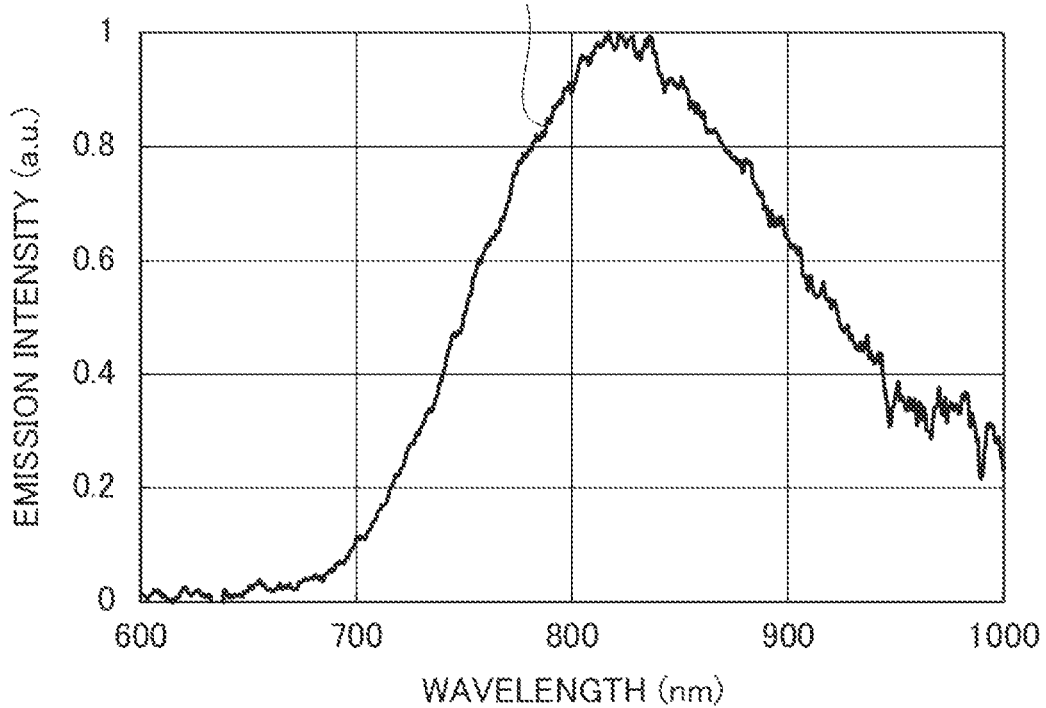
FIG. 38 is a diagram illustrating the emission spectrum of example 23.
Figure 39:
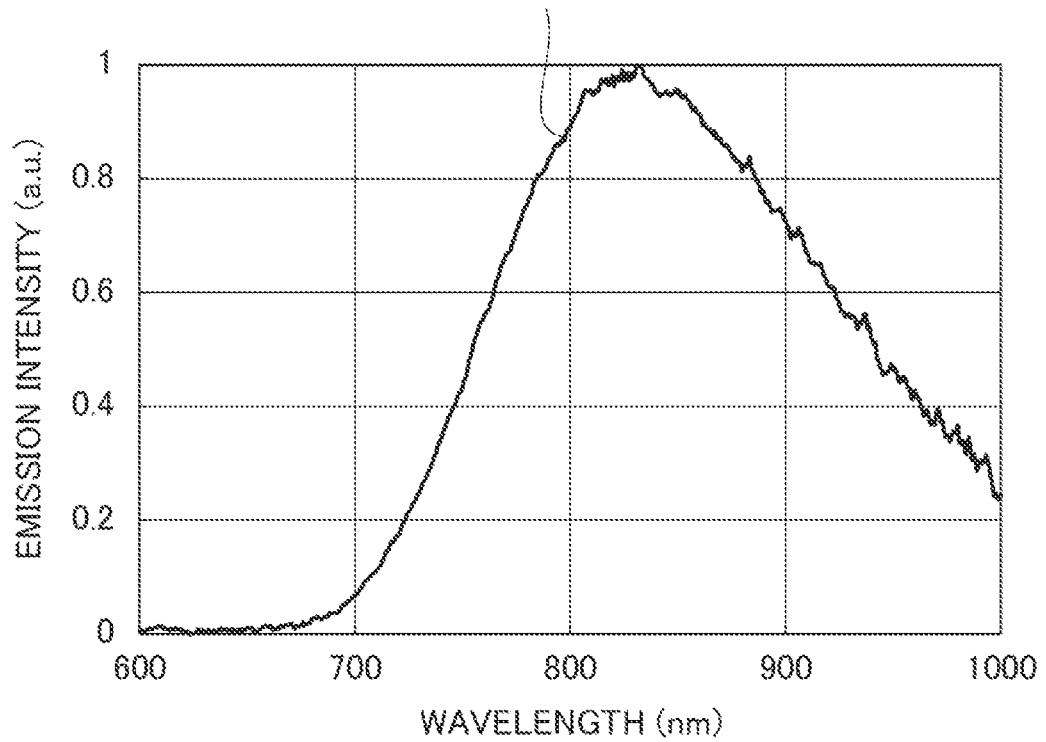
FIG. 39 is a diagram illustrating the emission spectrum of example 24.
Figure 40:
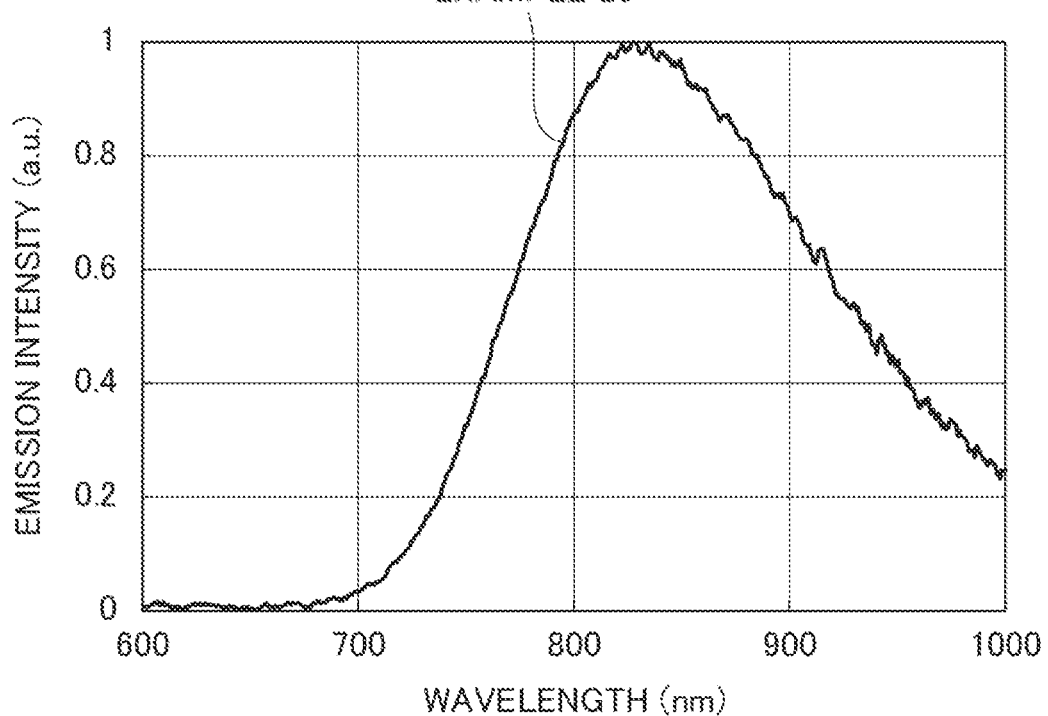
FIG. 40 is a diagram illustrating the emission spectrum of example 25.

FIG. 16 illustrates the fluorescence spectrum.

The wavelength of the fluorescence peak and the full width at half maximum of the fluorescence peak were measured.

Table 3 shows the results of wavelengths of fluorescence peaks and full widths at half maximum of fluorescence peaks.

<Measurement of Internal Quantum Efficiency IQE and External Quantum Efficiency EQE>

The internal quantum efficiency IQE and external quantum efficiency EQE were measured using a Quantaurus-QY Plus (extended absolute PL quantum yield measuring device) C13534-02 (manufactured by Hamamatsu Photonics K.K.). Specifically, the internal quantum efficiency IQE and external quantum efficiency EQE were measured based on the fluorescence spectrum measured upon excitation at an excitation wavelength of 450 nm using a sample solution including the phosphor.

Table 3 shows the results of the internal quantum efficiency and the external quantum efficiency.

<Measurement of Absorbance Abs>

Absorbance Abs was measured using a Quantaurus-QY Plus (extended absolute PL quantum yield measuring device) C13534-02 (manufactured by Hamamatsu Photonics K.K.). Specifically, absorbance Abs at a monitor wavelength of 770 nm was measured based on the fluorescence spectrum measured upon excitation at an excitation wavelength of 450 nm using a sample solution including the phosphor.

Table 3 shows the absorbance results.

<Measurement of 1/e Afterglow Value>

The fluorescence lifetime of the phosphor was measured using a Quantaurus-Tau (compact fluorescence lifetime measuring device) C11367-24 (manufactured by Hamamatsu Photonics K.K.) at an excitation wavelength of 450 nm and a monitor wavelength of 770 nm, and the 1/e afterglow value was measured.

Table 3 shows the results of the 1/e afterglow value.

<Measurement of Internal Quantum Efficiency IQE, External Quantum Efficiency EQE, Absorbance Abs, and 1/e Afterglow Value>

In the same manner as in example 1, the internal quantum efficiency IQE, external quantum efficiency EQE, absor-

TABLE 3

| | | Light emitting characteristics | | | | | | |
|---|---|---|---|---|---|---|---|---|
| Example No. | Sample No. | Fluorescence peak wavelength (nm) | FWHM of fluorescence peak (nm) | 1/e afterglow value (μs) | Internal quantum efficiency IQE(%) | Absorbance Abs.(%) | External quantum efficiency EQE(%) | Remarks |
| Com. Ex. 1 | B1 | 731 | 95 | 163.2 | 66 | 37 | 24 | Reference material |
| Example 1 | A1 | 834 | 183 | 23.2 | 23 | 42 | 10 | Ca—Si |
| Example 2 | A2 | 804 | 166 | 55.9 | 49 | 46 | 22 | Sr—Ge |
| Example 3 | A3 | 792 | 169 | 56.8 | 41 | 49 | 20 | Ca—Ge |
| Example 4 | A4 | 817 | 186 | 48.1 | 63 | 41 | 26 | Sr—Si |
| Example 5 | A5 | 823 | 182 | 51.0 | 62 | 42 | 26 | $Sr_{0.75}$—Si |
| Example 6 | A6 | 804 | 186 | 60.0 | 68 | 41 | 28 | $Sr_{0.50}$—Si |
| Example 7 | A7 | 804 | 167 | 56.8 | 42 | 44 | 19 | $Sr_{0.75}$—Ge |
| Example 8 | A8 | 806 | 163 | 60.2 | 51 | 44 | 23 | $Sr_{0.50}$—Ge |
| Example 9 | A9 | 784 | 171 | 62.9 | 56 | 44 | 25 | $Sr_{0.25}$—Ge |
| Example 10 | A10 | 815 | 184 | 56.0 | 66 | 51 | 33 | $Sr_{0.75}$—$Si_{0.75}$ |
| Example 11 | A11 | 792 | 184 | 64.8 | 70 | 52 | 37 | $Sr_{0.50}$—$Si_{0.50}$ |
| Example 12 | A12 | 785 | 179 | 73.1 | 70 | 53 | 37 | $Sr_{0.25}$—$Si_{0.25}$ |
| Example 13 | A13 | 806 | 164 | 58.4 | 51 | 53 | 27 | $Sr_{0.75}$—$Ge_{0.75}$ |
| Example 14 | A14 | 804 | 161 | 63.3 | 63 | 50 | 31 | $Sr_{0.50}$—$Ge_{0.50}$ |
| Example 15 | A15 | 789 | 157 | 66.1 | 73 | 52 | 38 | $Sr_{0.25}$—$Ge_{0.25}$ |
| Example 16 | A16 | 804 | 189 | 66.4 | 76 | 32 | 25 | La5%—Sr—Si |
| Example 17 | A17 | 792 | 193 | 66.9 | 66 | 37 | 24 | La10%—Sr—Si |
| Example 18 | A18 | 791 | 198 | 64.6 | 46 | 33 | 15 | La20%—Sr—Si |
| Example 19 | A19 | 784 | 164 | 68.6 | 51 | 40 | 20 | La5%—Sr—Ge |
| Example 20 | A20 | 796 | 166 | 67.5 | 50 | 36 | 18 | La10%—Sr—Ge |
| Example 21 | A21 | 802 | 165 | 74.3 | 21 | 39 | 8 | La20%—Sr—Ge |
| Example 22 | A22 | 824 | 198 | 32.8 | 33 | 39 | 13 | La25%—Sc50%—Sr—Si |
| Example 23 | A23 | 817 | 175 | 49.8 | 25 | 33 | 8 | La25%—Sc50%—Sr—Ge |
| Example 24 | A24 | 832 | 188 | 36.1 | 43 | 49 | 21 | Sc50%—Sr—Si |
| Example 25 | A25 | 828 | 173 | 37.7 | 36 | 54 | 19 | Sc50%—Sr—Ge |

Comparative Example 1

(Preparation of Phosphor)

An oxide phosphor was synthesized in the same manner as in example 1 except that an oxide phosphor (sample No. B1) having the composition shown in Table 1 was synthesized under manufacturing conditions shown in Table 1.

Table 2 shows the detail of the compositions of oxide phosphors. FIG. 41 shows the results of X-ray diffraction.

Note that other oxide phosphors (samples No. A1 to 25) other than sample No. B1 are the same as the oxide phosphor $Gd_3Ga_{1.94}Cr_{0.06}Ga_3O_{12}$ of sample No. B1 with a part of the elements replaced. Thus, the oxide phosphor $Gd_3Ga_{1.94}Cr_{0.06}Ga_{30}O_{12}$ of sample No. B1 was used as the reference material.

(Evaluation of Phosphor)

<Measurement of Fluorescence Spectrum, Wavelength of Fluorescence Peak, and Full Width at Half Maximum of Fluorescence Peak>

The fluorescence spectrum of the phosphor, the wavelength of the fluorescence peak, and the full width at half maximum of the fluorescence peak were measured in the same manner as in example 1.

Figure 15:
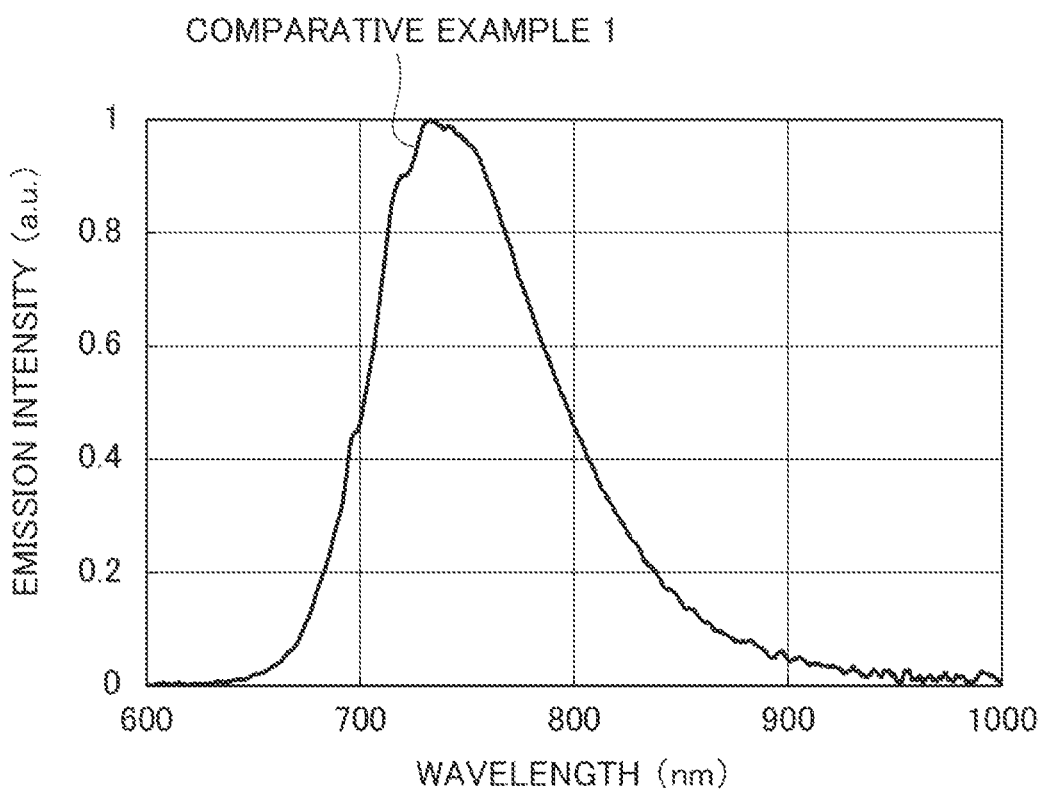
FIG. 15 is a diagram illustrating the emission spectrum of comparative example 1.

FIG. 15 illustrates the fluorescence spectrum.

Table 3 shows the results of wavelengths of fluorescence peaks and full widths at half maximum of fluorescence peaks.

bance Abs, and 1/e afterglow value of phosphors were measured.

Table 3 shows the measurement results.

Examples 2 to 25

(Preparation of Phosphors)

Oxide phosphors were synthesized in the same manner as in example 1 except that oxide phosphors (samples No. A2 to A25) having compositions illustrated in Table 1 were synthesized under the manufacturing conditions illustrated in Table 1.

Table 2 shows the detail of the compositions of oxide phosphors (samples No. A2 to A25). FIG. 41 to 46 show the results of X-ray diffraction of the oxide phosphors (samples No. A2 to A25).

(Evaluation of Phosphor)

<Measurement of Fluorescence Spectrum, Wavelength of Fluorescence Peak, and Full Width at Half Maximum of Fluorescence Peak>

The fluorescence spectra of phosphors (samples No. A2 to A25), wavelengths of fluorescence peaks, and the full widths at half maximum of the fluorescence peaks were measured in the same manner as in example 1.

FIGS. 17 to 40 illustrate the fluorescence spectra of the phosphors (samples No. A2 to A25).

Table 3 shows the results of the wavelengths of the fluorescence peaks and the full widths at half maximum of the fluorescence peaks of the phosphors (samples No. A2 to A25).

<Measurement of Internal Quantum Efficiency IQE, External Quantum Efficiency EQE, Absorbance Abs, and 1/e Afterglow Value>

In the same manner as in example 1, the internal quantum efficiency IQE, external quantum efficiency EQE, absorbance Abs, and 1/e afterglow value of the phosphors (samples No. A2 to A25) were measured.

Table 3 shows the measurement results of phosphors (samples No. A2 to A25).

Evaluation of Examples 1 to 25

From Tables 2 and 3, it was found that a phosphor having a high fluorescence intensity in the red to near-infrared range NIR of wavelengths of 750 to 950 nm can be manufactured.

The entire contents of Japanese Patent Application No. 2021-106680 (filed Jun. 28, 2021) are incorporated herein by reference.

Although embodiments have been described above, the present embodiment is not limited these descriptions, and various modifications are possible within the scope of the gist according to the embodiments.

INDUSTRIAL APPLICABILITY

The present disclosure makes it possible to provide a phosphor, a light emitting device, a sensing system light source, and a sensing system illumination system, each having a high fluorescence intensity in the red to near-infrared range NIR of wavelengths of 750 to 950 nm.

| REFERENCE SIGNS LIST | |
|---|---|
| 1, 1A, 1B, 1C, 1D, 1E, 1F, 1G | Light emitting device |
| 2 | Solid-state light source |
| 3, 3A, 3B, 3C, 3D, 3E, 3F, 3G | Wavelength converter |
| 4 | First phosphor |
| 6 | Primary light |
| 8 | Second phosphor |
| 10, 10A, 10C, 10D, 10E, 10G | Near-infrared light emitting device |
| 20, 20C, 20G | Visible light emitting device |
| 23, 23C | Visible light wavelength converter |
| 25 | Visible light source |
| 30, 30C, 30G | White light emitting device |
| 33, 33C | White light wavelength converter |
| 35 | White light source |
| 40, 40B, 40C, 40D, 40F, 40G | NIR + α light emitting device |
| 100, 100A, 100B, 100C, 100D | Sensing system light source |
| 300, 300A, 300B, 300C, 300D | Sensing system illumination system |

The invention claimed is:

1. A phosphor represented by general formula (1) below, $$(Gd_{1-x-y},Ln_y,M^{II}_x)_3M^{III}_2(Ga_{1-z},M^{IV}_z)_3O_{12}:Cr^{3+} \quad (1)$$

where, in the formula, Ln is one or more elements selected from La, Pr, Nd, Sm, Eu, Tb, Dy, Ho, Er, Yb, and Lu, $M^{II}$ is a divalent element, $M^{III}$ is a trivalent element, $M^{IV}$ is a tetravalent element, and x, y, and z satisfy 0<x<0.5, 0≤y<0.5, and 0<z<0.5, wherein the phosphor has a fluorescence peak within a wavelength range of 750 nm or more and less than 900 nm, and a full width at half maximum of the fluorescence peak is 110 nm or more and less than 250 nm.

2. The phosphor according to claim 1, wherein the $M^{II}$ is a divalent element, the $M^{III}$ is a trivalent element other than Gd and Ln, and the $M^{IV}$ is a tetravalent element.

3. The phosphor according to claim 1, wherein the $M^{II}$ contains at least one of Ca or Sr, the $M^{III}$ contains at least one of Ga or Sc, and the $M^{IV}$ contains at least one of Si or Ge.

4. The phosphor according to claim 1, wherein x and z satisfy x−0.1≤z≤x+0.1 in the general formula (1).

5. A light emitting device, comprising:
the phosphor according to claim 1; and
a solid-state light source that has an emission peak on a shorter wavelength side of a fluorescence peak of the phosphor.

6. A light emitting device, comprising:
a near-infrared light emitting device that is the light emitting device according to claim 5; and
a white light emitting device that is a light emitting device emitting white light; or a white light source that is a light source emitting white light.

7. A sensing system light source, comprising:
the light emitting device according to claim 5.

8. A sensing system illumination system, comprising:
the light emitting device according to claim 5.

9. A light emitting device, comprising:
a first phosphor that is the phosphor according to claim 1;
a second phosphor that has a fluorescence peak wavelength different from a fluorescence peak wavelength of the first phosphor; and
a solid-state light source that has an emission peak on a shorter wavelength side of a fluorescence peak of the first phosphor and a fluorescence peak of the second phosphor.

10. A phosphor represented by general formula (1) below, $$(Gd_{1-x-y},Ln_y,M^{II}_x)_3M^{III}_2(Ga_{1-z},M^{IV}_z)_3O_{12}:Cr^{3+} \quad (1)$$

where, in the formula, Ln is one or more elements selected from La, Pr, Nd, Sm, Eu, Tb, Dy, Ho, Er, Yb, and Lu, $M^{II}$ is a divalent element, $M^{III}$ is a trivalent element, $M^{IV}$ is a tetravalent element, and x, y, and z satisfy 0<x<0.5, 0≤y<0.5, and 0<z<0.5,
wherein a 1/e afterglow value is 1 μs or more and less than 100 μs.

* * * * *